United States Patent
Babcock et al.

(10) Patent No.: US 11,682,649 B2
(45) Date of Patent: Jun. 20, 2023

(54) RADIO FREQUENCY MODULES

(71) Applicant: Skyworks Solutions, Inc., Irvine, CA (US)

(72) Inventors: Gregory Edward Babcock, Ottawa (CA); Lori Ann DeOrio, Irvine, CA (US); Darren Roger Frenette, Pakenham (CA); George Khoury, Ottawa (CA); Anthony James LoBianco, Irvine, CA (US); Hoang Mong Nguyen, Irvine, CA (US); Leslie Paul Wallis, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/240,661

(22) Filed: Apr. 26, 2021

(65) Prior Publication Data

US 2021/0320081 A1 Oct. 14, 2021

Related U.S. Application Data

(63) Continuation of application No. 16/678,154, filed on Nov. 8, 2019, now Pat. No. 11,043,466, which is a
(Continued)

(51) Int. Cl.
*H01L 23/552* (2006.01)
*H01L 23/00* (2006.01)
(Continued)

(52) U.S. Cl.
CPC ............ *H01L 24/73* (2013.01); *H01L 23/552* (2013.01); *H01L 23/66* (2013.01); *H01L 24/48* (2013.01);
(Continued)

(58) Field of Classification Search
CPC ....... H01L 24/73; H01L 23/552; H01L 23/66; H01L 24/48; H01L 25/18; H01L 23/13;
(Continued)

(56) References Cited

U.S. PATENT DOCUMENTS 2,293,414 A 8/1942 Strutt et al.
4,079,336 A 3/1978 Gross
(Continued)

FOREIGN PATENT DOCUMENTS

CN 101401206 4/2009
CN 102237342 11/2011
(Continued)

OTHER PUBLICATIONS

Campbell, E., Bluetooth Radio Design Considerations for Cellular Handset Application, RF Globalnet, Apr. 3, 2001, 13 pages.
(Continued)

*Primary Examiner* — Niki H Nguyen
(74) *Attorney, Agent, or Firm* — Knobbe, Martens, Olson & Bear, LLP

(57) ABSTRACT

Packaged modules for use in wireless devices are disclosed. A substrate supports integrated circuit die including at least a portion of a baseband system and a front end system, an oscillator assembly, and an antenna. The oscillator assembly includes an enclosure to enclose the oscillator and conductive pillars formed at least partially within a side of the enclosure to conduct signals between the top and bottom surfaces of the oscillator assembly. Components can be vertically integrated to save space and reduce trace length. Vertical integration provides an overhang volume that can include discrete components. Radio frequency shielding and ground planes within the substrate shield the front end system and antenna from radio frequency interference.
(Continued)

Stacked filter assemblies include passive surface mount devices to filter radio frequency signals.

19 Claims, 29 Drawing Sheets

Related U.S. Application Data continuation of application No. 15/916,571, filed on Mar. 9, 2018, now Pat. No. 10,515,924.

(60) Provisional application No. 62/573,524, filed on Oct. 17, 2017, provisional application No. 62/469,723, filed on Mar. 10, 2017.

(51) Int. Cl.
| | |
|---|---|
| *H01L 23/66* | (2006.01) |
| *H04B 1/40* | (2015.01) |
| *H01L 25/18* | (2023.01) |
| *H01L 23/498* | (2006.01) |
| *H01L 23/13* | (2006.01) |

(52) U.S. Cl.
CPC ............ *H01L 25/18* (2013.01); *H04B 1/40* (2013.01); *H01L 23/13* (2013.01); *H01L 23/49805* (2013.01); *H01L 2223/6677* (2013.01); *H01L 2224/48227* (2013.01); *H01L 2224/73257* (2013.01); *H01L 2924/00014* (2013.01); *H01L 2924/3025* (2013.01)

(58) Field of Classification Search
CPC ....... H01L 23/49805; H01L 2223/6677; H01L 2224/48227; H01L 2224/73257; H01L 2924/00014; H01L 2924/3025; H01L 2924/3011; H01L 2924/19105; H01L 2924/181; H01L 2924/14; H01L 2223/6655; H01L 2924/19042; H01L 2924/30105; H01L 2924/15153; H01L 2224/81191; H01L 25/117; H01L 2224/214; H01L 2224/14155; H04B 1/40
See application file for complete search history.

(56) References Cited

U.S. PATENT DOCUMENTS

| | | | |
|---|---|---|---|
| 4,122,403 A | 10/1978 | Cave | |
| 4,159,450 A | 6/1979 | Hoover | |
| 4,821,005 A | 4/1989 | Kling | |
| 4,859,967 A | 8/1989 | Swanson | |
| 5,251,331 A | 10/1993 | Schwent et al. | |
| 5,438,684 A | 8/1995 | Schwent et al. | |
| 5,500,628 A | 3/1996 | Knecht | |
| 5,847,610 A | 12/1998 | Fujita | |
| 5,949,294 A | 9/1999 | Kondo et al. | |
| 6,064,249 A | 5/2000 | Duvvury et al. | |
| 6,188,277 B1 | 2/2001 | Borodulin et al. | |
| 6,229,249 B1 | 5/2001 | Hatanaka et al. | |
| 6,388,546 B1 | 5/2002 | Kikokawa et al. | |
| 6,388,623 B1 | 5/2002 | Sakota et al. | |
| 6,392,603 B1 | 5/2002 | Kurz et al. | |
| 6,417,817 B1 | 7/2002 | Pirilä et al. | |
| 6,472,598 B1 | 10/2002 | Glenn | |
| 6,549,077 B1 | 4/2003 | Jou | |
| 6,606,483 B1 | 8/2003 | Baker et al. | |
| 6,664,864 B2 | 12/2003 | Jiles et al. | |
| 6,686,649 B1 | 2/2004 | Mathews et al. | |
| 6,734,539 B2 | 5/2004 | Degani et al. | |
| 6,744,213 B2 | 6/2004 | Wilcoxson et al. | |
| 6,744,310 B2 | 6/2004 | Honda | |
| 6,850,196 B2 | 2/2005 | Wong et al. | |
| 6,861,731 B2 | 3/2005 | Buijsman et al. | |
| 6,873,211 B1 | 3/2005 | Thompson et al. |
| 6,946,919 B2 | 9/2005 | Knecht et al. |
| 6,977,552 B2 | 12/2005 | Macedo |
| 6,991,947 B1 | 1/2006 | Gheewala |
| 7,053,718 B2 | 5/2006 | Dupuis et al. |
| 7,110,741 B2 | 9/2006 | Knopik et al. |
| 7,123,197 B2 | 10/2006 | Suzuki |
| 7,274,546 B2 | 9/2007 | Gauthier, Jr. et al. |
| 7,348,854 B1 | 3/2008 | Mordkovich |
| 7,352,247 B2 | 4/2008 | Oh et al. |
| 7,378,780 B2 | 5/2008 | Mizumura et al. |
| 7,409,192 B2 | 8/2008 | Lombardi et al. |
| 7,425,873 B2 | 9/2008 | Yamamoto |
| 7,477,197 B2 | 1/2009 | Zeng et al. |
| 7,515,000 B1 | 4/2009 | Jin et al. |
| 7,579,672 B2 | 8/2009 | Wu |
| 7,593,204 B1 | 9/2009 | Iversen et al. |
| 7,649,722 B2 | 1/2010 | Thijs et al. |
| 7,679,452 B2 | 3/2010 | Perez |
| 7,786,807 B1 | 8/2010 | Li et al. |
| 7,881,029 B1 | 2/2011 | Li et al. |
| 7,911,269 B2 | 3/2011 | Yang et al. |
| 7,952,433 B2 | 5/2011 | An et al. |
| 8,125,788 B2 | 2/2012 | Hatanaka et al. |
| 8,131,251 B2 | 3/2012 | Burgener et al. |
| 8,199,518 B1 | 6/2012 | Chun et al. |
| 8,289,084 B2 | 10/2012 | Morimoto et al. |
| 8,310,835 B2 | 11/2012 | Lin et al. |
| 8,362,840 B2 | 1/2013 | Andrys et al. |
| 8,410,990 B2 | 4/2013 | Kazanchian |
| 8,456,856 B2 | 6/2013 | Lin et al. |
| 8,554,162 B2 | 10/2013 | Lindstrand et al. |
| 8,610,503 B2 | 12/2013 | Kaczman et al. |
| 8,686,796 B2 | 4/2014 | Presti |
| 8,773,204 B2 | 7/2014 | Cabanillas et al. |
| 8,803,615 B2 | 8/2014 | Cabanillas et al. |
| 8,847,689 B2 | 9/2014 | Zhao et al. |
| 8,912,959 B2 | 12/2014 | Chiu et al. |
| 9,000,847 B2 | 4/2015 | Zhao et al. |
| 9,019,010 B2 | 4/2015 | Costa |
| 9,219,445 B2 | 12/2015 | Nobbe et al. |
| 9,225,303 B1 | 12/2015 | Nieland |
| 9,343,817 B2 | 5/2016 | Pan |
| 9,369,087 B2 | 6/2016 | Burgener et al. |
| 9,595,926 B2 | 3/2017 | Quaglietta |
| 9,660,609 B2 | 5/2017 | Reisner et al. |
| 9,680,416 B2 | 6/2017 | Burgener et al. |
| 9,691,710 B1 | 6/2017 | Deng et al. |
| 9,743,522 B2 | 8/2017 | Li et al. |
| 9,786,613 B2 | 10/2017 | Stauber |
| 9,825,597 B2 | 11/2017 | Wallis |
| 9,831,414 B2 | 11/2017 | Kojo |
| 9,838,047 B2 | 12/2017 | Oliaei |
| 9,871,007 B2 | 1/2018 | Meyers et al. |
| 9,887,454 B2 | 2/2018 | Ito et al. |
| 9,918,386 B2 | 3/2018 | Frenette et al. |
| 10,062,670 B2 | 8/2018 | Frenette et al. |
| 10,084,416 B2 | 9/2018 | Wallis |
| 10,098,229 B2 | 10/2018 | Takagi et al. |
| 10,110,168 B2 | 10/2018 | Soliman |
| 10,110,468 B2 | 10/2018 | Farmanbar |
| 10,171,053 B2 | 1/2019 | Soliman |
| 10,211,795 B2 | 2/2019 | Wallis |
| 10,230,337 B2 | 3/2019 | Wallis |
| 10,231,341 B2 | 3/2019 | Frenette et al. |
| 10,256,535 B2 | 4/2019 | Nguyen et al. |
| 10,269,769 B2 | 4/2019 | Frenette et al. |
| 10,276,521 B2 | 4/2019 | Babcock et al. |
| 10,283,859 B2 | 5/2019 | Nguyen et al. |
| 10,297,576 B2 | 5/2019 | Frenette et al. |
| 10,297,913 B2 | 5/2019 | Khoury |
| 10,320,058 B2 | 6/2019 | Hsu et al. |
| 10,320,071 B2 | 6/2019 | Nguyen et al. |
| 10,362,678 B2 | 7/2019 | Frenette et al. |
| 10,446,524 B2 | 10/2019 | Frenette et al. |
| 10,454,432 B2 | 10/2019 | Soliman |
| 10,505,255 B2 | 12/2019 | Baheti et al. |
| 10,515,924 B2 | 12/2019 | Babcock et al. |
| 10,530,050 B2 | 1/2020 | Nguyen et al. |

(56) References Cited

U.S. PATENT DOCUMENTS

| | | |
|---|---|---|
| 10,535,637 B2 | 1/2020 | Frenette et al. |
| 10,548,223 B2 | 1/2020 | Frenette et al. |
| 10,629,553 B2 | 4/2020 | Soliman et al. |
| 10,651,798 B2 | 5/2020 | Soliman |
| 10,666,205 B2 | 5/2020 | Wallis |
| 10,770,452 B2 | 9/2020 | Wallis |
| 10,892,718 B2 | 1/2021 | Wallis |
| 10,931,009 B2 | 2/2021 | Nguyen et al. |
| 10,957,973 B2 | 3/2021 | Ariumi |
| 11,037,893 B2 | 6/2021 | Wallis et al. |
| 11,038,266 B2 | 6/2021 | Khoury |
| 11,043,466 B2 | 6/2021 | Babcock et al. |
| 11,049,824 B2 | 6/2021 | Franson et al. |
| 11,069,952 B2 | 7/2021 | Keller, III |
| 11,082,008 B2 | 8/2021 | Soliman |
| 11,088,112 B2 | 8/2021 | Frenette et al. |
| 11,223,116 B2 | 1/2022 | Lasiter et al. |
| 11,380,979 B2 | 7/2022 | Dalmia et al. |
| 2002/0053947 A1 | 5/2002 | Macedo |
| 2002/0067205 A1 | 6/2002 | Aparin et al. |
| 2002/0153570 A1 | 10/2002 | Lin et al. |
| 2004/0207021 A1 | 10/2004 | Russ et al. |
| 2004/0238857 A1 | 12/2004 | Beroz et al. |
| 2004/0252064 A1 | 12/2004 | Yuanzhu |
| 2005/0045729 A1 | 3/2005 | Yamazaki |
| 2005/0078038 A1 | 4/2005 | Takaki et al. |
| 2005/0122644 A1 | 6/2005 | Ma et al. |
| 2005/0184626 A1 | 8/2005 | Chiba et al. |
| 2005/0269659 A1 | 12/2005 | Huang |
| 2005/0272399 A1 | 12/2005 | Murata |
| 2006/0006950 A1 | 1/2006 | Burns et al. |
| 2006/0245308 A1 | 11/2006 | Macroupoulos et al. |
| 2007/0046376 A1 | 3/2007 | Der Heijden |
| 2007/0070564 A1 | 3/2007 | Ma et al. |
| 2007/0075693 A1 | 4/2007 | Xi |
| 2007/0109697 A1 | 5/2007 | Huh |
| 2007/0138629 A1 | 6/2007 | Lam |
| 2007/0164907 A1 | 7/2007 | Gaucher et al. |
| 2007/0273445 A1 | 11/2007 | Sarkar |
| 2008/0030282 A1 | 2/2008 | Maget et al. |
| 2008/0061419 A1 | 3/2008 | Enquist et al. |
| 2008/0084677 A1* | 4/2008 | Ho .......................... H01L 25/16 |
| | | 361/760 |
| 2008/0158063 A1 | 7/2008 | Zeng et al. |
| 2008/0232010 A1 | 9/2008 | Wang et al. |
| 2008/0239597 A1 | 10/2008 | Van Bezooijen et al. |
| 2008/0239599 A1 | 10/2008 | Yizraeli et al. |
| 2008/0291115 A1 | 11/2008 | Doan et al. |
| 2009/0027741 A1 | 1/2009 | Quah et al. |
| 2009/0091904 A1 | 4/2009 | Hatanakam et al. |
| 2009/0108431 A1 | 4/2009 | Farley |
| 2009/0163159 A1 | 6/2009 | Ooi |
| 2009/0267220 A1 | 10/2009 | Kuhlman et al. |
| 2009/0295645 A1 | 12/2009 | Campero et al. |
| 2010/0103058 A1 | 4/2010 | Kato et al. |
| 2010/0117750 A1 | 5/2010 | Fry et al. |
| 2010/0158084 A1 | 6/2010 | Voinigescu et al. |
| 2010/0202126 A1 | 8/2010 | Nakamura et al. |
| 2010/0233975 A1 | 9/2010 | Wu |
| 2010/0237947 A1 | 9/2010 | Xiong et al. |
| 2011/0003571 A1 | 1/2011 | Park et al. |
| 2011/0018635 A1 | 1/2011 | Tasic et al. |
| 2011/0042798 A1 | 2/2011 | Pagaila et al. |
| 2011/0043284 A1 | 2/2011 | Zhao et al. |
| 2011/0076979 A1 | 3/2011 | Wu et al. |
| 2011/0084378 A1* | 4/2011 | Welch ................. H01L 23/3121 |
| | | 438/117 |
| 2011/0175789 A1 | 7/2011 | Lee et al. |
| 2011/0273360 A1 | 11/2011 | Campero |
| 2011/0291765 A1 | 12/2011 | Sun et al. |
| 2011/0292554 A1 | 12/2011 | Yao et al. |
| 2012/0049894 A1 | 3/2012 | Berchtold et al. |
| 2012/0062286 A1 | 3/2012 | Ginsburg et al. |
| 2012/0062325 A1 | 3/2012 | Kim et al. |
| 2012/0074990 A1 | 3/2012 | Sornin |
| 2012/0079468 A1 | 3/2012 | Gringauze et al. |
| 2012/0092220 A1 | 4/2012 | Tani et al. |
| 2012/0224407 A1 | 9/2012 | Aleksic et al. |
| 2012/0262239 A1 | 10/2012 | Taghivand et al. |
| 2012/0274409 A1 | 11/2012 | Eldesouki et al. |
| 2012/0313821 A1 | 12/2012 | Fischer |
| 2013/0009704 A1 | 1/2013 | Liao |
| 2013/0056882 A1 | 3/2013 | Kim et al. |
| 2013/0084915 A1 | 4/2013 | Asuri et al. |
| 2013/0093629 A1 | 4/2013 | Chiu et al. |
| 2013/0100616 A1 | 4/2013 | Zohni et al. |
| 2013/0162362 A1 | 6/2013 | Harima |
| 2013/0241662 A1 | 9/2013 | Aleksic et al. |
| 2013/0331043 A1 | 12/2013 | Perumana et al. |
| 2013/0334321 A1 | 12/2013 | Kato et al. |
| 2013/0342022 A1 | 12/2013 | Browning et al. |
| 2013/0343022 A1 | 12/2013 | Hu et al. |
| 2014/0003000 A1 | 1/2014 | McPartlin |
| 2014/0009204 A1 | 1/2014 | Cebi et al. |
| 2014/0015614 A1 | 1/2014 | Oliveira et al. |
| 2014/0023012 A1 | 1/2014 | Sato |
| 2014/0042607 A1 | 2/2014 | Knickerbocker |
| 2014/0043105 A1 | 2/2014 | Zerbe et al. |
| 2014/0062607 A1 | 3/2014 | Nair et al. |
| 2014/0071566 A1 | 3/2014 | Parthasarathy et al. |
| 2014/0085760 A1 | 3/2014 | Lui |
| 2014/0104010 A1 | 4/2014 | Chen et al. |
| 2014/0124956 A1 | 5/2014 | Lee |
| 2014/0148434 A1 | 5/2014 | Boyall et al. |
| 2014/0151105 A1 | 6/2014 | Kuwahara |
| 2014/0167232 A1 | 6/2014 | LoBianco et al. |
| 2014/0175621 A1 | 6/2014 | Chen et al. |
| 2014/0184334 A1 | 7/2014 | Nobbe et al. |
| 2014/0225795 A1 | 8/2014 | Yu |
| 2014/0232477 A1 | 8/2014 | Park et al. |
| 2014/0252595 A1 | 9/2014 | Yen et al. |
| 2014/0253242 A1 | 9/2014 | Youssef et al. |
| 2014/0253382 A1 | 9/2014 | Markish et al. |
| 2014/0256271 A1 | 9/2014 | Kok |
| 2014/0266461 A1 | 9/2014 | Youssef et al. |
| 2014/0266480 A1 | 9/2014 | Li et al. |
| 2014/0308907 A1 | 10/2014 | Chen |
| 2014/0348274 A1 | 11/2014 | Youssef et al. |
| 2015/0015339 A1 | 1/2015 | Gorbachov et al. |
| 2015/0015863 A1 | 1/2015 | Kempen et al. |
| 2015/0035600 A1 | 2/2015 | Jin et al. |
| 2015/0056940 A1 | 2/2015 | Rangarajan et al. |
| 2015/0061770 A1 | 3/2015 | Luo et al. |
| 2015/0091658 A1 | 4/2015 | Shima et al. |
| 2015/0097031 A1 | 4/2015 | Yang et al. |
| 2015/0097629 A1 | 4/2015 | Chong |
| 2015/0155831 A1 | 6/2015 | Shirvani |
| 2015/0162877 A1 | 6/2015 | Ni |
| 2015/0222012 A1 | 8/2015 | Van Zeijl et al. |
| 2015/0249051 A1 | 9/2015 | Tsai et al. |
| 2015/0263421 A1 | 9/2015 | Chiu et al. |
| 2015/0270806 A1 | 9/2015 | Wagh et al. |
| 2015/0270943 A1 | 9/2015 | Liu et al. |
| 2015/0310994 A1 | 10/2015 | Yosui |
| 2015/0333760 A1 | 11/2015 | Zerbe et al. |
| 2015/0340992 A1 | 11/2015 | Korol et al. |
| 2015/0364214 A1 | 12/2015 | Li |
| 2015/0364429 A1 | 12/2015 | Lee et al. |
| 2016/0013638 A1 | 1/2016 | Glas et al. |
| 2016/0064337 A1 | 3/2016 | Chen et al. |
| 2016/0079854 A1 | 3/2016 | Kinzer et al. |
| 2016/0079993 A1 | 3/2016 | Zerbe et al. |
| 2016/0087593 A1 | 3/2016 | Nobbe et al. |
| 2016/0094192 A1 | 3/2016 | Khesbak et al. |
| 2016/0099720 A1 | 4/2016 | Bashir et al. |
| 2016/0112054 A1 | 4/2016 | Gonzalez et al. |
| 2016/0128179 A1 | 5/2016 | Okamoto et al. |
| 2016/0149300 A1 | 5/2016 | Ito et al. |
| 2016/0164476 A1 | 6/2016 | Wang |
| 2016/0172845 A1 | 6/2016 | Parris et al. |
| 2016/0226496 A1 | 8/2016 | Aleksic et al. |
| 2016/0337117 A1 | 11/2016 | Liu et al. |
| 2016/0365994 A1 | 12/2016 | Chen et al. |
| 2017/0040941 A1 | 2/2017 | Chatwin |

(56) References Cited

U.S. PATENT DOCUMENTS

| | | |
|---|---|---|
| 2017/0117907 A1 | 4/2017 | Grollitsch |
| 2017/0163223 A1 | 6/2017 | Shimamoto |
| 2017/0194317 A1 | 7/2017 | Wallis |
| 2017/0194918 A1 | 7/2017 | Wallis |
| 2017/0201291 A1 | 7/2017 | Gu et al. |
| 2017/0207791 A1 | 7/2017 | Zerbe et al. |
| 2017/0232345 A1 | 8/2017 | Rofougaran et al. |
| 2017/0237181 A1 | 8/2017 | Chen et al. |
| 2017/0278816 A1 | 9/2017 | Li et al. |
| 2017/0278840 A1 | 9/2017 | Robbins et al. |
| 2017/0279415 A1 | 9/2017 | Wallis |
| 2017/0288609 A1 | 10/2017 | Soliman |
| 2017/0301630 A1 | 10/2017 | Nguyen et al. |
| 2017/0301653 A1 | 10/2017 | Frenette et al. |
| 2017/0301654 A1 | 10/2017 | Frenette et al. |
| 2017/0301655 A1 | 10/2017 | Frenette et al. |
| 2017/0301985 A1 | 10/2017 | Nguyen et al. |
| 2017/0301986 A1 | 10/2017 | Nguyen et al. |
| 2017/0302224 A1 | 10/2017 | Frenette et al. |
| 2017/0302325 A1 | 10/2017 | Frenette et al. |
| 2017/0303400 A1 | 10/2017 | Frenette et al. |
| 2017/0324160 A1 | 11/2017 | Khoury |
| 2017/0324388 A1 | 11/2017 | Soliman |
| 2018/0026592 A1 | 1/2018 | Wallis |
| 2018/0138872 A1 | 5/2018 | Wallis |
| 2018/0219516 A1 | 8/2018 | Soliman |
| 2018/0226367 A1 | 8/2018 | Babcock et al. |
| 2018/0255643 A1 | 9/2018 | Frenette et al. |
| 2018/0286840 A1 | 10/2018 | Nair et al. |
| 2018/0323752 A1 | 11/2018 | Wallis |
| 2019/0007002 A1 | 1/2019 | Wallis |
| 2019/0043837 A1 | 2/2019 | Frenette et al. |
| 2019/0097594 A1 | 3/2019 | Soliman |
| 2019/0103365 A1* | 4/2019 | Singh ............... H01L 23/552 |
| 2019/0181809 A1 | 6/2019 | Wallis |
| 2019/0181815 A1 | 6/2019 | Wallis |
| 2019/0198990 A1 | 6/2019 | Nguyen et al. |
| 2019/0214354 A1 | 7/2019 | Soliman et al. |
| 2019/0223079 A1 | 7/2019 | Frenette et al. |
| 2019/0230794 A1 | 7/2019 | Frenette et al. |
| 2019/0237433 A1 | 8/2019 | Frenette et al. |
| 2019/0334237 A1 | 10/2019 | Khoury |
| 2019/0341687 A1 | 11/2019 | Nguyen et al. |
| 2019/0343000 A1 | 11/2019 | Frenette |
| 2020/0058619 A1 | 2/2020 | Frenette et al. |
| 2020/0106403 A1 | 4/2020 | Soliman |
| 2020/0279825 A1 | 9/2020 | Babcock et al. |
| 2020/0336107 A1 | 10/2020 | Soliman |
| 2020/0357756 A1 | 11/2020 | Wallis et al. |
| 2021/0143542 A1 | 5/2021 | Nguyen et al. |
| 2021/0211103 A1 | 7/2021 | Wallis |
| 2021/0217713 A1 | 7/2021 | Wallis et al. |
| 2021/0217714 A1 | 7/2021 | Soliman et al. |
| 2021/0273326 A1 | 9/2021 | Khoury |

FOREIGN PATENT DOCUMENTS

| | | |
|---|---|---|
| CN | 102469051 | 5/2012 |
| CN | 102577110 | 7/2012 |
| CN | 103050482 | 4/2013 |
| CN | 104936395 | 9/2015 |
| CN | 105409060 | 3/2016 |
| CN | 105409116 | 3/2016 |
| CN | 105515542 | 4/2016 |
| CN | 102884724 | 5/2016 |
| CN | 103748785 | 7/2017 |
| JP | 2008-054260 | 3/2008 |
| JP | 2009-027741 | 2/2009 |
| JP | 2012-079468 | 4/2012 |
| JP | 2014-023012 | 2/2014 |
| KR | 10-2005-0084978 | 8/2005 |
| KR | 10-2010-0059724 | 6/2010 |
| KR | 10-2015-0028844 | 5/2015 |
| KR | 10-2012-0133119 | 5/2018 |
| TW | 577191 | 2/2004 |
| TW | 201517506 | 5/2015 |
| TW | 201603477 | 1/2016 |
| TW | I528736 | 4/2016 |
| WO | WO 2015/015863 | 2/2015 |
| WO | WO 2016/189199 | 12/2016 |
| WO | WO 2017/184654 | 10/2017 |

OTHER PUBLICATIONS

Chip Design, Tools, Technologies & Methodologies, "Coordinating from Silicon to Package", Mar. 17, 2008, 11 pages.

EM358x High-Performance, Integrated ZigBee/802.15.4 System-on-Chip Family, Apr. 2014, by Silicon Laboratories, located at https://www.silabs.com/documents/public/data-sheets/EM358x.pdf.

Esswein et al., "An improved switched injection-locked oscillator for ranging and communications systems" Proceedings of the 43rd European Microwave Conference 2013 in 4 pages.

Kim, et al., "Bounded skew clock routing for 3D stacked IC designs: Enabling trade-offs between power and clock skew," International Conference on Green Computing, Chicago, IL, Aug. 2010, 2 pages.

Qualcomm, 3D VLSI: Next Generation #D Integration Technology, 2015, 60 pages.

SESUB modules for smartphones: Very small and extremely flat, TDK Europe, EPCOS, Nov. 2012, 3 pages.

Stoukatch, et al.: "3D-SIP integration for autonomous sensor nodes," 56th Electronic Components and Technology Conference 2006, San Diego, CA, 2006, 2 pages.

Törmänen et al. "A 13dBm 60GHz-Band Injection Locked PA with 36% PAE in 65nm CMOS" Electrical and Information Technology, Lund University, Proceedings of the Asia-Pacific Microwave Conference 2011, 4 pages.

Weerasekera et al., "Extending systems-on-chip to the third dimension: Performance, cost and technological tradeoffs," IEEE/ACM International Conference on Computer-Aided Design, Digest of Technical Papers, ICCAD. 212-219. 10.1109/ICCAD.2007.4397268. Dec. 2007, 9 pages.

International Search Report dated Aug. 18, 2017 for International Application No. PCT/US2017/028209 filed Apr. 18, 2017, 3 pages.

Written Opinion dated Aug. 18, 2017 for International Application No. PCT/US2017/028209 filed Apr. 18, 2017, 16 pages.

International Search Report for International Application No. PCT/US2016/068712, dated Mar. 20, 2017, in 3 pages.

Written Opinion of the International Searching Authority for International Application No. PCT/US2016/068712, dated Mar. 20, 2017, in 8 pages.

International Search Report for International Application No. PCT/US2017/025091, dated Mar. 30, 2017, in 3 pages.

PCT Written Opinion of the International Searching Authority for International Application No. PCT/US2017/025091, dated Mar. 30, 2017, in 7 pages.

International Preliminary Report on Patentability for PCT Application No. PCT/US2017/028209, dated Oct. 23, 2018, in 17 pages.

Wikipedia contributors, "Common source," *Wikipedia, The Free Encyclopedia.* Wikipedia, https://en.wikipedia.org/wiki/Common_source (accessed: Jun. 28, 2017).

Wikipedia contributors, "Common emitter," *Wikipedia, The Free Encyclopedia.* Wikipedia, https://en.wikipedia.org/wiki/Common_emitter (accessed: Jun. 28, 2017).

Amkor, System in Package (SIP) Technology Solutions Data Sheet, Rev. Nov. 2015, 4 pages, available at: https://www.amkor.com/index.cfm?objectid=0638A98A-A85E-0A85-F5EF006A6CEEEC13 (accessed on May 24, 2017).

Brown, et al, Trends in RF/Wireless Packaging An Overview, 2004, 98 pages, available at: http://www.iwpc.org/Presentations/IWPC_Trends_Packaging_Final_slides_MTT_S_2004.pdf (accessed on May 3, 2017).

Insight SiP, "Application Note AN160601 Use of ISP 1507 Development Kit," Oct. 27, 2016, available at: http://www.insightsip.com/fichiers_insightsip/pdf/ble/ISP1507/isp_ble_AN160601.pdf (accessed: Jul. 24, 2017).

Insight SiP, "ISP 1507 High Performance Bluetooth 5 Ready, NFC & ANT Low Energy Module with MCU & Antenna," Jan. 16, 2017,

(56) References Cited

OTHER PUBLICATIONS available at: http://www.insightsip.com/fichiers_insightsip/pdf/ble/ISP1507/isp_ble_DS1507.pdf (accessed: Jul. 24, 2017).
Murata Electronics, "SN8000/SN800UFL Wi-Fi Module: Data Sheet," Version 1.0, Nov. 25, 2013, available at: http://www.mouser.com/pdfdocs/sn80008000ufl_ds_112513.PDF (accessed: Jul. 24, 2017).
Murata Electronics, "SN820X Wi-Fi Network Controller Module Family: User Manual," Version 2.2, Mar. 3, 2014, available at: http://www.mouser.com/pdfdocs/sn820x_manual_030314.PDF (accessed: Jul. 24, 2017).
Murata Electronics, "Bluetooth Low Energy Module Data Sheet," Rev. J, Feb. 27, 2015, available at: http://wireless.murata.com/eng/products/rf-modules-1/bluetooth/type-zy.html PDF (accessed: Jul. 24, 2017).

* cited by examiner

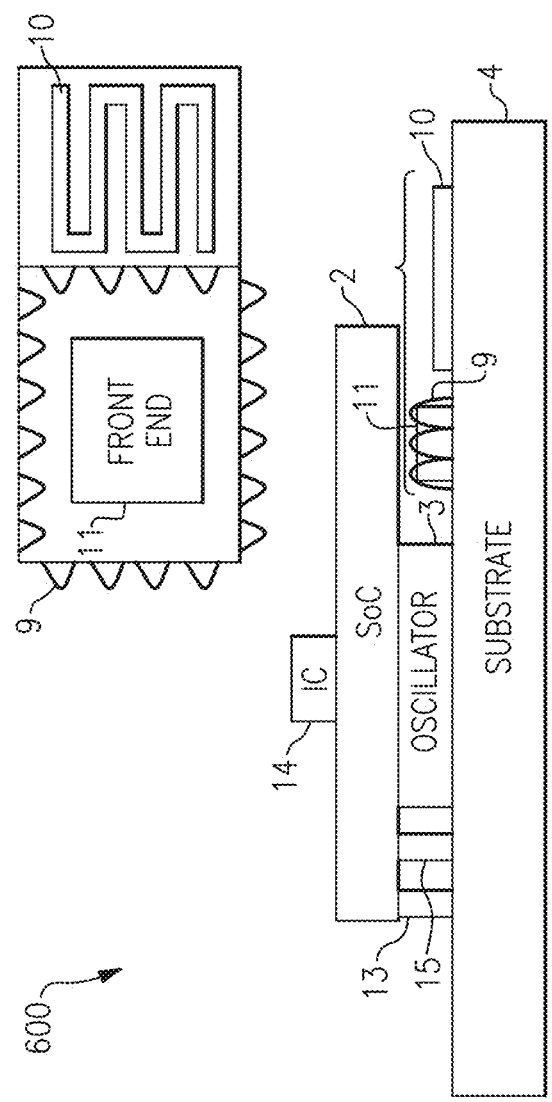
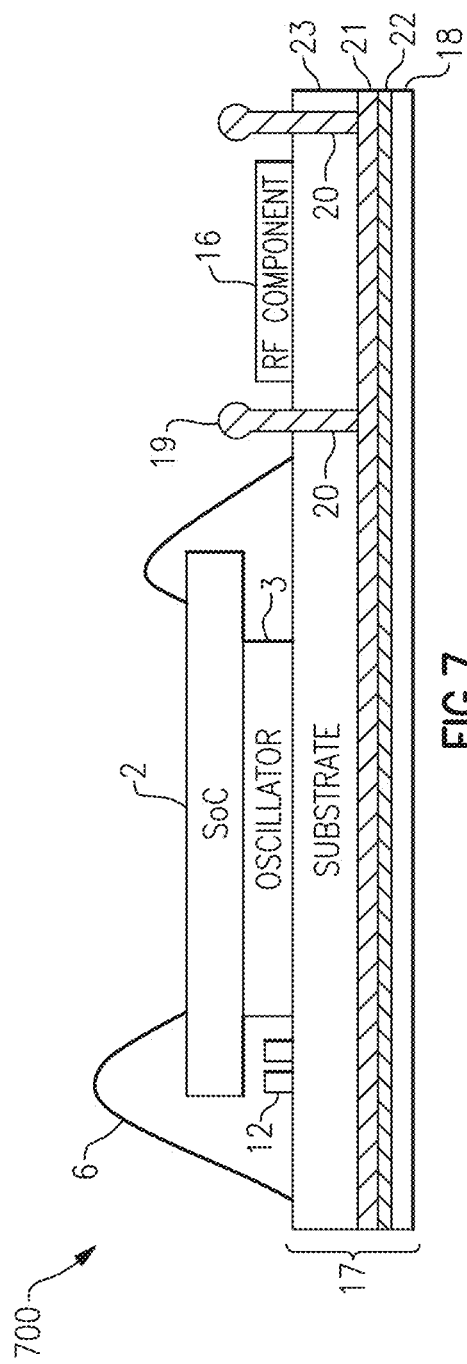

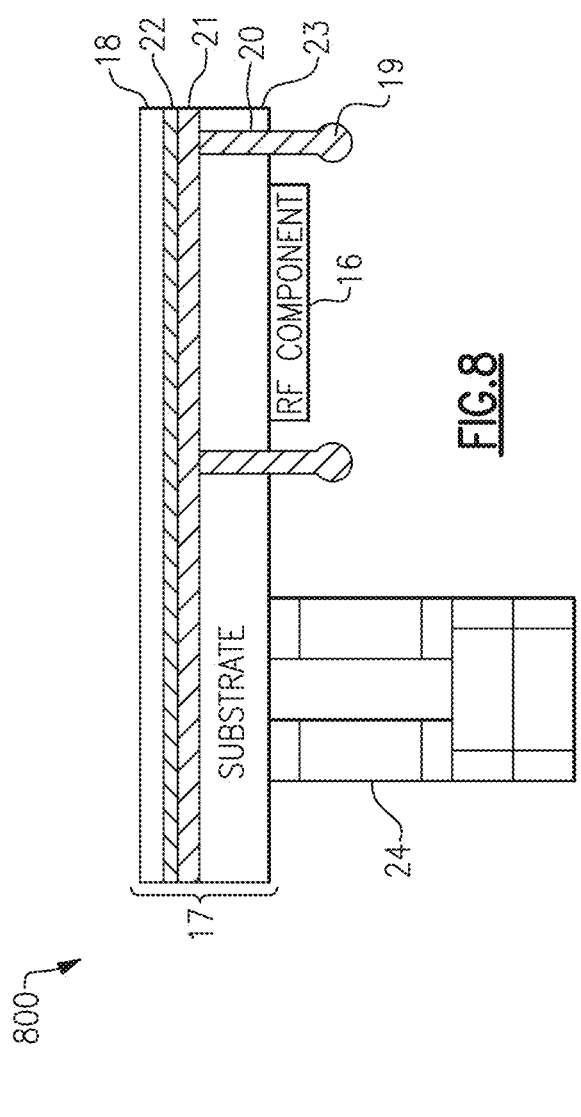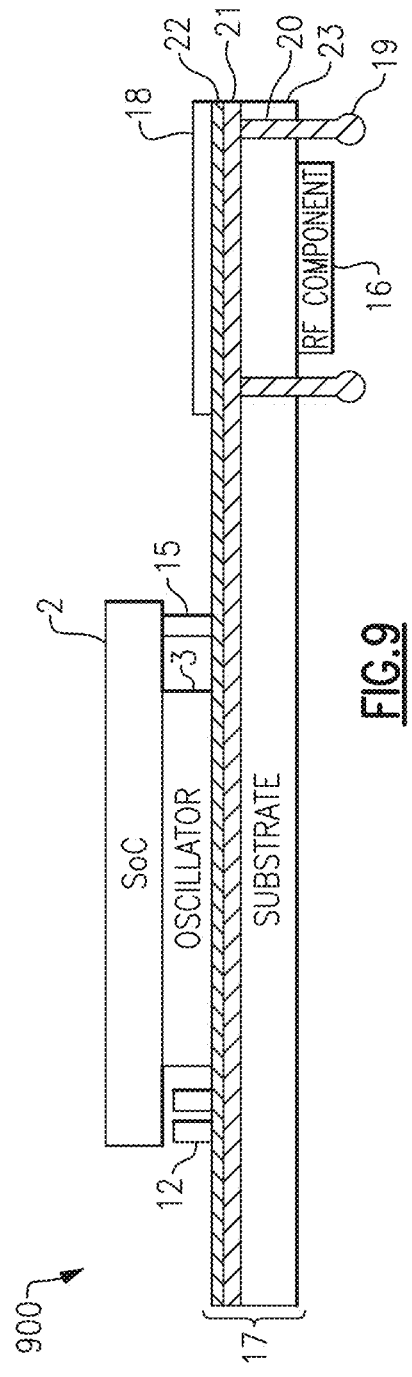

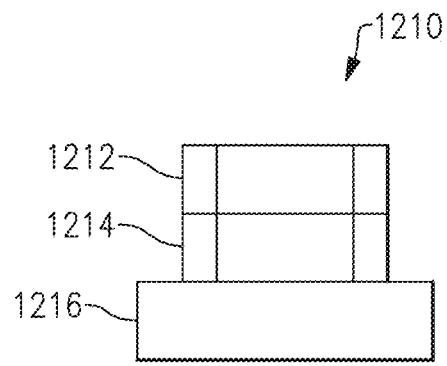
FIG.8A1
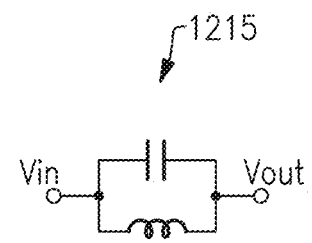
FIG.8A2
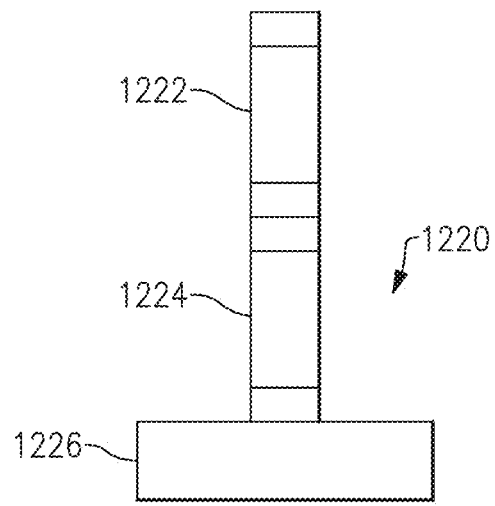
FIG.8B1
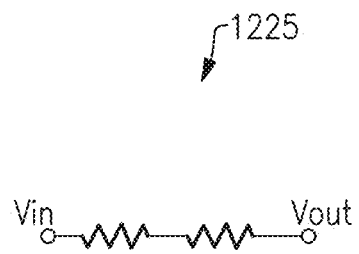
FIG.8B2

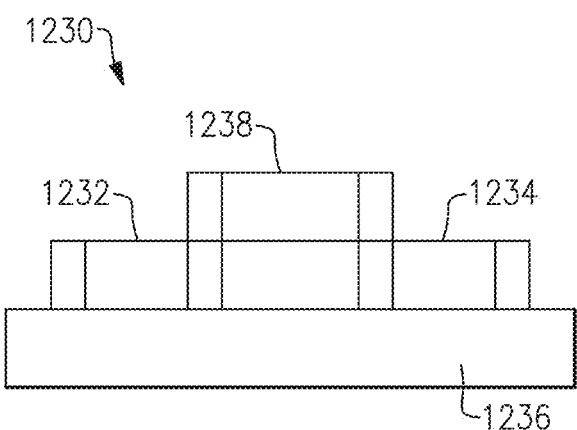
FIG.8C1
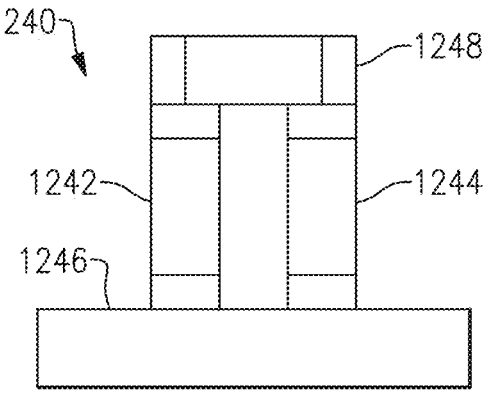
FIG.8C2
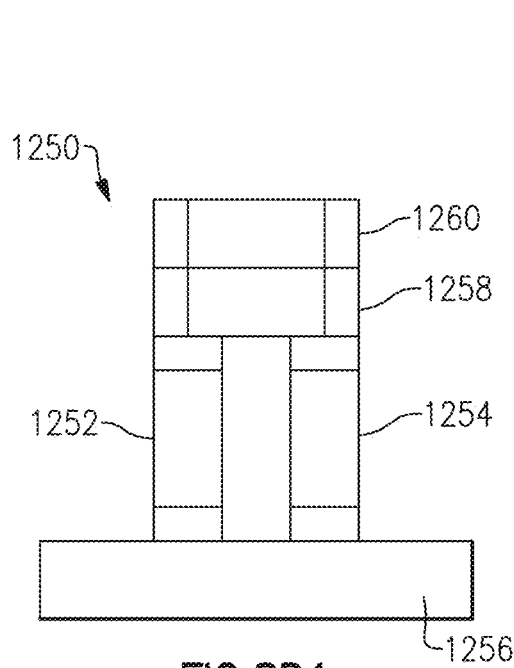
FIG.8D1
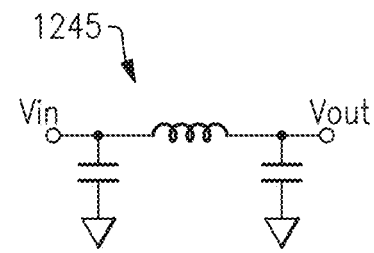
FIG.8C3
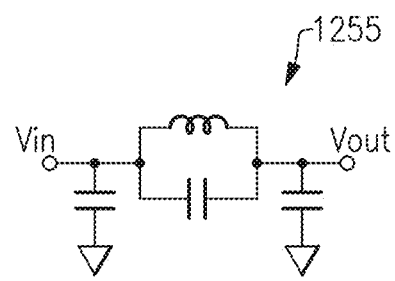
FIG.8D2

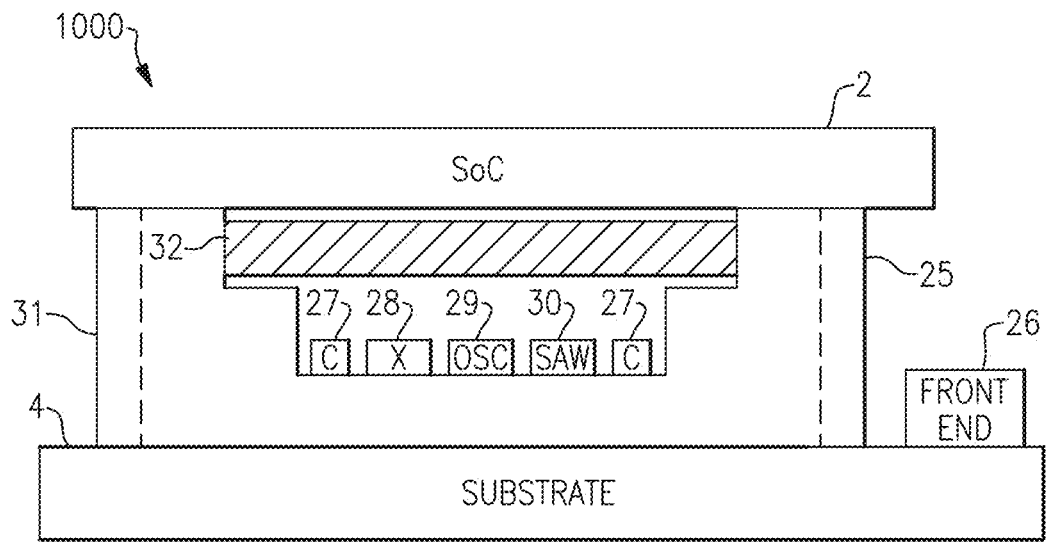
FIG.10
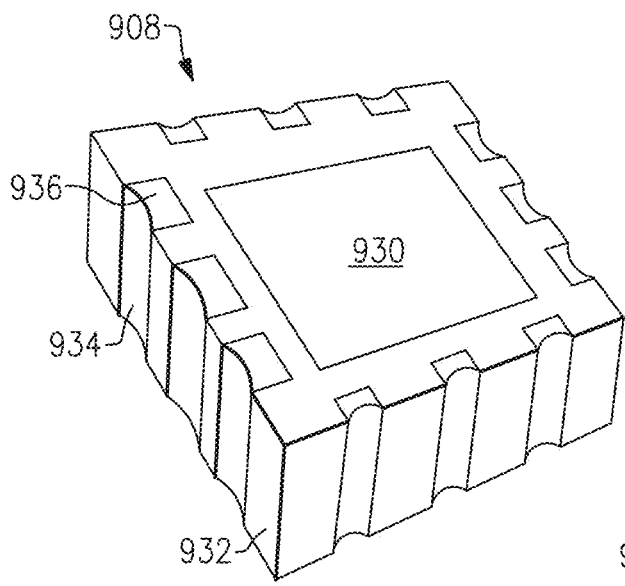
FIG.10A1
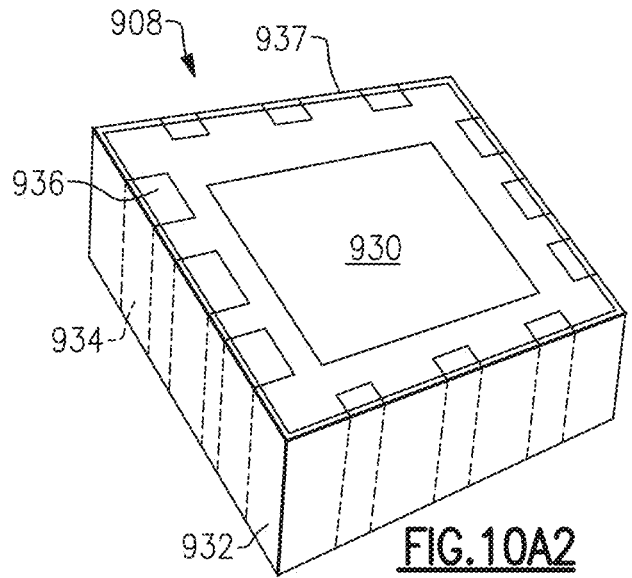
FIG.10A2

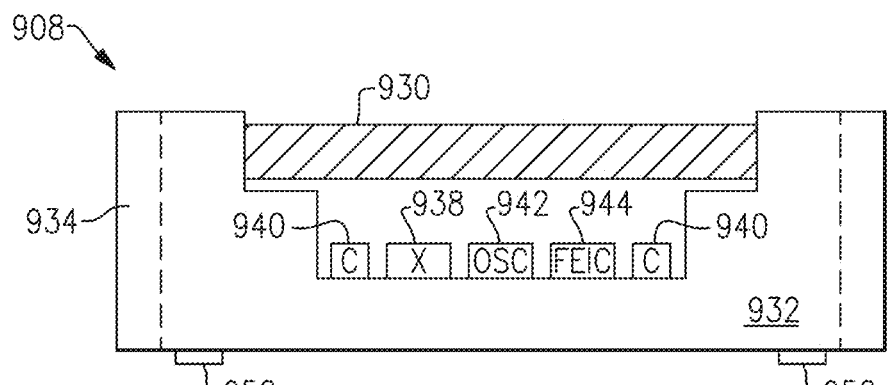
FIG.10B1
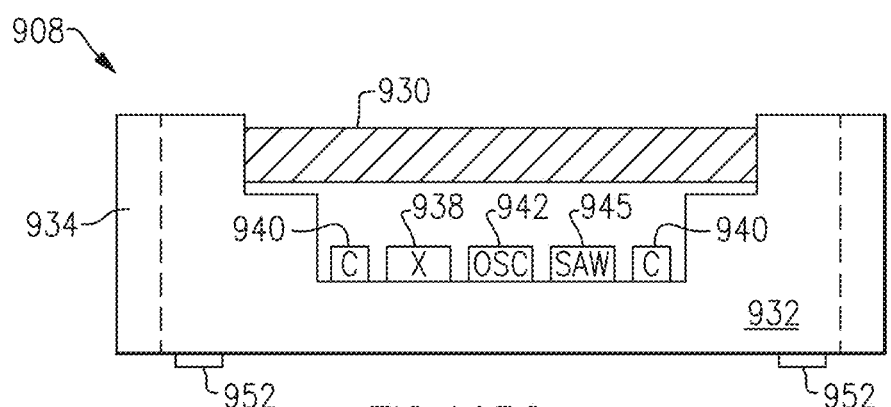
FIG.10B2
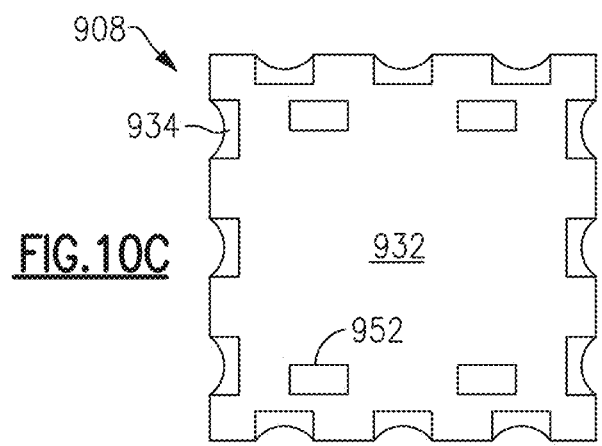
FIG.10C

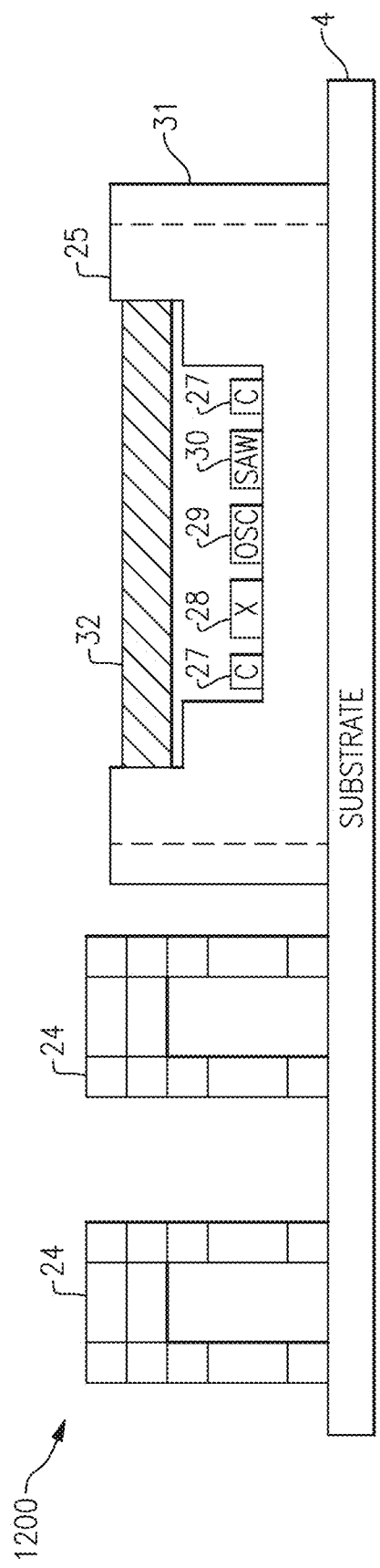
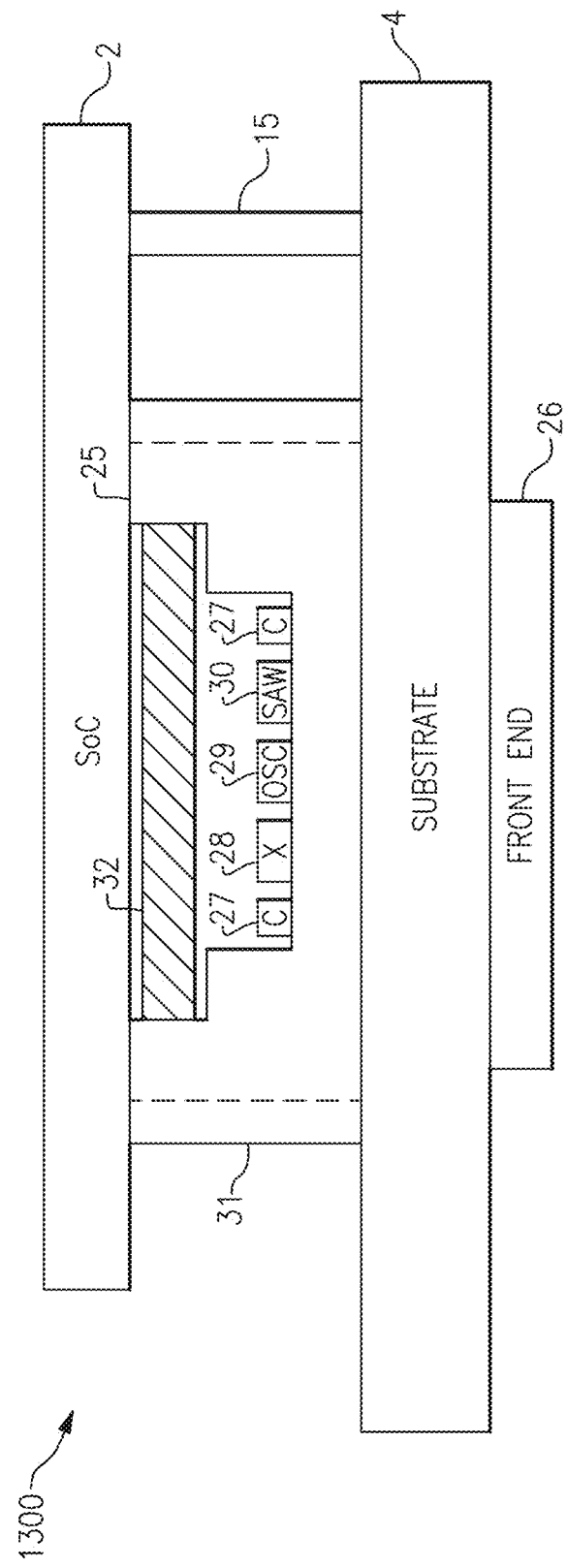

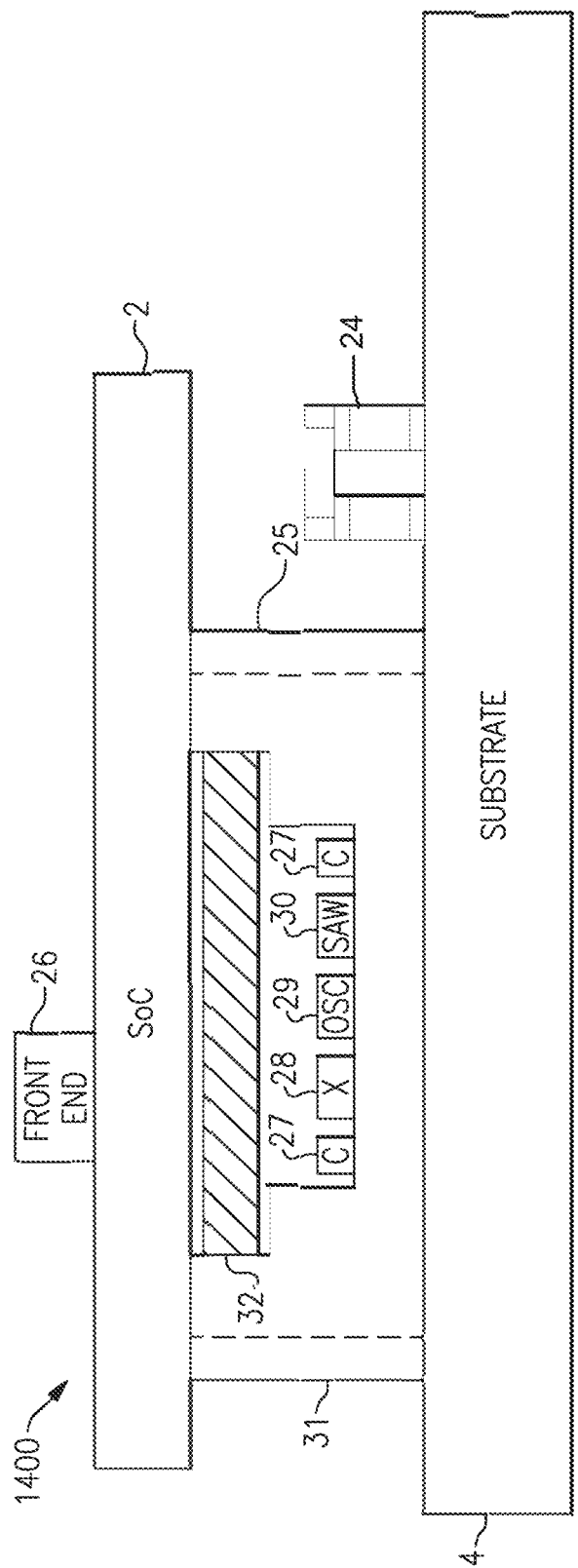
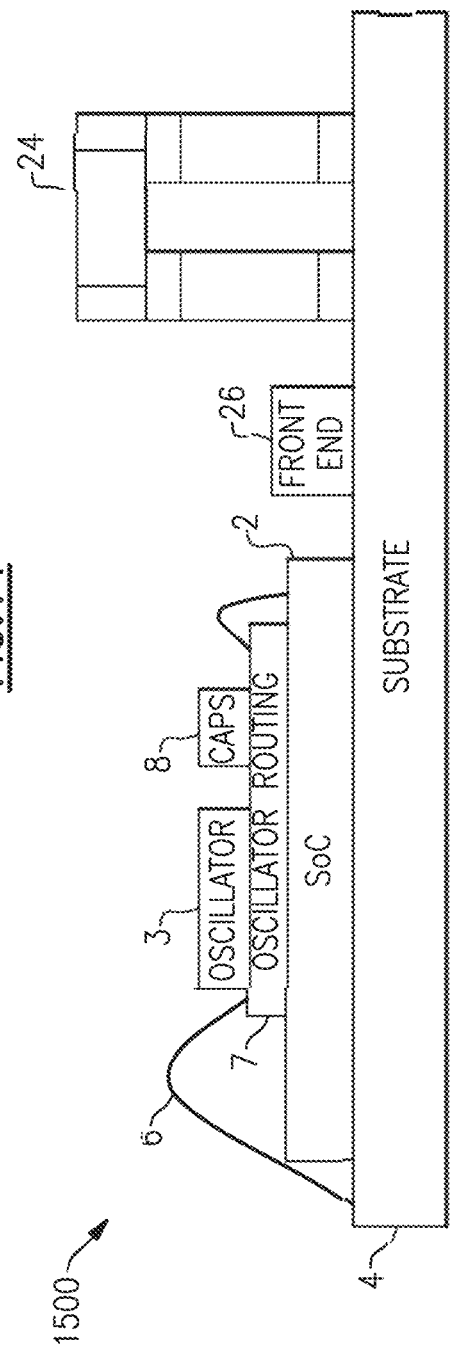

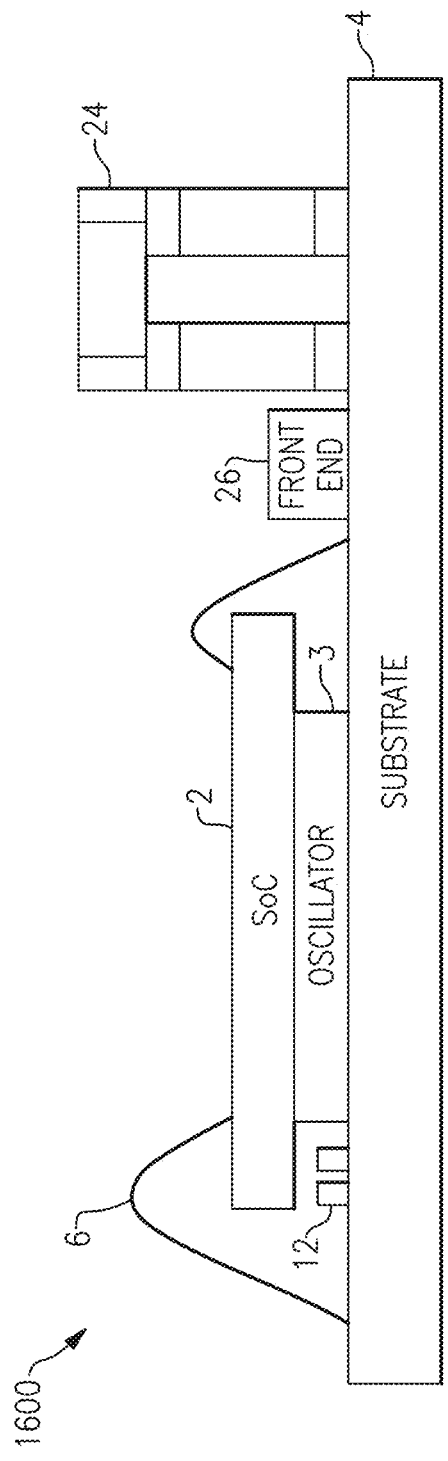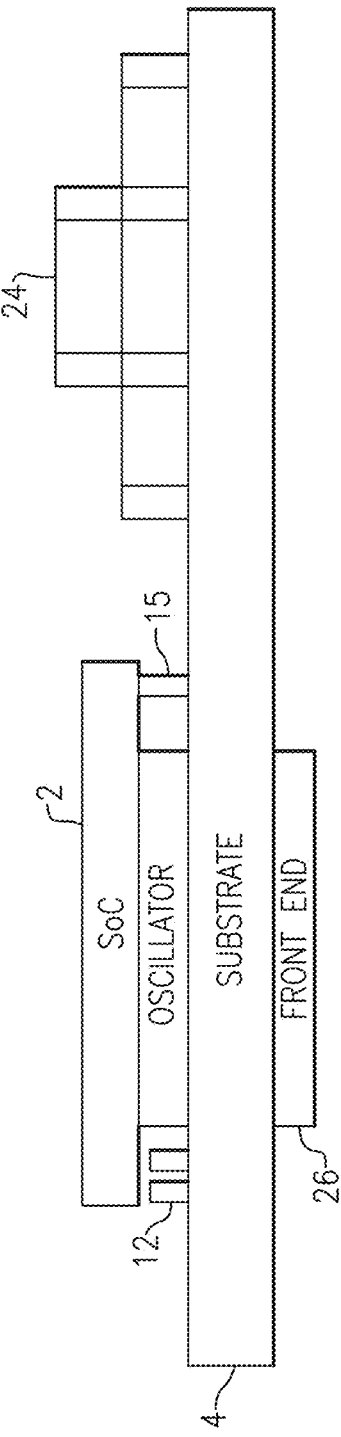

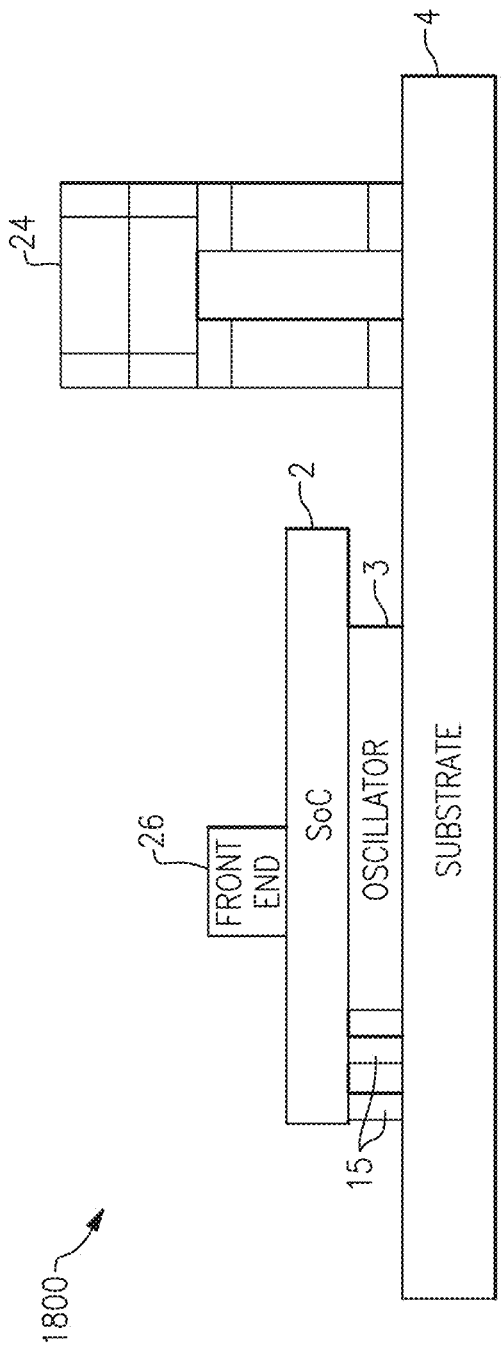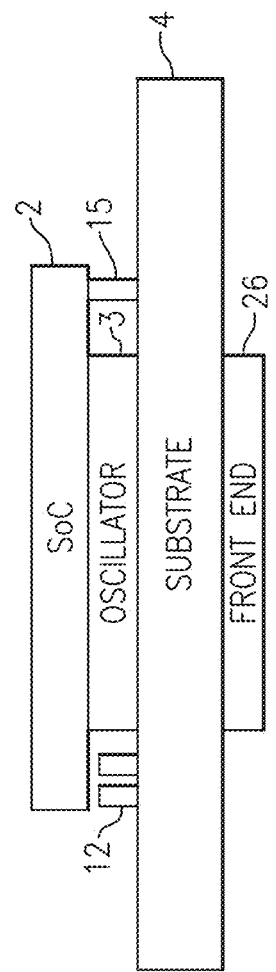

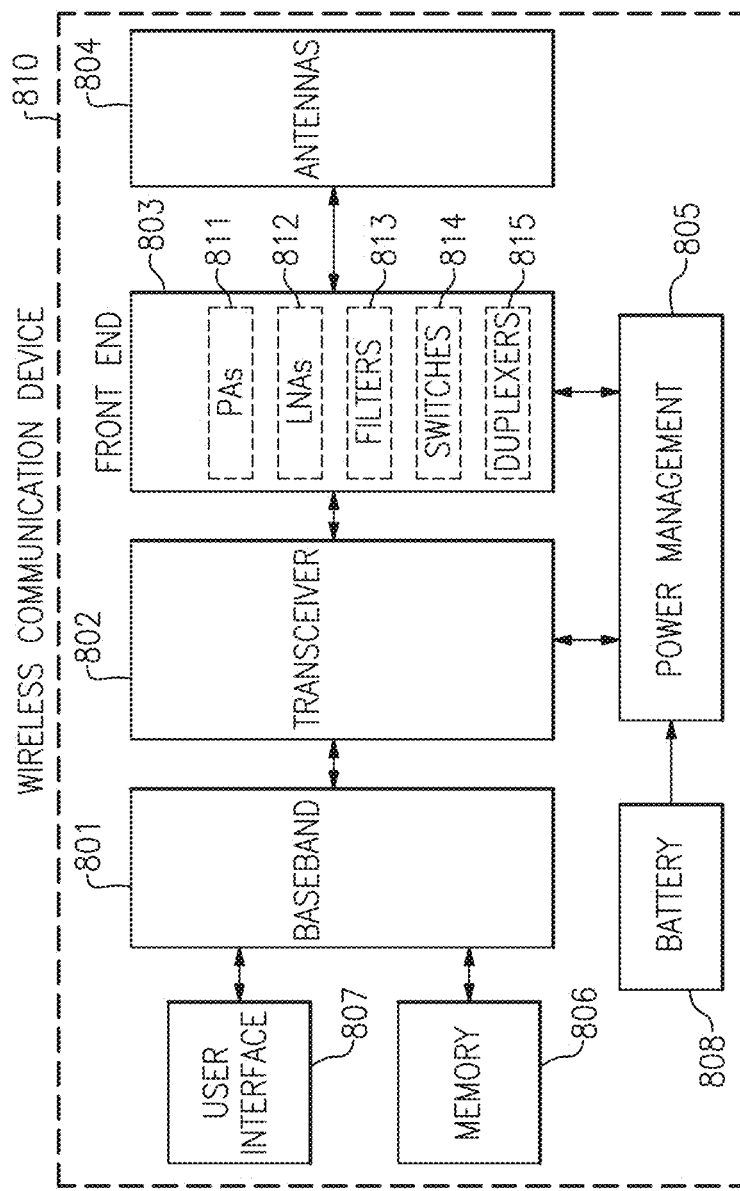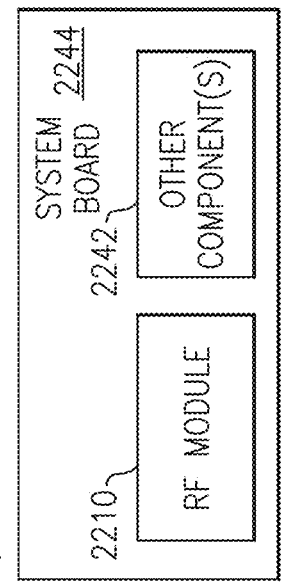

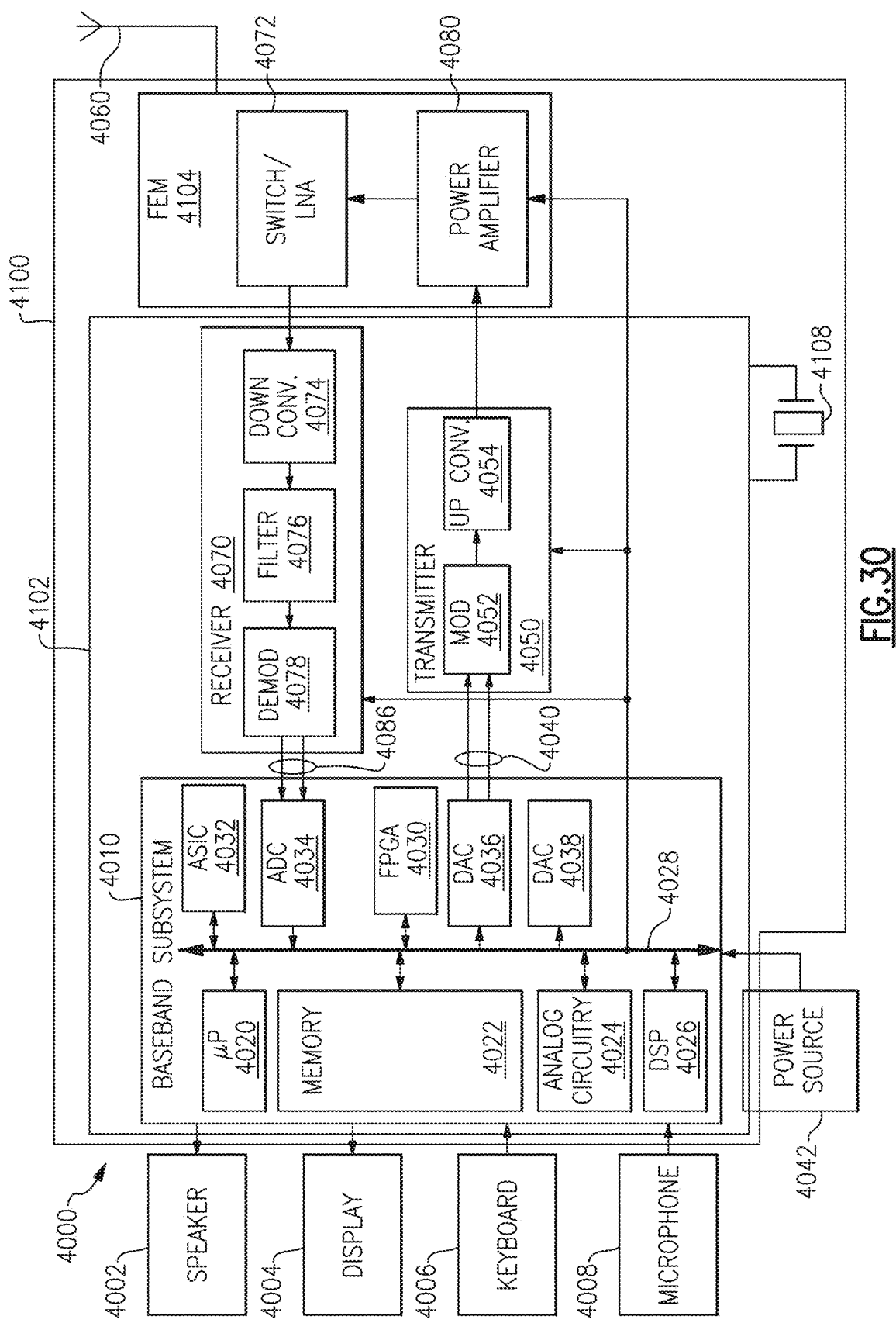

RADIO FREQUENCY MODULES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to electronic systems, and in particular, to radio frequency (RF) electronics.

Description of Related Technology

A radio frequency electronic system can process radio frequency signals in a frequency range from about 30 kilohertz (kHz) to 300 gigahertz (GHz), such as in a range from about 450 megahertz (MHz) to 6 GHz. A front end system is an example of a radio frequency electronic system. A front end system can be referred to as a radio frequency front end system. A radio frequency electronic system can include radio frequency modules.

Some or all of a front end system can be embodied in a radio frequency module. A packaged semiconductor module is an example of a radio frequency module. Packaged semiconductor modules can include integrated shielding technology within a package. A shielding structure can be formed around a radio frequency component of a front end system. The shielding structure can shield the radio frequency component from electromagnetic radiation that is external to the shielding structure. The shielding structure can shield circuit elements external to the shielding structure from electromagnetic radiation emitted by the radio frequency component. As more components are being integrated together with each other in a radio frequency module, shielding components from each other in a compact and efficient manner can be challenging.

A system in a package (SiP) can include integrated circuits and/or discrete components within a common package. Some or all of a front end system can be implemented in a SiP. An example SiP can include a system-on-a-chip (SoC), an oscillator assembly comprising a crystal, for example, for clocking purposes, and a front-end module (FEM) that includes a front end system. In certain SiPs, a SoC and a crystal can consume a relatively large amount of physical area. This can create a relatively large footprint for the SiP. Also, long oscillator routing paths add parasitic capacitance, which can adversely affect the ability for the oscillator to start oscillating at power up.

SUMMARY

Packaged modules for use in wireless devices are disclosed. In some embodiments, a substrate supports integrated circuit die including at least a portion of a baseband system and a front end system, an oscillator assembly, and an antenna. In some embodiments, the oscillator assembly includes an enclosure to enclose the oscillator and conductive pillars formed at least partially within a side of the enclosure to conduct signals between the top and bottom surfaces of the oscillator assembly. In some embodiments, components can be vertically integrated to save space and reduce trace length. In some embodiments, vertical integration provides an overhang volume that can include discrete components. In some embodiments, radio frequency shielding and ground planes within the substrate shield the front end system and antenna from radio frequency interference. In some embodiments, stacked filter assemblies include passive surface mount devices to filter radio frequency signals In certain embodiments, the disclosure relates to a packaged module for use in a wireless communication device. The packaged module comprises a first die supported by a substrate, an oscillator assembly configured to provide a clock signal for use by circuitry on the first die, where the oscillator assembly is supported by the substrate and disposed between the first die and the substrate, and a stacked filter assembly supported by the substrate. The stacked filter assembly includes a plurality of passive components, where at least one passive component is in direct communication with the substrate and at least another passive component spaced from the substrate by the at least one passive component that is in the direct communication with the substrate.

In an embodiment, the oscillator assembly includes a crystal, a conductive pillar, and an enclosure configured to enclose the crystal, the conductive pillar formed at least partially within a side of the enclosure and extending from a top surface to a bottom surface of the enclosure. In another embodiment, at least a first overhanging portion of the first die extending beyond at least a portion of the periphery of the oscillator assembly. In a further embodiment, the stacked filter assembly is disposed between the at least the first overhanging portion of the first die and the substrate. In a yet further embodiment, the packaged module further comprises supports positioned between the at least a first overhanging portion of the first die and the substrate to provide support for the at least a first overhanging portion of the first die.

In an embodiment, the substrate is a multi-layer substrate having a first side and a second side opposite to the first side, the multi-layer substrate including a ground plane. In another embodiment, the packaged module further comprises an antenna on the first side of the multi-layer substrate, and a second die supported by the multi-layer substrate and including at least a radio frequency component, where the second die is disposed on the second side of the multi-layer substrate such that the ground plane is positioned between the antenna and the radio frequency component. In a further embodiment, the packaged module further comprises a radio frequency shielding structure extending above the substrate, a second die supported by the substrate and in an interior of the radio frequency shielding structure, where the second die includes a radio frequency component, and an antenna supported by the substrate external to the radio frequency shielding structure. In a yet further embodiment, the packaged module further comprises a second die, where the first die, the oscillator assembly and the stacked filter assembly are disposed on a first side of the substrate, the second die disposed on a second side of the substrate opposite of the first side.

In an embodiment, the packaged module further comprises a second die, where the first die includes at least a portion of a baseband system and the second die includes at least a portion of a radio frequency front end system. In another embodiment, the first die and the oscillator assembly are disposed on a first side of the substrate, and the stacked filter assembly is disposed on a second side of the substrate opposite of the first side. In a further embodiment, the stacked filter assembly is configured as a filter circuit that is in communication with radio frequency receiver circuitry on the first die.

In certain embodiments, the disclosure relates to a system board assembly comprising a system board and a radio frequency module supported by the system board. The radio frequency module includes a first die supported by a substrate, an oscillator assembly configured to provide a clock signal for use by the first die, where the oscillator assembly is supported by the substrate and disposed between the first die and the substrate, and a stacked filter assembly supported by the substrate, where the stacked filter assembly includes a plurality of passive components, where at least one passive component is in direct communication with the substrate and at least another passive component spaced from the substrate by the at least one passive component that is in the direct communication with the substrate. The system board assembly further comprises one or more components including at least one of radio frequency circuitry, baseband processor, and memory supported by the system board and connectivity to provide signal interconnections between the radio frequency module and the one or more components.

In an embodiment, the oscillator assembly includes a crystal, a conductive pillar, and an enclosure configured to enclose the crystal, where the conductive pillar formed at least partially within a side of the enclosure and extending from a top surface to a bottom surface of the enclosure. In another embodiment, the radio frequency module further includes a radio frequency shielding structure extending above the substrate and a second die supported by the substrate and disposed in an interior of the radio frequency shielding structure. In a further embodiment, the radio frequency module further includes an antenna supported by the substrate external to the radio frequency shielding structure.

In certain embodiments, the disclosure relates to a wireless communication device comprising an antenna configured to receive and transmit radio frequency signals and a radio frequency module. The radio frequency module includes a first die supported by a substrate, where the first die includes at least a portion of a radio frequency front end system that is in communication with the antenna, an oscillator assembly configured to provide a clock signal for use by the first die, where the oscillator assembly is supported by the substrate and disposed between the first die and the substrate, and a stacked filter assembly supported by the substrate, where the stacked filter assembly includes a plurality of passive components, where at least one passive component is in direct communication with the substrate and at least another passive component spaced from the substrate by the at least one passive component that is in the direct communication with the substrate.

In an embodiment, the radio frequency module further includes a second die, where the oscillator assembly and the stacked filter assembly are disposed on a first side of the substrate, and the second die is disposed on a second side of the substrate opposite of the first side. In another embodiment, the second die includes at least a portion of a baseband system. In a further embodiment, the plurality of passive components includes surface mount passive components.

In certain embodiments, the disclosure relates to a packaged module for use in a wireless communication device that comprises a first die supported by a substrate and includes at least a microprocessor and one or more of radio frequency transmitter circuitry and radio frequency receiver circuitry and a oscillator assembly supported by the substrate. The first die is disposed between the oscillator assembly and the substrate. The packaged module further comprises a second die supported by the substrate and implementing at least a portion of a radio frequency front end including a radio frequency power amplifier. The substrate is disposed between the first die and the second die. In some embodiments, the packaged module further comprises an overmold enclosing the first die and the oscillator assembly. A wireless communication device can include the packaged module. A system board assembly can include the packaged module.

In certain embodiments, the disclosure relates to a packaged radio frequency module that comprises a radio frequency shielding structure extending above a package substrate and a first die supported by the package substrate and in an interior of the radio frequency shielding structure. The first die includes a radio frequency component. The radio frequency module further comprises an antenna supported by the package substrate external to the radio frequency shielding structure and an oscillator assembly supported by the package substrate. The first die is disposed between the oscillator assembly and the package substrate. In some embodiments, the packaged radio frequency module further comprises an overmold enclosing the first die, the oscillator assembly, and the antenna. A wireless communication device can include the packaged radio frequency module. A system board assembly can include the packaged radio frequency.

In certain embodiments, the present disclosure relates to a packaged radio frequency module that comprises a frequency shielding structure extending above a package substrate, and a first die supported by the package substrate and in an interior of the radio frequency shielding structure, where the first die includes a radio frequency component. The packaged radio frequency module further comprises an antenna supported by the package substrate external to the radio frequency shielding structure and an oscillator assembly supported by the package substrate, where the oscillator assembly is disposed between the first die and the package substrate. In some embodiments, packaged radio further comprises an overmold enclosing the first die, the oscillator assembly, and the antenna. A wireless communication device can include the packaged radio frequency module. A system board assembly can include the packaged radio frequency module.

In certain embodiments, the present disclosure relates to a packaged radio frequency module for use in a wireless communication device that comprises a radio frequency shielding structure extending above a package substrate, a first integrated circuit die supported by the package substrate and in an interior of the radio frequency shielding structure, an antenna supported by the package substrate external to the radio frequency shielding structure, and a second integrated circuit die supported by the package substrate. The package substrate is disposed between the first integrated circuit die and the second integrated circuit die. In some embodiments, the first integrated circuit die implements at least a portion of a radio frequency front end including a radio frequency power amplifier and the second integrated circuit die implements at least a portion of a radio frequency baseband subsystem. In some embodiments, the packaged radio frequency further comprises an overmold enclosing the first integrated circuit die and the antenna. A wireless communication device can include the packaged radio frequency module. A system board assembly can include the packaged radio frequency module.

In certain embodiments, the present disclosure relates to a packaged radio frequency module for use in a wireless communication device that comprises a radio frequency shielding structure extending above a package substrate, a first wireless device component supported by the package substrate and in an interior of the radio frequency shielding structure, an antenna supported by the package substrate external to the radio frequency shielding structure, and a second wireless device component supported by and spaced from the package substrate. The first wireless device component is between the second wireless device component and a first surface of the package substrate. At least a first overhanging portion of the second wireless device component extends beyond at least a portion of the periphery of the first wireless device component. In some embodiments, the first wireless device component includes a radio frequency component. In some embodiments, the packaged radio frequency module further comprises an overmold enclosing the first wireless device component, the antenna, and the second wireless device component. A wireless communication device can include the packaged radio frequency module. A system board assembly can include the packaged radio frequency module.

In certain embodiments, the present disclosure relates to a packaged radio frequency module for use in a wireless communication device that comprises a multi-layer substrate having a first side and a second side opposite to the first side. The multi-layer substrate includes a ground plane. The packaged radio frequency module further comprises an antenna on the first side of the multi-layer substrate, and a first die supported by the multi-layer substrate and includes at least a radio frequency component. The first die is disposed on the second side of the multi-layer substrate such that the ground plane is positioned between the antenna and the radio frequency component. The packaged radio frequency module further comprises an oscillator assembly supported by the multi-layer substrate and disposed on the second side of the multi-layer substrate such that the first die is positioned between the oscillator assembly and the second side of the multi-layer substrate, and conductive features disposed around the radio frequency component and electrically connected to the ground plane. In some embodiments, the packaged radio frequency module further comprises an overmold enclosing the first die, the oscillator assembly, and a microprocessor. In some embodiments, the conductive features and the ground plane are configured to provide shielding for the radio frequency component. The wireless communication device can include the packaged radio frequency module. A system board assembly can include the packaged radio frequency module.

In certain embodiments, the present disclosure relates to a radio frequency module comprising a multi-layer substrate having a first side and a second side opposite to the first side, where the multi-layer substrate includes a ground plane, an antenna on the first side of the multi-layer substrate, a first die supported by the multi-layer substrate and including at least radio frequency receiver circuitry disposed on the second side of the multi-layer substrate such that the ground plane is positioned between the antenna and the radio frequency receiver circuitry, conductive features disposed around the radio frequency receiver circuitry and electrically connected to the ground plane, and a stacked filter assembly is supported by the multi-layer substrate and configured as a filter circuit that is in communication with the radio frequency receiver circuitry, where the stacked filter assembly is disposed on the second side of the multi-layer substrate. In some embodiments, the first die further includes a microprocessor. In some embodiments, the conductive features and the ground plane are configured to provide shielding for the radio frequency receiver circuitry. In some embodiments, the stacked filter assembly includes a plurality of passive components. In some embodiments, each passive component of the plurality of passive components is packaged as a surface mount device. In some embodiments, at least one passive component is in direct communication with the second side of the multi-layer substrate and at least another passive component supported above the second side of the multi-layer substrate by the at least one passive component that is in the direct communication with the second side of the multi-layer substrate. In some embodiments, the radio frequency module further comprises an overmold enclosing the first die and the stacked filter assembly. A wireless communication device can include the radio frequency module. A system board assembly can include the radio frequency module.

In certain embodiments, the present disclosure relates to a radio frequency module that comprises a multi-layer substrate having a first side and a second side opposite to the first side, where the multi-layer substrate including a ground plane, an antenna on the first side of the multi-layer substrate, a first integrated circuit die supported by the multi-layer substrate and implementing a radio frequency power amplifier, where the first integrated circuit die is disposed on the second side of the multi-layer substrate such that the ground plane is positioned between the antenna and the radio frequency power amplifier, and conductive features disposed around at least the radio frequency power amplifier and electrically connected to the ground plane, where a second integrated circuit die supported by the multi-layer substrate is disposed on the first side of the multi-layer substrate. In some embodiments, at least a portion of a radio frequency front end includes the radio frequency power amplifier. In some embodiments, the conductive features and the ground plane are configured to provide shielding for the radio frequency power amplifier. In some embodiments, the second integrated circuit die implements at least a portion of a radio frequency baseband subsystem. In some embodiments, the radio frequency module further comprises an overmold enclosing the second integrated circuit die and the antenna. The wireless communication device can include the radio frequency module. A system board assembly can include the radio frequency module.

In certain embodiments, the present disclosure relates to a packaged module for use in a wireless communication device that comprises a first die supported by a substrate, and an oscillator assembly configured to provide a clock signal for use in the first die, where the oscillator assembly is supported by the substrate and disposed between the first die and the substrate, where the oscillator assembly includes a crystal, a conductive pillar, and an enclosure configured to enclose the crystal, the conductive pillar formed at least partially within a side of the enclosure and extending from a top surface to a bottom surface of the enclosure. In some embodiments, the first die includes at least a microprocessor and one or more of radio frequency transmitter circuitry and radio frequency receiver circuitry. In some embodiments, the clock signal is provided for use in the at least one of the microprocessor and the one or more of the radio frequency transmitter circuitry and the radio frequency receiver circuitry. In some embodiments, the oscillator assembly further includes an input terminal configured to receive a first signal and an output terminal configured to output the clock signal, where the conductive pillar is configured to conduct a third signal distinct from the first signal and the clock signal. In some embodiments, the packaged module further comprises an overmold enclosing the first die and the oscillator assembly. The wireless communication device can include the packaged module. A system board assembly can include the packaged module.

In certain embodiments, the present disclosure relates to a packaged module for use in a wireless communication device that comprises a first die supported by a substrate, and a oscillator assembly configured to provide a clock signal for use in the first die, where the oscillator assembly is supported by the substrate, where the first die is disposed between the oscillator assembly and the substrate, where the oscillator assembly includes a crystal, a conductive pillar, and an enclosure configured to enclose the crystal, and where the conductive pillar is formed at least partially within a side of the enclosure and extending from a top surface to a bottom surface of the enclosure. In some embodiments, the first die includes at least a microprocessor and one or more of radio frequency transmitter circuitry and radio frequency receiver circuitry. In some embodiments, the clock signal is provided for use in the at least one of the microprocessor and the one or more of the radio frequency transmitter circuitry and the radio frequency receiver circuitry. In some embodiments, the oscillator assembly further includes an input terminal configured to receive a first signal and an output terminal configured to output the clock signal, where the conductive pillar is configured to conduct a third signal distinct from the first signal and the clock signal. In some embodiments, the packaged module further comprises an overmold enclosing the first die and the oscillator assembly. The wireless communication device can include the packaged module. A system board assembly can include the packaged module.

In certain embodiments, the present disclosure relates to a packaged module for use in a wireless communication device that comprises a first die supported by a substrate, an oscillator assembly configured to provide a clock signal for use the first die, where the oscillator assembly is supported by the substrate and disposed between the first die and the substrate, where the oscillator assembly includes a crystal, a conductive pillar, and an enclosure configured to enclose the crystal, where the conductive pillar is formed at least partially within a side of the enclosure and extending from a top surface to a bottom surface of the enclosure, and a stacked filter assembly supported by the substrate. The stacked filter assembly includes a plurality of passive components, where at least one passive component is in direct communication with the substrate and at least another passive component supported above the substrate by the at least one passive component that is in the direct communication with the substrate. In some embodiments, the first die includes at least one of the microprocessor and the radio frequency receiver circuitry. In some embodiments, the clock signal is provided for use in the at least one of the microprocessor and the radio frequency receiver circuitry. In some embodiments, the stacked filter assembly is configured as a filter circuit that is in communication with the radio frequency receiver circuitry. In some embodiments, the oscillator assembly further includes an input terminal configured to receive a first signal and an output terminal configured to output the clock signal, where the conductive pillar is configured to conduct a third signal distinct from the first signal and the clock signal. In some embodiments, each passive component of the plurality of passive components is packaged as a surface mount device. In some embodiments, the packaged module further comprises an overmold enclosing the first die, the oscillator assembly, and the stacked filter assembly. The wireless communication device can include the packaged module. A system board assembly can include the packaged module.

In certain embodiments, the present disclosure relates to a packaged module for use in a wireless communication device that comprises a first integrated circuit die supported by a substrate, where an oscillator assembly configured to provide a clock signal to the first integrated circuit die, where the oscillator assembly is supported by the substrate and disposed between the first integrated circuit die and the substrate, where the oscillator assembly includes a crystal, a conductive pillar, and an enclosure configured to enclose the crystal, where the conductive pillar is formed at least partially within a side of the enclosure and extending from a top surface to a bottom surface of the enclosure, and a second integrated circuit die supported by the substrate, where the substrate is disposed between the first integrated circuit die and the second integrated circuit die. In some embodiments, the first integrated circuit die implements at least a portion of a radio frequency baseband subsystem. In some embodiments, the clock signal is provided for the at least a portion of the radio frequency baseband subsystem. In some embodiments, the oscillator assembly further includes an input terminal configured to receive a first signal and an output terminal configured to output the clock signal, where the conductive pillar configured to conduct a third signal distinct from the first signal and the clock signal. In some embodiments, the second integrated circuit die implements at least a portion of a radio frequency front end including a radio frequency power amplifier. In some embodiments, the packaged module further comprises an overmold enclosing the first integrated circuit die and the oscillator assembly. The wireless communication device can include the packaged module. A system board assembly can include the packaged module.

In certain embodiments, the present disclosure relates to a packaged module for use in a wireless communication device that comprises a first wireless device component supported by a substrate, a second wireless device component supported by and spaced from the substrate, where the first wireless device component is between the second wireless device component and the substrate, where at least a first overhanging portion of the second wireless device component extends beyond at least a portion of the periphery of the first wireless device component, and an oscillator assembly supported by the substrate and disposed between the at least the first overhanging portion of the second wireless device component and the substrate. The oscillator assembly includes a crystal, a conductive pillar, and an enclosure configured to enclose the crystal, where the conductive pillar is formed at least partially within a side of the enclosure and extending from a top surface to a bottom surface of the enclosure. In some embodiments, the oscillator assembly further includes an input terminal configured to receive a first signal and an output terminal configured to output a second signal, where the conductive pillar is configured to conduct a third signal distinct from the first and second signals. In some embodiments, the packaged assembly further comprises an overmold enclosing the first wireless device component, the second wireless device component, and the oscillator assembly. The wireless communication device can include the packaged module. A system board assembly can include the packaged module.

In certain embodiments, the present disclosure relates to a packaged module for use in a wireless communication device that comprises a first die supported by a substrate, a stacked filter assembly supported by the substrate, where the stacked filter assembly includes a plurality of passive components, where at least one passive component is in direct communication with the substrate and at least another passive component supported above the substrate by the at least one passive component that is in the direct communication with the substrate, and a oscillator assembly supported by the substrate, where the first die is disposed between the oscillator assembly and the substrate. In some embodiments, the first die includes at least a microprocessor and radio frequency receiver circuitry. In some embodiments, the stacked filter assembly is configured as a filter circuit that is in communication with the radio frequency receiver circuitry. In some embodiments, each passive component of the plurality of passive components is packaged as a surface mount device. In some embodiments, the packaged module further comprises an overmold enclosing the first die, the stacked filter assembly, and the oscillator assembly. The wireless communication device can include the packaged module. A system board assembly can include the packaged module.

In certain embodiments, the present disclosure relates to a packaged module for use in a wireless communication device that comprises a first die supported by a substrate, a stacked filter assembly supported by the substrate and including a plurality of passive components, where at least one passive component is in direct communication with the substrate and at least another passive component supported above the substrate by the at least one passive component that is in the direct communication with the substrate, and a oscillator assembly supported by the substrate and disposed between the first die and the substrate. In some embodiments, the first die includes at least a microprocessor and radio frequency receiver circuitry. In some embodiments, the stacked filter assembly is configured as a filter circuit that is in communication with the radio frequency receiver circuitry. In some embodiments, each passive component of the plurality of passive components is packaged as a surface mount device. In some embodiments, the packaged module further comprises an overmold enclosing the first die, the stacked filter assembly, and the oscillator assembly. The wireless communication device can include the packaged module. A system board assembly can include the packaged module.

In certain embodiments, the present disclosure relates to a packaged module for use in a wireless communication device that comprises a first die supported by a substrate, a stacked filter assembly supported by the substrate, where the stacked filter assembly includes a plurality of passive components, where at least one passive component is in direct communication with the substrate and at least another passive component is supported above the substrate by the at least one passive component that is in the direct communication with the substrate, and a second die supported by the substrate, where the substrate disposed between the first die and the second die. In some embodiments, the first die includes at least a microprocessor and radio frequency receiver circuitry. In some embodiments, the stacked filter assembly is configured as a filter circuit that is in communication with the radio frequency receiver circuitry. In some embodiments, the second die implements at least a portion of a radio frequency front end including a radio frequency power amplifier. In some embodiments, each passive component of the plurality of passive components is packaged as a surface mount device. In some embodiments, the packaged module further comprises an overmold enclosing the first die and the stacked filter assembly. The wireless communication device can include the packaged module. A system board assembly can include the packaged module.

In certain embodiments, the present disclosure relates to a packaged module for a radio frequency wireless device that comprises a first wireless device component supported by a substrate and includes at least a microprocessor and radio frequency receiver circuitry, a second wireless device component supported by and spaced from the substrate, where the first wireless device component is between the second wireless device component and the substrate, where at least a first overhanging portion of the second wireless device component extending beyond at least a portion of the periphery of the first wireless device component, and a stacked filter assembly supported by the substrate and configured as a filter circuit that is in communication with the radio frequency receiver circuitry. The stacked filter assembly includes a plurality of passive components, where at least one passive component is in direct communication with the substrate, where the stacked filter assembly is disposed between the at least a first overhanging portion and the substrate. In some embodiments, each passive component of the plurality of passive components is packaged as a surface mount device. In some embodiments, at least another passive component is supported above the substrate by the at least one passive component that is in the direct communication with the substrate. In some embodiments, the packaged module further comprises an overmold enclosing the first wireless device component, the second wireless device component, and the stacked filter assembly. The radio frequency wireless device can include the packaged module. A system board assembly can include the packaged module.

In certain embodiments, the present disclosure relates to a packaged module for use in a wireless communication device that comprises a first die supported by a substrate and includes at least one of a microprocessor, radio frequency transmitter circuitry, and radio frequency receiver circuitry, a oscillator assembly configured to provide a timing signal for use in the first die, where the oscillator assembly is supported by the substrate and is disposed between the first die and the substrate, and a second die supported by the substrate and implementing at least a portion of a radio frequency front end including a radio frequency power amplifier. The substrate is disposed between the first die and the second die. In some embodiments, the packaged module further comprises an overmold enclosing the first die and the oscillator assembly. The wireless communication device can include the packaged module. A system board assembly can include the packaged module.

In certain embodiments, the present disclosure relates to a packaged module for use in a radio frequency wireless device that comprises a first wireless device component supported by a substrate, a second wireless device component supported by and spaced from the substrate and implementing at least a portion of a radio frequency baseband subsystem, where the first wireless device component is positioned between the second wireless device component and the substrate, where at least a first overhanging portion of the second wireless device component extending beyond at least a portion of the periphery of the first wireless device component, and a third wireless device component supported by the substrate and implementing at least a portion of a radio frequency front end including a radio frequency power amplifier. The substrate is disposed between the second wireless device component and the third wireless device component. In some embodiments, the packaged module further comprises an overmold enclosing the first wireless device component and the second wireless device component. The radio frequency wireless device can include the packaged module. A system board assembly can include the packaged module.

In certain embodiments, the present disclosure relates to a packaged module for use in a wireless communication device that comprises a first wireless device component supported by a substrate, a second wireless device component supported by and spaced from the substrate, where the first wireless device component is between the second wireless device component and the substrate, where at least a first overhanging portion of the second wireless device component extends beyond at least a portion of the periphery of the first wireless device component, and a oscillator assembly supported by the substrate. The first wireless device component and the second wireless device component are disposed between the oscillator assembly and the substrate. In some embodiments, the packaged module further comprises an overmold enclosing the first wireless device component, the second wireless device component, and the oscillator assembly. The wireless communication device can include the packaged module. A system board assembly can include the packaged module.

In certain embodiments, the present disclosure relates to a packaged module for use in a wireless communication device that comprises a first wireless device component supported by a substrate, a second wireless device component supported by and spaced from the substrate, where the first wireless device component is positioned between the second wireless device component and the substrate, where at least a first overhanging portion of the second wireless device component extending beyond at least a portion of the periphery of the first wireless device component, and a oscillator assembly supported by the substrate. The oscillator assembly is disposed within the at least the first overhanging portion of the second wireless device component and between the second wireless device component and the substrate. In some embodiments, the packaged module further comprises an overmold enclosing the first wireless device component, the second wireless device component, and the oscillator assembly. The wireless communication device can include the packaged module. A system board assembly can include the packaged module.

In certain embodiments, the present disclosure relates to a packaged radio frequency module for use in a wireless communication device that comprises a radio frequency shielding structure extending above a package substrate, a first die supported by the package substrate and in an interior of the radio frequency shielding structure, where the first die including a radio frequency component, an antenna supported by the package substrate external to the radio frequency shielding structure, and a oscillator assembly supported by the package substrate and disposed between the first die and the package substrate. The oscillator assembly includes a crystal, a conductive pillar, and an enclosure configured to enclose the crystal, where the conductive pillar is formed at least partially within a side of the enclosure and extending from a top surface to a bottom surface of the enclosure. In some embodiments, the packaged radio frequency module further comprises an overmold enclosing the first die, the oscillator assembly, and the antenna. In some embodiments, the oscillator assembly further includes an input terminal configured to receive a first signal, an output terminal configured to output a second signal, and the conductive pillar is configured to conduct a third signal distinct from the first and second signals. The wireless communication device can include the packaged radio frequency module. A system board assembly can include the packaged radio frequency module.

In certain embodiments, the present disclosure relates to a packaged radio frequency module for use in a wireless communication device that comprises a radio frequency shielding structure extending above a package substrate, a first die supported by the package substrate and in an interior of the radio frequency shielding structure, where the first die includes radio frequency receiver circuitry, an antenna supported by the package substrate external to the radio frequency shielding structure, and a stacked filter assembly supported by the package substrate and configured as a filter circuit that is in communication with the radio frequency receiver circuitry. The stacked filter assembly includes a plurality of passive components, where at least one passive component is in direct communication with the package substrate and at least another passive component is supported above the package substrate by the at least one passive component that is in the direct communication with the package substrate. In some embodiments, each passive component of the plurality of passive components is packaged as a surface mount device. In some embodiments, the packaged radio frequency module further comprises an overmold enclosing the first die, the stacked filter assembly, and the antenna. The wireless communication device can include the packaged radio frequency module. A system board assembly can include the packaged radio frequency module.

In certain embodiments, the present disclosure relates to a packaged radio frequency module for use in a wireless communication device that comprises a multi-layer substrate having a first side and a second side opposite to the first side, where the multi-layer substrate includes a ground plane, an antenna on the first side of the multi-layer substrate, a first die supported by the multi-layer substrate and including at least a radio frequency component, where the first die is disposed on the second side of the multi-layer substrate such that the ground plane is positioned between the antenna and the radio frequency component, a oscillator assembly supported by the multi-layer substrate and disposed on the second side of the multi-layer substrate such that the oscillator assembly is positioned between the first die and the second side of the multi-layer substrate, and conductive features disposed around the radio frequency component and electrically connected to the ground plane. In some embodiments, the first die further includes a microprocessor. In some embodiments, the conductive features and the ground plane are configured to provide shielding for the radio frequency component. In some embodiments, the packaged radio frequency module further comprises an overmold enclosing the first die and the oscillator assembly. The wireless communication device can include the packaged radio frequency module. A system board assembly can include the packaged radio frequency module.

In certain embodiments, the present disclosure relates to a radio frequency module that comprises a multi-layer substrate having a first side and a second side opposite to the first side, where the multi-layer substrate includes a ground plane, an antenna on the first side of the multi-layer substrate, a first die supported by the multi-layer substrate and including at least a radio frequency component disposed on the second side of the multi-layer substrate such that the ground plane is positioned between the antenna and the radio frequency component, conductive features disposed around the radio frequency component and electrically connected to the ground plane, and a oscillator assembly supported by the multi-layer substrate and disposed on the second side of the multi-layer substrate such that the oscillator assembly is positioned between the first die and the second side of the multi-layer substrate. The oscillator assembly includes a crystal, a conductive pillar, and an enclosure configured to enclose the crystal, where the conductive pillar is formed at least partially within a side of the enclosure and extending from a top surface to a bottom surface of the enclosure. In some embodiments, the conductive features and the ground plane are configured to provide shielding for the radio frequency component. In some embodiments, the oscillator assembly further includes an input terminal configured to receive a first signal, and an output terminal configured to output a second signal, where the conductive pillar is configured to conduct a third signal distinct from the first and second signals. In some embodiments, the packaged radio frequency module further comprises an overmold enclosing the first die and the oscillator assembly. A wireless communication device can include the radio frequency module. A system board assembly can include the radio frequency module.

In certain embodiments, the present disclosure relates to a radio frequency module that comprises a multi-layer substrate having a first side and a second side opposite to the first side, where the multi-layer substrate includes a ground plane, an antenna on the first side of the multi-layer substrate, a radio frequency component disposed on the second side of the multi-layer substrate such that the ground plane is positioned between the antenna and the radio frequency component, a first wireless device component supported by and spaced from the second side of the multi-layer substrate, where the radio frequency component is positioned between the first wireless device component and the second side of the multi-layer substrate, where at least a first overhanging portion of the first wireless device component extends beyond at least a portion of the periphery of the radio frequency component, and conductive features disposed around the radio frequency component and electrically connected to the ground plane. In some embodiments, the conductive features and the ground plane are configured to provide shielding for the radio frequency component. In some embodiments, the radio frequency module further comprises an overmold enclosing the radio frequency component and the first wireless device component. A wireless communication device can include the radio frequency module. A system board assembly can include the radio frequency module.

BRIEF DESCRIPTION OF THE DRAWING

Throughout the drawings, reference numbers are re-used to indicate correspondence between referenced elements. The drawings are provided to illustrate embodiments of the inventive subject matter described herein and not to limit the scope thereof.

FIG. 6 is cross section of a packaged module that includes an oscillator assembly comprising a crystal, for example, a first integrated circuit vertically integrated with the oscillator assembly and extending beyond a periphery of the oscillator assembly, a radio frequency integrated circuit within a radio frequency shielding structure that is within an overhang formed by the first integrated circuit, and an antenna external to the radio frequency shielding structure, according to an embodiment.

FIG. 7 is cross section of a packaged module that includes an oscillator assembly comprising a crystal, for example, a first integrated circuit vertically integrated with the oscillator assembly, and a ground plane between an antenna and a radio frequency component, according to an embodiment.

FIG. 8 is a cross section of a packaged module that includes a stacked filter assembly and a ground plane between an antenna and a front end system, according to an embodiment.

FIG. 8A1 illustrates a first exemplary stacking configuration for surface mount devices, according to certain embodiments.

FIG. 8A2 illustrates an exemplary circuit diagram for the stacking configuration of FIG. 8A1, according to certain embodiments.

FIG. 8B1 illustrates a second exemplary stacking configuration for surface mount devices, according to certain embodiments.

FIG. 8B2 illustrates an exemplary circuit diagram for the stacking configuration of FIG. 8B1, according to certain embodiments.

FIG. 8C1 illustrates a third exemplary stacking configuration for surface mount devices, according to certain embodiments.

FIG. 8C2 illustrates a fourth exemplary stacking configuration for surface mount devices, according to certain embodiments.

FIG. 8C3 illustrates an exemplary circuit diagram for the stacking configuration of FIGS. 8C1 and 8C2, according to certain embodiments.

FIG. 8D1 illustrates a fifth exemplary stacking configuration for surface mount devices, according to certain embodiments.

FIG. 8D2 illustrates an exemplary circuit diagram for the stacking configuration of FIG. 8D1, according to certain embodiments.

FIG. 9 is a cross section of a packaged module that includes an oscillator assembly comprising a crystal, for example, a first integrated circuit vertically integrated with the oscillator assembly and ground plane between an antenna and a radio frequency component, according to an embodiment.

FIG. 10 is a cross section of a packaged module that includes an oscillator assembly having conductive pillars and an integrated circuit vertically integrated with the oscillator assembly, according to an embodiment.

FIG. 10A1 illustrates an exemplary crystal assembly with conductive pillars, according to certain embodiments.

FIG. 10A2 illustrates an exemplary crystal assembly with a conductive layer in communication with the conductive pillars on one or more sides, according to certain embodiments.

FIG. 10B1 illustrates a cross sectional view of an exemplary assembly including a crystal and a front end integrated circuit, according to certain embodiments.

FIG. 10B2 illustrates a cross sectional view of an exemplary assembly including a crystal and a surface acoustic wave (SAW) device, according to certain embodiments.

FIG. 10C illustrates a bottom view of an exemplary crystal assembly, according the certain embodiments.

FIG. 12 is a cross section of a packaged module that includes an oscillator assembly having conductive pillars and stacked filter assemblies, according to an embodiment.

FIG. 13 is a cross section of a packaged module that includes an oscillator assembly having conductive pillars and a first integrated circuit vertically integrated with the oscillator assembly on a first side of the substrate, and a radio frequency integrated circuit vertically integrated on a second side of the substrate, according to an embodiment.

FIG. 14 is a cross section of a packaged module that includes an oscillator assembly having conductive pillars, a first integrated circuit vertically integrated with the oscillator assembly, and a radio frequency front end system vertically integrated with the first integrated circuit, according to an embodiment.

FIG. 15 is a cross section of a packaged module that includes an integrated circuit, an oscillator assembly comprising a crystal, for example, vertically integrated with the integrated circuit, and a stacked filter assembly, according to an embodiment.

FIG. 16 is a cross section of a packaged module that includes an oscillator assembly, an integrated circuit vertically integrated with the oscillator assembly, and a stacked filter assembly, according to an embodiment.

FIG. 17 is a cross section of a packaged module that includes an oscillator assembly, a first integrated circuit vertically integrated with the oscillator assembly on a first side of the substrate, a radio frequency front end system vertically integrated on a second side of the substrate, and a stacked filter assembly, according to an embodiment.

FIG. 18 is a cross section of a packaged module that includes an oscillator assembly, a first integrated circuit vertically integrated with the oscillator assembly, a radio frequency front end system vertically integrated with the first integrated circuit, and a stacked filter assembly, according to an embodiment.

FIG. 19 is a cross section of a packaged module that includes an oscillator assembly, a first integrated circuit vertically integrated with the oscillator assembly on a first side of the substrate, and a radio frequency front end system vertically integrated on a second side of the substrate, according to an embodiment.

FIG. 29A is a schematic diagram of another example of a wireless communication device including a radio frequency module, according to an embodiment.

FIG. 29B illustrates a system board assembly with a radio frequency module and another component disposed on the system board, according to an embodiment.

FIG. 30 is an example block diagram illustrating a simplified wireless device including a system-in-a-package, according to certain embodiments.

DETAILED DESCRIPTION

Figure 1:
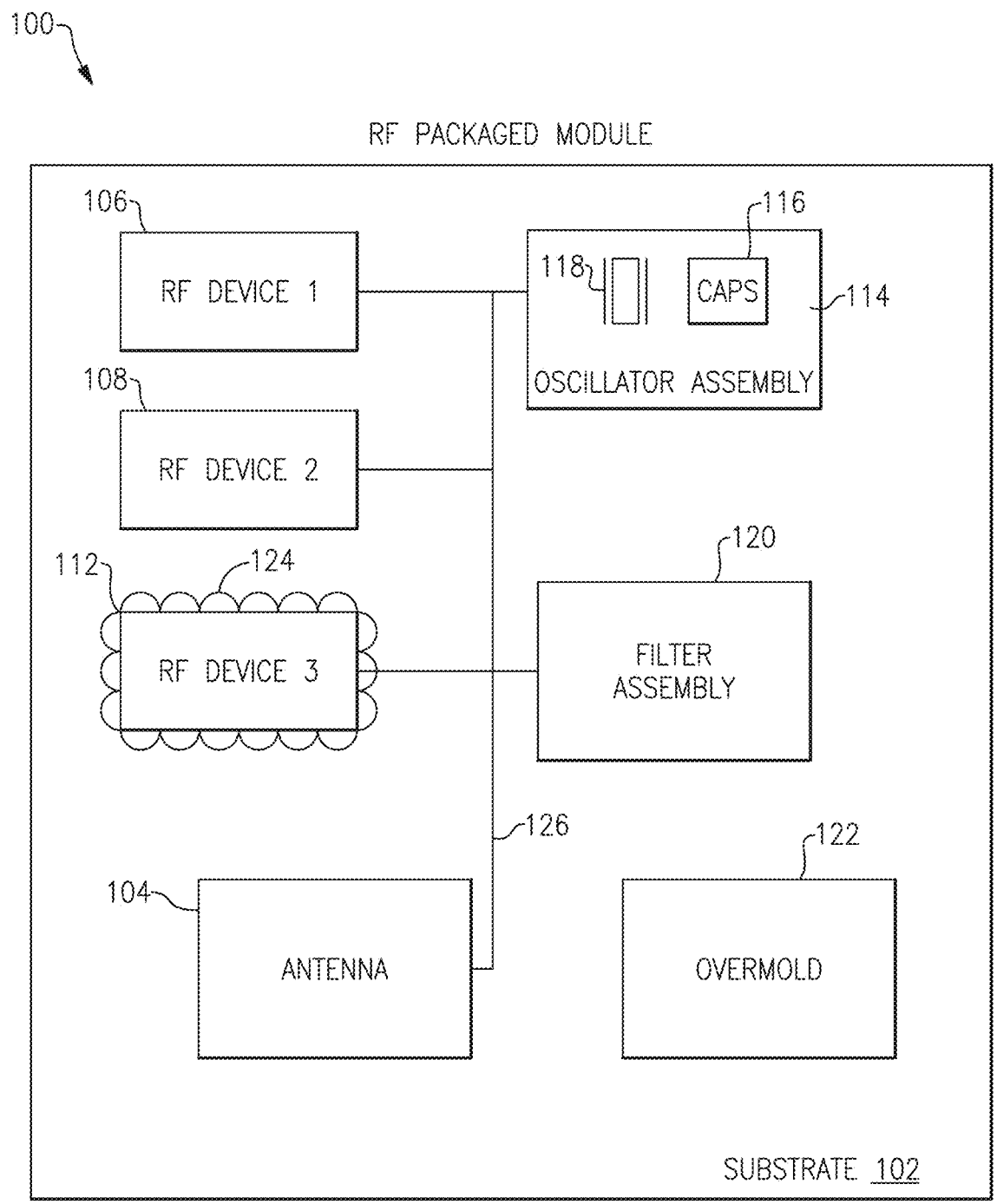
FIG. 1 illustrates a schematic block diagram of one example of a packaged radio frequency module.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A packaged radio frequency module can be used in a wireless device to provide space-saving implementation of radio frequency circuitry. In some embodiments, the packaged radio frequency module integrates radio frequency shielding and antennas to enhance the performance of the radio frequency circuitry.

Implementing one or more features described in the appendices submitted herewith in a packaged radio frequency module can achieve a number of advantages, including, but not limited to, more compact layout, lower cost, enhanced integration, reduced electromagnetic interference, reduced parasitic capacitance, and/or increased radio frequency shielding. Although some features are described herein in connection with packaging radio frequency systems and subsystems for wireless devices for illustrative purposes, it will be understood that the principles and advantages described herein can be applied to a wide variety of other electronics.

FIG. 1 illustrates a schematic block diagram of one example of a packaged radio frequency module 100 for use in a wireless device. The packaged radio frequency module 100 includes one or more of a substrate 102, an antenna 104, radio frequency devices 106, 108, 112, radio frequency shielding and or radio frequency isolation structures 124, a crystal 118 and associated components 116, which can be implemented as an oscillator assembly 114, a filter assembly 120, routing 126 representing signal paths, and an overmold 122 comprising molding material. The packaged radio frequency module 100 can incorporate one or more features described herewith.

The substrate 102 can be a single layer or a multi-layer laminate. The substrate 102 can include one or more ground planes. The substrate 102 can integrate the antenna 104. For example, a front end system for a wireless device can be implemented on the packaged radio frequency module 100 along with one or more integrated antennas 104. In an embodiment, a front end system can be implemented as an integrated circuit (IC) or semiconductor die, referred to as a front end integrated circuit (FEIC). In other embodiments, the front end system is implemented as a module, which is referred to as a front end module (FEM).

The packaged radio frequency module 100 is illustrated with three radio frequency devices 106, 108, and 112. In other embodiments, the packaged module 100 can include more or less than three radio frequency devices. Radio frequency devices 106, 108, 112 can comprise, for example, an radio frequency integrated circuit (RFIC), a radio frequency front end module (FEM), an amplifier, a portion of a base-band processing system, a processor, a system-on-a-chip (SoC), which integrate multiple functions in a single integrated circuit die, and the like. The integrated circuit die can be manufactured using any suitable process technology. As one example, the integrated circuit die can be a semiconductor-on-insulator die, such as a silicon-on-insulator (SOI) die.

The oscillator assembly 114 is used for clocking purposes and has the crystal 118 associated components 116, such as load capacitors. The oscillator assembly 114 can be placed discretely in the packaged radio frequency module or can be packaged within an enclosure. The oscillator assembly 114 illustrated in FIG. 1 comprises a crystal oscillator that includes the crystal 118. In other embodiments, the oscillator assembly 114 can be a harmonic oscillator comprising an RC oscillator including a network of resistors and capacitors, an LC oscillator including at least an inductor and a capacitor, a linear oscillator including a transistor or operational amplifier connected in a feedback loop, surface acoustic wave (SAW) oscillators including a SAW device, and the like.

Filter assembly 120 comprises, for example, surface mount capacitors and inductors configured to filter radio frequency signals to and/or from the radio frequency devices 106, 108, 112, and/or the antenna 104.

The routing 126 represents electrical communication between the various components of the packaged radio frequency module 100. The routing 126 can comprise traces on the substrate 102, conductive vias, conductive pillars, routing substrates, which provide electrical communication between components of the packaged radio frequency module 100 and input/output signal communication for the packaged radio frequency module 100 according to the circuit design.

The overmold 122 comprises a molding material or molding compound that is pliable and moldable in process and hardens when cured. The overmold 122 at least partially covers or houses one or more of the active and passive components 104, 106, 108, 112, 114, 116, 118, 120, 124 on the substrate 102. In an embodiment, the molding material provides the overmold 122 for the packaged radio frequency module 100.

In an embodiment, the packaged radio frequency module 100 comprises a system-in-a-package, which includes multiple ICs including SoCs and discrete components using vertical integration technologies of at least some of the components. Some packaged radio frequency modules can be multi-chip modules (MCMs).

In an embodiment, the packaged radio frequency module 100 comprises a packaged radio frequency device. Although one example of packaged radio frequency module is shown in FIG. 1, a packaged radio frequency module can be adapted in a wide variety of ways. For example, a packaged radio frequency module can include more, fewer, or different components and/or more, fewer or different signals paths. Accordingly, the teachings herein are applicable to packaged radio frequency modules implemented in a wide variety of ways.

In certain embodiments, the packaged radio frequency module 100 of FIG. 1 can include radio frequency shielding and/or radio frequency isolation structures 124. For example, the packaged radio frequency module 100 can be implemented with partial shielding. In one embodiment, a shielded layer is included over a first portion of the packaged radio frequency module and a second portion of the packaged radio frequency module is unshielded. The shielding layer can shield certain components, such as, the radio frequency devices 106, 108, 112, for example, and leave other components, such as, the antenna 104, for example, unshielded.

In certain embodiments, the packaged radio frequency module 100 of FIG. 1 can include a laminated substrate 102 including an antenna 104 that is printed on a top layer and a ground plane for shielding on a layer underneath the top layer. Additionally, at least one electronic component, such as radio frequency devices 106, 108, 112, and/or one or more surface mount components forming one or more filter assemblies 120, for example can be disposed along a bottom layer of the laminate substrate 102. Solder bumps are disposed around the electronic component and electrically connected to the ground plane. The solder bumps can attach the packaged radio frequency module to a carrier or directly to a system board. The electronic component can be surrounded by solder bumps, and the outside edges of the electronic component can have ground solder bumps that are connected to the ground plane by way of vias. Accordingly, a shielding structure with can be completed when the packaged radio frequency module is placed onto a carrier or system board, and the shielding structure can serve as a Faraday cage around the electronic component.

In certain embodiments, the packaged radio frequency module 100 of FIG. 1 can vertically stack an oscillator assembly 114 comprising the crystal 118 and discrete components 116 associated with the crystal 118, for example, over a system-on-a-chip 106, 108, and/or 112 on the substrate 102 with a front end system. By implementing such a packaged module, a smaller footprint and/or a more compact substrate area can be achieved. Other advantages include decreased crystal trace parasitic capacitance associated with the oscillator assembly 114.

In certain embodiments, the packaged radio frequency module 100 of FIG. 1 can vertically stack a system-on-a-chip 106, 108, and/or 112 over the oscillator assembly 114 including the crystal 118 and discrete components 116 associated with the crystal 118, for example, over the substrate 102 with a front end system. Since the system-on-a-chip tends to be larger than the oscillator assembly 114, additional discrete components or additional radio frequency integrated circuits can be located in the overhang created by the system-on-a-chip above the oscillator assembly 114. By implementing such a packaged module, a smaller footprint and/or a more compact substrate area can be achieved.

In certain embodiments, vertically stacked radio frequency module 100 of FIG. 1 can include radio frequency devices 106, 108, or 112 implementing at least a portion of a baseband subsystem above the substrate 102 and radio frequency devices 106, 108, 112 implementing at least a portion of a radio frequency front end system below the substrate.

In certain embodiments, the vertically stacked radio frequency devices 106, 108, 112 of different sized footprints can provide a space under a first larger device and beside a second smaller device. For manufacturing purposes, a spacer is placed in the space to support the first larger device on the substrate. Discrete components, such as resistors, capacitors, and inductors, can be placed in such spaces, but can leave gaps between the discrete component and the first larger device. Gap filling spacers are provided to reduce the occurrence of tilted or crooked assemblies. By implementing such a packaged module, manufacturing yields are increased.

In certain embodiments, the packaged module 100 of FIG. 1 includes the oscillator assembly 114 and a system-on-a-chip, such as a transceiver die. For example, the system-on-a-chip can be stacked over the oscillator assembly 114 to save space and provide shorter crystal traces. The oscillator assembly 114 may be a crystal oscillator housed in a housing that includes one or more conductive pillars for routing signals from the system-on-a-chip to a substrate and/or to provide thermal conductivity.

In certain embodiments, the packaged radio frequency module 100 of FIG. 1 includes at least a portion of a front end system, a filter assembly 120, and a system-on-a-chip. For example, the filter assembly 120 can be stacked with other dies and components of the packaged module to reduce a footprint of the packaged module. Furthermore, stacking the filter assembly 120 in this manner can reduce lengths of signal carrying conductors, thereby reducing parasitic capacitance and enhancing signaling performance.

Radio Frequency Modules

Figure 2:
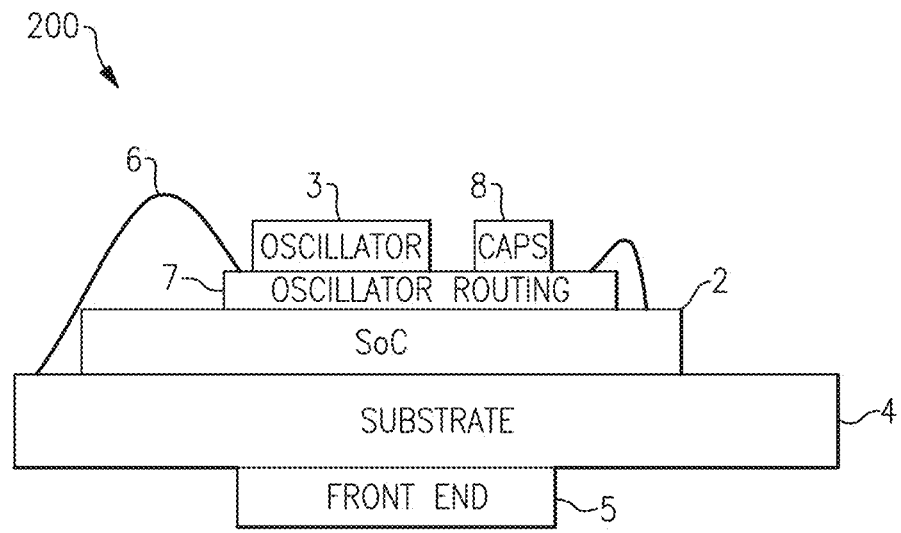
FIG. 2 is a cross section of a packaged module that includes an integrated circuit and an oscillator vertically integrated with the integrated circuit on a first side of the substrate and a second integrated circuit vertically integrated on a second side the substrate, according to an embodiment.

FIG. 2 comprises an embodiment of a radio frequency packaged module 200 that can be implemented in a wireless device. FIG. 2 illustrates a cross section of the packaged module 200 that includes an integrated circuit 2 and an oscillator assembly 3 vertically integrated with the integrated circuit 2 on a first side of a package substrate 4 and a second integrated circuit 5 vertically integrated with the first integrated circuit 2 and the oscillator assembly 3 on a second side the package substrate 4 according to an embodiment. The package substrate 4 supports the first integrated circuit 2 and the oscillator assembly 3 on the first side and supports the second integrated circuit 5 on the second side.

The first integrated circuit 2 is interposed between the package substrate 4 and the oscillator assembly 3.

As illustrated in FIG. 2, the packaged module 200 further includes a routing substrate or interposer 7, one or more load capacitors 8 and one or more wire bonds 6. In an embodiment, the first integrated circuit 2 is a system on a chip (SoC) and includes at least a portion of a baseband subsystem and the second integrated circuit 5 is a radio frequency front end system, such as an FEIC. FIG. 2 is not necessarily drawn to scale.

FIG. 2 shows the one or more load capacitors 8 as being external to the SoC 2. In other embodiments, the SoC 2 comprises the one or more load capacitors 8.

The SoC 2 can be epoxied to the substrate 4 and can be wire bonded to the substrate 4 in a manner as is known to one of skill in the art of semiconductor fabrication from the disclosure herein. The routing substrate 7 is stacked on top of the SoC 2. The oscillator assembly 3 and its load capacitors 8 can then be soldered on the top of the routing substrate 7.

The routing substrate 7 holds the oscillator assembly 3 and the capacitors 8 and routes signals to the oscillator assembly 3. In an embodiment, the routing substrate 7 comprises a single layer or a multi-layer laminate.

In an embodiment, the one or more ground bond wires 6 are in communication with a ground signal, such as a ground plane, a grounded via or the like, on the substrate 4 and the routing substrate 7, which in turn routes the ground signal to the oscillator assembly 3. In an embodiment, the one or more wire bonds 6 are in communication with devices, such as an oscillator assembly or the like, on the SoC 2 and the routing substrate 7, which in turn, routes the signals to the oscillator assembly 3.

Stacking the oscillator assembly 3 and the capacitors 8 permits the substrate 4 be smaller (have a smaller footprint) and provides the same or similar functionality. The advantage of stacking the oscillator assembly 3 and the capacitors 8 is not only space savings, but also the length of at least one trace between the oscillator assembly 3 and the SoC 2 has been greatly reduced. It is desirable to have as short a trace as possible between an oscillator and a SoC to reduce parasitic capacitance of the trace. By stacking the oscillator assembly 3 over the SoC 2, the trace is all but eliminated and the opportunity for parasitic capacitance to develop is greatly reduced. In an embodiment, the signals to/from the oscillator assembly 3 are routed from the SoC 2 directly to the routing substrate 7 via the one or more wire bonds 6. Another benefit of reducing the traces in communication with the oscillator assembly 3 is a reduced opportunity of coupling between the crystal path and other sensitive paths on the substrate 4, such as RF traces that are in communication with the radio frequency front end system 5, for example.

Figure 3:
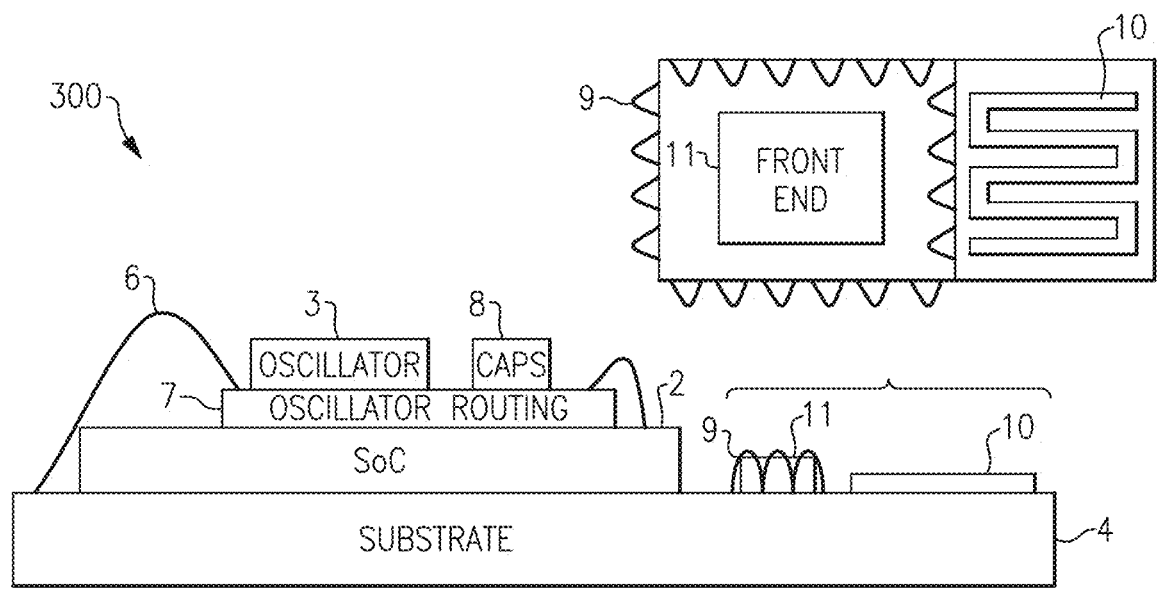
FIG. 3 is a cross section of a packaged module that includes a first integrated circuit, an oscillator assembly comprising a crystal, for example, vertically integrated with the first integrated circuit, and a radio frequency integrated circuit within a radio frequency shielding structure and an antenna external to the radio frequency shielding structure, according to an embodiment.

FIG. 3 comprises another embodiment of a radio frequency packaged module 300 that can be implemented in a wireless device. FIG. 3 illustrates a cross section of the packaged module 300 that includes a first integrated circuit 2, an oscillator assembly 3 vertically integrated with the first integrated circuit 2, and a radio frequency component 11 within a radio frequency shielding structure 9 and an antenna 10 external to the radio frequency shielding structure 9 according to an embodiment. The packaged module 300 includes a package substrate 4 that supports the first integrated circuit 2, the oscillator assembly 3, the radio frequency component 11, and the antenna 10. The first integrated circuit 2 is interposed between the oscillator assembly 3 and the package substrate 4. FIG. 3 is not necessarily drawn to scale.

As illustrated in FIG. 3, the packaged module 300 further includes a routing substrate or interposer 7, one or more load capacitors 8 and one or more wire bonds 6. In an embodiment, the first integrated circuit 2 is a system on a chip (SoC) and includes at least a portion of a baseband subsystem and the radio frequency component 11 is at least a portion of a radio frequency front end system, a radio frequency front end module (FEM), or front end integrated circuit (FEIC). The shielding structure 9 can include a shielding layer formed over the radio frequency component 11 such that the antenna 10 is unshielded opposite the common package substrate 4.

FIG. 3 shows the one or more load capacitors 8 as being external to the SoC 2. In other embodiments, the SoC 2 comprises the one or more load capacitors 8. As described above with respect to FIG. 2, the SoC 2 can be epoxied to the substrate 4 and can be wire bonded to the substrate 4 in a manner as is known to one of skill in the art of semiconductor fabrication from the disclosure herein. The routing substrate 7 is stacked on top of the SoC 2. The oscillator assembly 3 and its load capacitors 8 can then be soldered on the top of the routing substrate 7.

The routing substrate 7 holds the oscillator assembly 3 and the capacitors 8 and routes signals to the oscillator assembly 3. In an embodiment, the routing substrate 7 comprises a single layer or a multi-layer laminate.

In an embodiment, the one or more ground bond wires 6 are in communication with a ground signal, such as a ground plane, a grounded via or the like, on the substrate 4 and the routing substrate 7, which in turn routes the ground signal to the oscillator assembly 3. In an embodiment, the one or more wire bonds 6 are in communication with devices, such as an oscillator assembly or the like, on the SoC 2 and the routing substrate 7, which in turn, routes the signals to the oscillator assembly 3.

Stacking the oscillator assembly 3 and the capacitors 8 permits the substrate 4 be smaller (have a smaller footprint) and provides the same or similar functionality. Advantageously, stacking the oscillator assembly 3 and the capacitors 8 permits the substrate 4 to accommodate the radio frequency front end system 11. Another advantage of stacking the oscillator assembly 3 and the capacitors 8 is not only space savings, but also the length of at least one trace between the oscillator assembly 3 and the SoC 2 has been greatly reduced. It is desirable to have as short a trace as possible between an oscillator and a SoC to reduce parasitic capacitance of the trace. By stacking the oscillator assembly 3 over the SoC 2, the trace is all but eliminated and the opportunity for parasitic capacitance to develop is greatly reduced. In an embodiment, the signals to/from the oscillator assembly 3 are routed from the SoC 2 directly to the routing substrate 7 via the one or more wire bonds 6. Another benefit of reducing the traces in communication with the oscillator assembly 3 is a reduced opportunity of coupling between the crystal path and other sensitive paths on the substrate 4, such as RF traces that are in communication with the radio frequency component 11, for example.

FIG. 3 also illustrates the radio frequency component 11, shielding structure 9 and antenna 10 without a top shielding layer in plan view. The radio frequency shielding structure 9 can shield the radio frequency component 11 from electromagnetic interference from the integrated antenna 10 and/or from other components outside of the radio frequency shielding structure 9. Alternatively or additionally, the radio frequency shielding structure 9 can shield the antenna 10 and/or other components from electromagnetic interference from the radio frequency component 11. Accordingly, the antenna 10 can be integrated in the packaged module 300 and the radio frequency shielding structure 9 can reduce electromagnetic interference between components of the packaged module 300. The antenna 10 is outside of an RF shielding structure 9 around the RF component 11. Accordingly, the antenna 10 can wirelessly receive and/or transmit RF signals without being shielded by the shielding structure around the RF component 11. At the same time, the shielding structure 9 can provide RF isolation between the RF component 11 and the antenna 10 and the other electronic components of the radio frequency module 300.

The RF component 11 can include any suitable circuitry configured to receive, process, and/or provide an RF signal. For instance, the RF component 11 can include an RF front end, a crystal, a system on a chip, or any combination thereof. In certain implementations, the RF component 11 can include a power amplifier, a low-noise amplifier, an RF switch, a filter, a matching network, a crystal, or any combination thereof. An RF signal can have a frequency in the range from about 30 kHz to 300 GHz. In accordance with certain communications standards, an RF signal can be in a range from about 450 MHz to about 6 GHz, in a range from about 700 MHz to about 2.5 GHz, or in a range from about 2.4 GHz to about 2.5 GHz. In certain implementations, the RF component 11 can receive and/or provide signals in accordance with a wireless personal area network (WPAN) standard, such as Bluetooth, ZigBee, Z-Wave, Wireless USB, INSTEON, IrDA, or Body Area Network. In some other implementations, the RF component and receive and/or provide signals in accordance with a wireless local area network (WLAN) standard, such as Wi-Fi.

The antenna 10 can be any suitable antenna configured to receive and/or transmit RF signals. The antenna 10 can be a folded monopole antenna in certain applications. The antenna 10 can be any suitable shape. For instance, the antenna 10 can have a meandering shape as shown in FIG. 3. In other embodiments, the antenna can be U-shaped, coil shaped, or any other suitable shape for a particular application. The antenna 10 can transmit and/or receive RF signals associated with the RF component 11. The antenna 10 can occupy any suitable amount of area of the packaging substrate. For instance, the antenna 10 can occupy from about 10% to 75% of the area of the package substrate in certain implementations.

The antenna 10 can be printed on the packaging substrate. A printed antenna can be formed from one or more conductive traces on the packaging substrate. The one or more conductive traces can be formed by etching a metal pattern on the packaging substrate. A printed antenna can be a microstrip antenna. Printed antennas can be manufactured relatively inexpensively and compactly due to, for example, their 2-dimensional physical geometries. Printed antennas can have a relatively high mechanical durability.

The package substrate that includes the antenna 10 and the radio frequency component 11 can be a laminate substrate. The package substrate can include one or more routing layers, one or more insulating layers, a ground plane, or any combination thereof. In certain applications, the package substrate can include four layers. The RF component 11 can be electrically connected to the antenna 10 by way of metal routing in a routing layer of the packaging substrate 16 in certain applications.

The wire bonds are part of the RF shielding structure 9 around the RF component 11. An RF shielding structure can be any shielding structure configured to provide suitable shielding associated with RF signals. The wire bonds can provide RF isolation between the antenna 10 and the RF component 11 so as to prevent electromagnetic interference between these components from significantly impacting performance of the antenna 10 or the RF component 11. The wire bonds can surround the RF component 11 as illustrated. The wire bonds can be arranged around the RF component 11 in any suitable arrangement, which can be rectangular as illustrated or non-rectangular in some other implementations. In the radio frequency module 300 illustrated in FIG. 3, the wire bonds form four walls around the RF component 11. The wire bonds can be arranged such that adjacent wire bonds are spaced apart from each other by a distance to provide sufficient RF isolation between the RF component 11 and other electronic components.

Figure 3A:
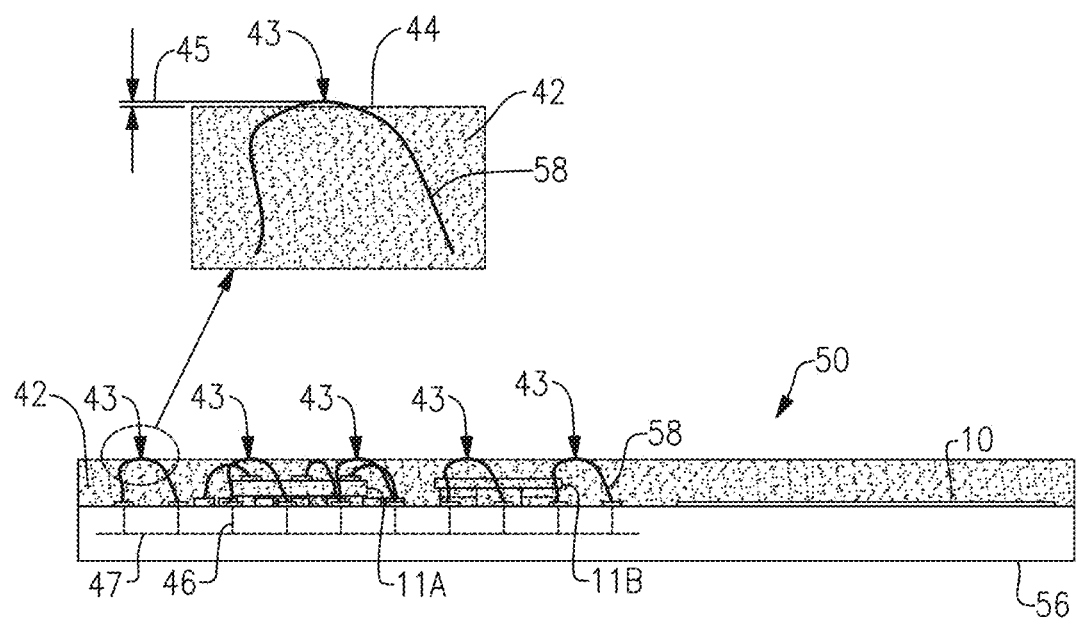
FIG. 3A is a cross sectional view of the radio frequency module of FIG. 3 prior to forming a shielding layer over the radio frequency component, according to an embodiment.

FIG. 3A is a cross sectional view of the portion of the radio frequency module 300 that comprises the radio frequency shielding structure 9, the radio frequency component 11 and the antenna 10 prior to forming a shielding layer over the radio frequency component 11 according to an embodiment. Molding material 42 can be disposed over the RF component 11, the wire bonds, and the antenna 10. In FIG. 3A, the RF component 11 includes two die 11A and 11B on a package substrate 46. Upper portions 43 of wire bonds 58 can extend above upper surface 44 of an overmold structure of the molding material 42 that is over the wire bonds 58. The wire bonds 58 can extend above the upper surface 44 to a top point 45 of the wire bonds 58. The upper portions 43 of the wire bonds 58 can be exposed by removing molding material after forming an overmold structure of the molding material 42. Having the upper portions 43 of the wire bonds 58 exposed as shown in FIG. 3A can allow a conductive layer over the molding material 42 to be in contact with the wire bonds 58 to thereby provide an electrical connection. FIG. 3A also illustrates vias 46 in the package substrate 56. The wire bonds 58 can be electrically connected to a ground plane 47 of the package substrate 56 by way of the vias 46. The wire bonds 58 can be electrically connected to a ground contact of a substrate 4 on which the module 50 is disposed by way of the vias 46.

Figure 3B:
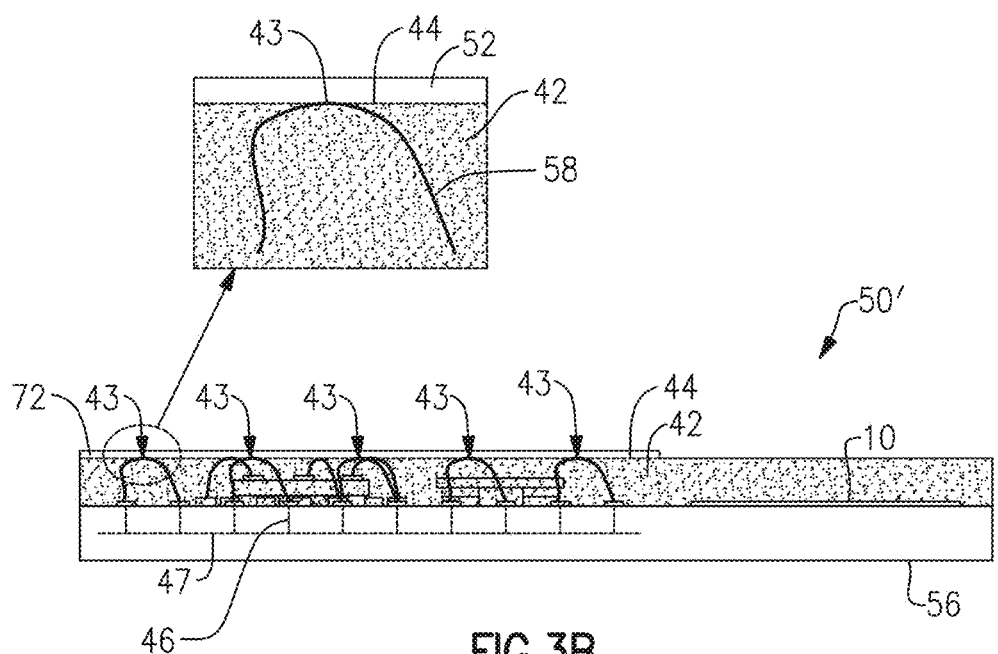
FIG. 3B is a cross sectional view of the radio frequency module of FIG. 3 with a shielding layer over the radio frequency component and not over the antenna, according to an embodiment.

FIG. 3B is a cross sectional view of the radio frequency module of FIG. 3A with a shielding layer over the radio frequency component and not over the antenna according to an embodiment. The RF module 50' illustrated in FIG. 3B includes a shielding layer 52 formed over the upper surface 44 of the overmold structure over the RF component 11. The shielding layer 52 is formed over a shielded portion of the RF module 50' and an unshielded portion of the RF module 50' is left unshielded opposite the package substrate 56. As illustrated, the antenna 10 is included in the unshielded portion of the RF module 50'. The shielding layer 52 is formed of electrically conductive material. As shown in FIG. 3B, the shielding layer 52 is in contact with wire bonds 88.

A shielding structure around the RF component 12 includes the shielding layer 32 and the wire bonds 18. The shielding structure can also include vias 26 in the package substrate 16, a ground plane 27 in the package substrate 16, ground pads and/or a ground plane of a system board on which the RF module 10 is disposed, or any combination thereof. RF The shielding structure can function as a Faraday cage around the RF component 12. The RF shielding structure can be configured at a ground potential. The RF shielding structure around the RF component 12 can shield the RF component 12 from signals external to the shielding structure and/or shield circuits outside of the shielding structure from the RF component 12. The antenna 14 is external to the shielding structure in FIG. 3.

A shielding layer, such as the shielding layer 52 of FIG. 3B, can be formed over a portion of an RF module and a different portion of the RF module can be unshielded opposite a package substrate. Prior to forming the shielding layer over an RF module in any of the methods of forming the shielding layer discussed herein, the RF module can have molding material over an antenna and wire bonds with exposed upper portions that extend beyond of surface of an overmold structure of the molding material (e.g., as shown in FIG. 3A. RF modules discussed herein can include a shielding layer formed by any of these methods as appropriate and/or by any suitable operations discussed with reference to any of these methods. The shielding layer can be formed over a selected portion of an RF module by an additive process or a subtractive process. The methods of forming shielding layers discussed herein can be implemented in high volume manufacturing. Such methods can be automated in an accurate and repeatable manner.

Figure 4:
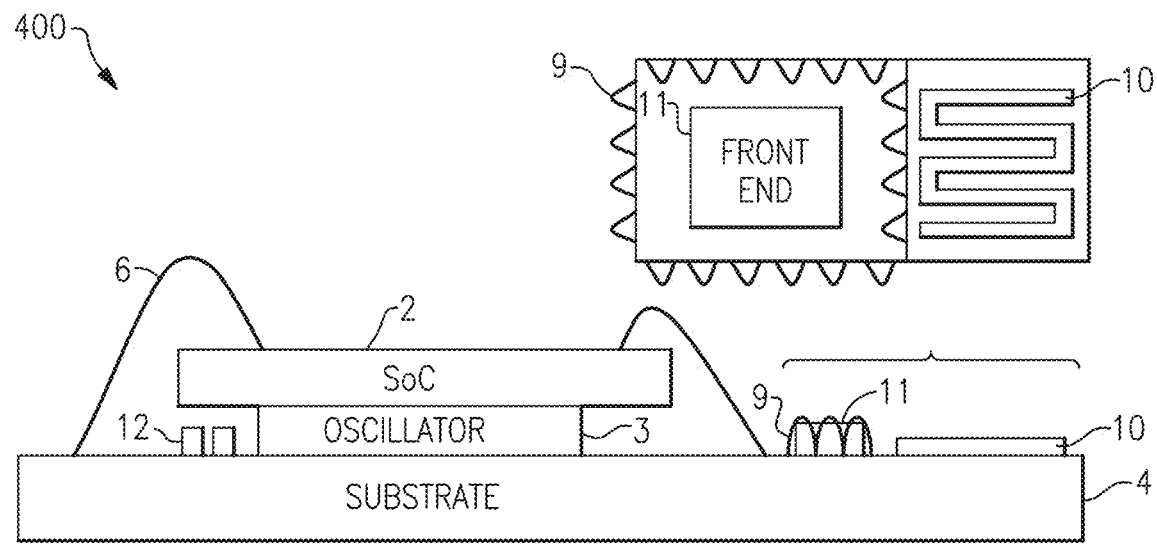
FIG. 4 is a cross section of a packaged module that includes an oscillator assembly comprising a crystal, for example, a first integrated circuit vertically integrated with the crystal, and a radio frequency integrated circuit within a radio frequency shielding structure and an antenna external to the radio frequency shielding structure, according to an embodiment.

FIG. 4 comprises another embodiment of a radio frequency packaged module 400 that can be implemented in a wireless device. FIG. 4 illustrates a cross section of the radio frequency packaged module 400 that can be used in a wireless device. Radio frequency packaged module 400 includes an oscillator assembly 3, a first integrated circuit 2 vertically integrated with the oscillator assembly 3, and a radio frequency component 11 within a radio frequency shielding structure 9 and an antenna external 10 to the radio frequency shielding structure 9 according to an embodiment. The packaged module 400 includes a package substrate 4 that supports the first integrated circuit 2, the oscillator assembly 3, the radio frequency component 11, and the antenna 10. The oscillator assembly 3 is interposed between the first integrated circuit 2 and the package substrate 4. FIG. 4 is not necessarily drawn to scale.

As illustrated in FIG. 4, the packaged module 400 further includes one or more discrete components 12, such as load capacitors, and one or more wire bonds 6. In an embodiment, the first integrated circuit 2 is a system on a chip (SoC) and includes at least a portion of a baseband subsystem and the radio frequency component 11 is a radio frequency front end module (FEM) or front end integrated circuit (FEIC). The oscillator assembly 3 can be used to provide a clock signal for one or more of the first integrated circuit 2 and the radio frequency component 11. The shielding structure 9 can include a shielding layer formed over the radio frequency component 11 such that the antenna 10 is unshielded opposite the common package substrate 4.

In the radio frequency packaged module 400, the oscillator assembly 3 is over the substrate 4 and the SoC is stacked directly over the oscillator assembly 3, without a routing substrate between the SoC 2 and the oscillator assembly 3. In an embodiment, the oscillator assembly 3 is immediately adjacent to the SoC 2 and the substrate 4. In an embodiment, the footprint of the SoC 2 is larger than the footprint of the oscillator assembly 3, which creates an overhang volume that is bounded by the sides of the oscillator assembly 3, the portion of the SoC 2 that extends beyond oscillator assembly 3, and the portion of the substrate 4 that is within the footprint of the SoC 2 and not covered by the oscillator assembly 3.

In an embodiment, the discrete components 12 and/or the front end system 11 are placed outside of the SoC footprint. In another embodiment, the discrete components 12 and/or the front end system 11 are placed between the SoC 2 and the oscillator assembly 3 within the SoC footprint. In another embodiment, the discrete components 12 and/or the front end system 11 are placed within the overhang volume.

There are several factors to consider when utilizing the overhang volume. Factors to consider include, but are not limited to the thickness of the SoC, bond wire types, an amount of pressure used to bond the bond wire to the SoC without cracking the SoC, an amount of overhang that can be supported, and the like.

FIG. 4 also illustrates the radio frequency component 11, shielding structure 9 and antenna 10 without a top shielding layer in plan view. The radio frequency shielding structure 9 can shield the radio frequency component 11 from electromagnetic interference from the integrated antenna 10 and/or from other components outside of the radio frequency shielding structure 9. Alternatively or additionally, the radio frequency shielding structure 9 can shield the antenna 10 and/or other components from electromagnetic interference from the radio frequency component 11. Accordingly, the antenna 10 can be integrated in the packaged module 400 and the radio frequency shielding structure 9 can reduce electromagnetic interference between components of the packaged module 400. The radio frequency component 11, shielding structure 9 and antenna 10 may be implemented as described above with respect to FIGS. 3, 3A, and 3B.

Figure 5:
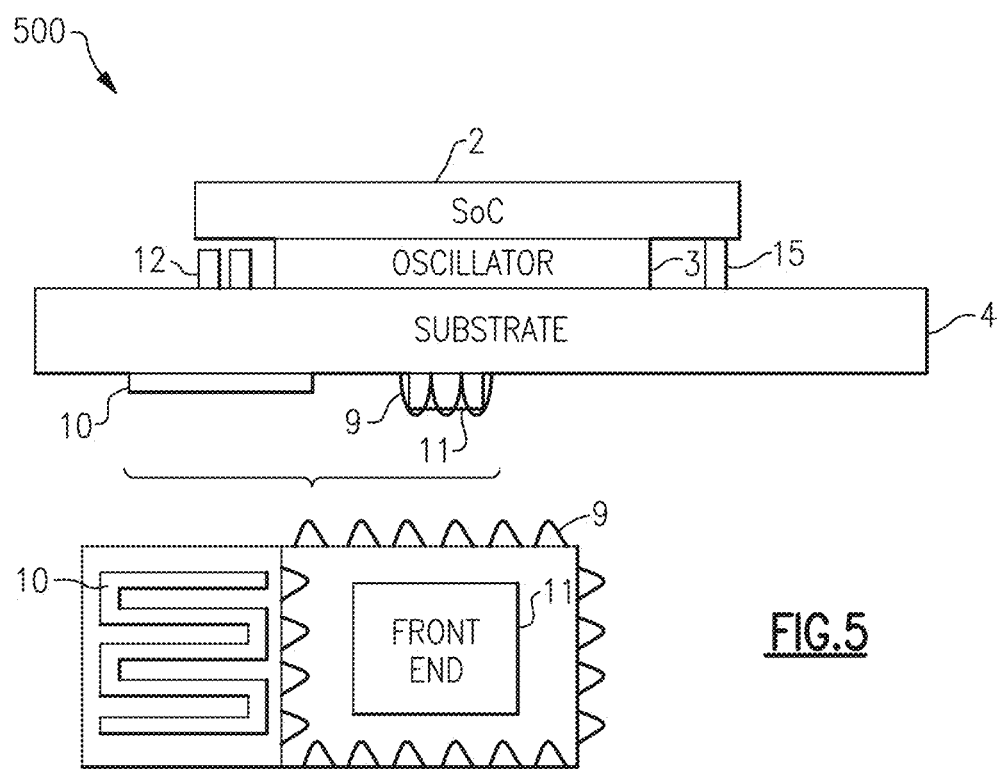
FIG. 5 is a cross section of a packaged module that includes a first integrated circuit, and an oscillator assembly comprising a crystal, for example, vertically integrated with the first integrated circuit on a first surface of the substrate and a radio frequency integrated circuit within a radio frequency shielding structure and an antenna external to the radio frequency shielding structure vertically integrated on a second surface of the substrate, according to an embodiment.

FIG. 5 comprises another embodiment of a radio frequency packaged module 500 that can be implemented in a wireless device. FIG. 5 illustrates a cross section of the packaged module 500 that includes a first integrated circuit 2, and an oscillator assembly 3 vertically integrated with the first integrated circuit 2 and a radio frequency component 11 within a radio frequency shielding structure 9 and an antenna 10 external to the radio frequency shielding structure 9 according to an embodiment. FIG. 5 is not necessarily drawn to scale. The package substrate 4 supports the first integrated circuit 2 and the oscillator assembly 3 on the first side and supports the radio frequency component 11 on the second side. The oscillator assembly 3 is interposed between the package substrate 4 and the first integrated circuit 2. The radio frequency component 11 within the radio frequency shielding structure 9 is vertically integrated with the first integrated circuit 2 and the oscillator assembly 3.

As illustrated in FIG. 5, the packaged module 500 further includes one or more discrete components 12, such as load capacitors, and one or more supports 15. In an embodiment, the first integrated circuit 2 is a system on a chip (SoC) and includes at least a portion of a baseband subsystem and the radio frequency component 11 is a radio frequency front end module (FEM) or front end integrated circuit (FEIC). The oscillator assembly 3 can be used to provide a clock signal to one or more of the first integrated circuit 2 and the radio frequency component 11. The shielding structure 9 can include a shielding layer formed over the radio frequency component 11 such that the antenna 10 is unshielded opposite the common package substrate 4.

In an embodiment, the footprint of the SoC 2 is larger than the footprint of the oscillator assembly 3, which creates an overhang volume that is bounded by the sides of the oscillator assembly 3, the portion of the SoC 2 that extends beyond oscillator assembly 3, and the portion of the substrate 4 that is within the footprint of the SoC 2 and not covered by the oscillator assembly 3. In an embodiment, the discrete components 12 are placed between the substrate 4 and the SoC 2 in the footprint of the SoC 2 to save space. In an embodiment, the discrete components 12 are placed in the overhang volume.

FIG. 5 also illustrates the radio frequency component 11, shielding structure 9 and antenna 10 without a top shielding layer in plan view. The radio frequency shielding structure 9 can shield the radio frequency component 11 from electromagnetic interference from the integrated antenna 10 and/or from other components outside of the radio frequency shielding structure 9. Alternatively or additionally, the radio frequency shielding structure 9 can shield the antenna 10 and/or other components from electromagnetic interference from the radio frequency component 11. Accordingly, the antenna 10 can be integrated in the packaged module 500 and the radio frequency shielding structure 9 can reduce electromagnetic interference between components of the packaged module 500. The radio frequency component 11, shielding structure 9 and antenna 10 may be implemented as described above with respect to FIGS. 3, 3A, and 3B.

FIG. 6 comprises another embodiment of a radio frequency packaged module 600 that can be implemented in a wireless device. FIG. 6 illustrates a cross section of the packaged module 600 that includes an oscillator assembly 3, a first integrated circuit 2 vertically integrated with the oscillator assembly 3 and extending beyond a periphery of the oscillator assembly 3, a second integrated circuit 14 vertically integrated with the oscillator assembly 3, a radio frequency component 11 within a radio frequency shielding structure 9 that is within an overhang formed by the first integrated circuit 2, and an antenna 10 external to the radio frequency shielding structure 9 according to an embodiment. FIG. 6 is not necessarily drawn to scale.

The package substrate 4 supports the first integrated circuit 2, the second integrated circuit 14, the oscillator assembly 3, the radio frequency component 11, and the antenna 10. The oscillator assembly 3 is interposed between the first integrated circuit 2 and the package substrate 4 and the first integrated circuit 2 is interposed between the second integrated circuit 14 and the oscillator assembly 3. The radio frequency component 11 within the radio frequency shielding structure 9 is supported by the package substrate 4 and is within the overhang formed by the first integrated circuit 2. In an embodiment, the antenna 10 is supported by the package substrate 4 and is outside of the overhang formed by the first integrated circuit 2.

As illustrated in FIG. 6, the packaged module 600 further includes one or more discrete components 13, such as load capacitors, and one or more supports 15. In an embodiment, the one or more discrete components 13 and the one or more supports 15 are within the overhang formed by the first integrated circuit 2 and provide support for the first integrated circuit 2. In an embodiment, the first integrated circuit 2 is a system on a chip (SoC) and includes at least a portion of a baseband subsystem and the radio frequency component 11 is a radio frequency front end module (FEM) or front end integrated circuit (FEIC). The oscillator assembly 3 can be used to provide a clock signal to one or more of the first integrated circuit 2, the second integrated circuit 14, and the radio frequency component 11. The shielding structure 9 can include a shielding layer formed over the radio frequency component 11 such that the antenna 10 is unshielded opposite the common package substrate 4.

In an embodiment, the footprint of the SoC 2 is larger than the footprint of the oscillator assembly 3, which creates an overhang volume that is bounded by the sides of the oscillator assembly 3, the portion of the SoC 2 that extends beyond oscillator assembly 3, and the portion of the substrate 4 that is within the footprint of the SoC 2 and not covered by the oscillator assembly 3. In an embodiment, the supports 15 are placed between the substrate 4 and the SoC 2 in the footprint of the SoC 2. In an embodiment, the radio frequency component 11 and at least a portion of the shielding structure 9 can be placed within the overhang volume.

FIG. 6 also illustrates the radio frequency component 11, shielding structure 9, and antenna 10 without a top shielding layer in plan view. The radio frequency shielding structure 9 can shield the radio frequency component 11 from electromagnetic interference from the integrated antenna 10 and/or from other components outside of the radio frequency shielding structure 9. Alternatively or additionally, the radio frequency shielding structure 9 can shield the antenna 10 and/or other components from electromagnetic interference from the radio frequency component 11. Accordingly, the antenna 10 can be integrated in the packaged module 600 and the radio frequency shielding structure 9 can reduce electromagnetic interference between components of the packaged module 600. The radio frequency component 11, shielding structure 9 and antenna 10 may be implemented as described above with respect to FIGS. 3, 3A, and 3B.

FIG. 7 comprises another embodiment of a radio frequency packaged module 700 that can be implemented in a wireless device. FIG. 7 illustrates a cross section of the packaged module 700 that includes an oscillator assembly 3, a first integrated circuit 2 vertically integrated with the oscillator assembly 3, and a ground plane 21 between an antenna 18 and a radio frequency component 16 according to an embodiment. FIG. 7 is not necessarily drawn to scale.

As illustrated in FIG. 7, the packaged module 700 further includes one or more discrete components 12, such as load capacitors, and one or more wire bonds 6. In an embodiment, the first integrated circuit 2 is a system on a chip (SoC) and includes at least a portion of a baseband subsystem and the radio frequency component 16 is a radio frequency front end module (FEM) or front end integrated circuit (FEIC). The oscillator assembly 3 can be used to provide a clock signal to one or more of the first integrated circuit 2 and the radio frequency component 16. A multi-layer substrate 17 supports the first integrated circuit 2 and the oscillator assembly 3 on a first side. The oscillator assembly 3 is interposed between the first integrated circuit 2 and the multi-layer substrate 17.

In the radio frequency packaged module 700, the oscillator assembly 3 is over the substrate 17 and the SoC 2 is stacked directly over the oscillator assembly 3, without a routing substrate between the SoC 2 and the oscillator assembly 3. In an embodiment, the oscillator assembly 3 is immediately adjacent to the SoC 2 and the substrate 17. In an embodiment, the footprint of the SoC 2 is larger than the footprint of the oscillator assembly 3, which creates an overhang volume that is bounded by the sides of the oscillator assembly 3, the portion of the SoC 2 that extends beyond oscillator assembly 3, and the portion of the substrate 17 that is within the footprint of the SoC 2 and not covered by the oscillator assembly 3.

In an embodiment, the discrete components 12 and/or the front end system 11 are placed outside of the SoC footprint. In another embodiment, the discrete components 12 are placed between the SoC 2 and the oscillator assembly 3 within the SoC footprint. In another embodiment, the discrete components 12 are placed within the overhang volume.

There are several factors to consider when utilizing the overhang volume. Factors to consider include, but are not limited to the thickness of the SoC, bond wire types, an amount of pressure used to bond the bond wire to the SoC without cracking the SoC, an amount of overhang that can be supported, and the like.

The multi-layer substrate 17 includes the ground plane 21. The multi-layer substrate 17 supports the antenna 18 on a second side and the radio frequency component 16 on the first side. The ground plane 21 is positioned between the antenna 18 and the radio frequency component 16. The ground plane 21 can shield the radio frequency component 16 and other components of the packaged module 700 from electromagnetic interference from the antenna 18. Alternatively or additionally, the ground plane 21 can shield the antenna 18 from electromagnetic interference from the radio frequency component 16 and the other components of the packaged module 700. Accordingly, the antenna 18 can be integrated in the packaged module 700 and the ground plane 21 can reduce electromagnetic interference between components of the packaged module 700.

The packaged module 700 further includes an insulating layer 22 disposed between the antenna layer 18 and the ground plane 21, other layers 23 (e.g., including signal routing and/or passive components), vias 20 extending from the ground plane 21 to the first side of the multi-layer substrate 17, and solder bumps 19. Molding material, not shown, can encapsulate the packaged module 700 and through mold vias can extend through the molding material.

The antenna 18 in FIG. 7 may comprise part of an antenna in a packaging system. The antenna in a package system includes the antenna 18 integrated with and shielded from the RF component 16. The antenna 18 is unshielded from transmitting RF signals to and receiving RF signals from remote to the system 700. Accordingly, the antenna 18 can transmit and/or receive any suitable RF signal. The antenna 18 can transmit and/or receive RF signals for the system of the radio frequency packaged module 700. In certain embodiments, the antenna 18 of the antenna in a package system can be arranged to transmit and/or receive Bluetooth and/or ZigBee signals.

The antenna in a package system includes a multi-layer substrate 17 that includes an antenna layer 18, a ground plane 21, an insulating layer 22, and an other layer 23. An RF component 16 is attached to the multi-layer substrate 17 on a side opposite the antenna layer 18. The ground plane 21 is disposed between the antenna layer 18 and the RF component 16 such that the ground plane 21 provides shielding between the RF component 16 and the antenna layer 18. The antenna 18 can be in communication with the RF component 16 by way of one or more wire bonds, by way of one or more vias extending through the substrate 17 outside of the shielding structure, by way of magnetic coupling, or any suitable combination thereof.

The multi-layer substrate 17 can be a laminate substrate. The insulating layer 22 can be disposed between the antenna layer 18 and the ground plane 21. The insulating layer 22 can include any suitable dielectric material. The multi-layer substrate 17 can include one or more other layers 23, which can implement signal routing and/or passive components. Vias 20 extending from the ground plane 21 to the bottom side of the multi-layer substrate 17 shown in FIG. 7 can provide ground connections at the bottom side of the multi-layer substrate 17. In some implementations, each of the vias 20 can be implemented by several vias through different insulating layers connected to each other by metal in component layers disposed between insulating layers.

The RF component 16 can include any suitable circuitry configured to receive and/or provide an RF signal. For instance, the RF component 16 can include a power amplifier, a low-noise amplifier, an RF switch, a filter, a matching network, or any combination thereof. An RF signal can have a frequency in the range from about 30 kHz to 300 GHz. In accordance with certain communications standards, RF signal can be in a range from about 450 MHz to about 6 GHz, in a range from about 700 MHz to about 2.5 GHz, or in a range from about 2.4 GHz to about 2.5 GHz. In certain implementations, the RF component 16 can receive and/or provide signals in accordance with a wireless personal area network (WPAN) standard, such as Bluetooth, ZigBee, Z-Wave, Wireless USB, INSTEON, IrDA, or Body Area Network. In some other implementations, the RF component and receive and/or provide signals in accordance with a wireless local area network (WLAN) standard, such as Wi-Fi.

The antenna in a package system in FIG. 7 is illustrated without being encapsulated in molding material. In an embodiment, the RF component 16 can be encapsulated in molding material and further comprise mold vias. Through mold vias can extend through the molding material to bumps 19. The bumps 19 can be any suitable conductive bumps, such as solder bumps, solder balls, copper pillars, or the like. The bumps 19 can facilitate mounting of the antenna in a package system onto a system board. Bumps 19 can be in physical contact with through mold vias. Accordingly, the bumps 19 can be electrically connected to the ground plane 21 by way of through mold vias and vias 20 in the multi-layer substrate 17. While two bumps 19, two vias 24 are illustrated in the cross section of FIG. 7, any suitable number of such elements can be included in the antenna in a package system to provide a suitable ground connection and/or to provide suitable shielding around the RF component 16. For instance, the bumps 19 can extend along outer edges of the antenna in a package system to surround the RF component 16 in plan view. Corresponding mold vias and vias 20 can be implemented with such bumps 19.

FIG. 8 comprises another embodiment of a radio frequency packaged module 800 that can be implemented in a wireless device. FIG. 8 illustrates a cross section of the packaged module 800 that includes a stacked filter assembly 24 and a ground plane 21 between an antenna 18 and a radio frequency component 16 according to an embodiment. FIG. 8 is not necessarily drawn to scale.

A multi-layer substrate 17 supports the stacked filter assembly 24 and the radio frequency component 16 on a first side and the antenna 18 on a second side. The multi-layer substrate 17 includes the ground plane 21 which is positioned between the antenna 18 and the radio frequency component 16. The ground plane 21 can shield the radio frequency component 16 and other components of the packaged module 800 from electromagnetic interference from the antenna 18. Alternatively or additionally, the ground plane 21 can shield the antenna 18 from electromagnetic interference from the radio frequency component 16 and the other components of the packaged module 800. Accordingly, the antenna 18 can be integrated in the packaged module 800 and the ground plane 21 can reduce electromagnetic interference between components of the packaged module 800. The stacked filter assembly 24 can filter a signal associated with the radio frequency component 16. In an embodiment, the stacked filter assembly 24 comprises surface mount discrete components, such as resistor, capacitors, and inductors.

In an embodiment, the radio frequency component 16 is a radio frequency front end module (FEM) or front end integrated circuit (FEIC). In an embodiment, the packaged module 800 further includes an integrated circuit that comprises at least a portion of a baseband subsystem. The packaged module 800 further includes an antenna in a package system. The antenna in a package system includes an insulating layer 22 disposed between the antenna layer 18 and the ground plane 21, other layers 23 (e.g., including signal routing and/or passive components), vias 20 extending from the ground plane 18 to the first side of the multi-layer substrate 17, and solder bumps 19. Molding material, not shown, can encapsulate the packaged module 800 and through mold vias can extend through the molding material. The antenna in a package system may be implemented as described above with respect to FIG. 7.

FIGS. 8A1-8D2 illustrate exemplary space saving stacking configurations and corresponding exemplary circuit diagrams for surface mount parts, components, or devices that may form at least a part of the stacked filter assembly 24. Stacking the surface mount components to form circuits or portions of circuits saves layout space on substrates or laminates as compared to mounting each surface mount component directly onto the substrate or laminate. Further, traces are used to interconnect the surface mount components on the substrate or laminate to form at least portions of electrical circuits. The direct connection between two stacked surface mount parts eliminates at least one trace from the substrate or laminate and saves additional space. In an embodiment, the stacked surface mount components form at least portions of filter circuits used to filter radio frequency signals. In an embodiment, the surface mount devices comprise inductors, capacitors, and resistors. In other embodiments, the surface mount components comprise active or passive surface mount devices.

FIG. 8A1 illustrates a surface mount stacking assembly 1210 comprising a first horizontally positioned surface mount device 1212 stacked over and immediately adjacent to a second horizontally positioned surface mount device 1214, where the second surface mount device 1214 is over and immediately adjacent to a bottom surface 1216. In an embodiment, the contacts of the first surface mount device 1212 are in electrical communication with respective contacts of the second surface mount device 1214.

FIG. 8A2 illustrates an exemplary filter circuit 1215. In an embodiment, the stacking configuration 1210 comprises the filter circuit 1215. In other embodiments, other filter circuits or other circuits can be formed using the surface mount stacking assembly 1210.

FIG. 8B1 illustrates a surface mount stacking assembly 1220 comprising a first vertically oriented surface mount device 1222 stacked on end over and immediately adjacent to a second vertically oriented surface mount device 1224. A first end of the surface mount device 1222 is in electrical communication with a first end of the second surface mount device 1224, and a second end of the second surface mount device 1224 is over and immediately adjacent to a bottom surface 1226. In an embodiment, the second end of the second surface mount device 1224 is in electrical communication with pads or traces on the bottom surface 1226.

FIG. 8B2 illustrates an exemplary filter circuit 1225. In an embodiment, the stacking configuration 1220 comprises the filter circuit 1225. In other embodiments, other filter circuits or other circuits can be formed using the surface mount stacking assembly 1220.

FIG. 8C1 illustrates a surface mount stacking assembly 1230 comprising a horizontally oriented first surface mount device 1232, a horizontally oriented second surface mount device 1234, and a horizontally oriented third surface mount device 1238. In an embodiment, the first surface mount device 1232 and the second surface mount device 1234 are over and immediately adjacent to a bottom surface 1236 and spaced apart such that a first end of the third surface mount device 1238 is stacked over a first end of the first surface mount device 1232 and a second end of the third surface mount device 1234 is stacked over a first end of the second surface mounted device 1234. In an embodiment, the surface mount devices 1232, 1234, 1238 are electrically connected in series. In an embodiment, the stacking configuration 1230 has a smaller footprint than the footprint formed by mounting three surface mount devices on the bottom layer 1236 to form a series connection.

FIG. 8C2 illustrates a surface mount stacking assembly 1240 comprising a first vertically oriented surface mount device 1242, a second vertically oriented surface mount device 1244, and a third horizontally oriented surface mount device 1248. The first surface mount device 1242 is over and immediately adjacent to a bottom layer 1206 such that a first end of the first surface mount device 1242 is in electrical communication with pads or traces on the bottom layer 1246. The second surface mount device 1244 is over and immediately adjacent to the bottom layer 1206 that a first end of the second surface mount device 1242 is in electrical communication with pads or traces on the bottom layer 1246.

Further, the first and second surface mount devices 1242, 1244 are spaced apart such that a first end of the third surface mount device 1248 is over and in electrical communication with a second end of the first surface mount device 1242 and a second end of the third surface mount device 1248 is over and in electrical communication with a second end of the second surface mount device 1244.

In an embodiment, the surface mount stacking assemblies 1230, 1240 comprises a pi ($\pi$) filter topology. An exemplary pi filter 1245 is illustrated in FIG. 12C3. In an embodiment, the stacking configuration 1240 has a smaller footprint than the footprint formed by mounting three surface mount devices on the bottom layer 1236, 1246 to form the pi filter.

In another embodiment, the stacking configuration 1240 can be flipped over such that surface mount device 1248 is over the bottom layer 1246, and surface mount devices 1242 and 1244 are over surface mount device 1248.

FIG. 8D1 illustrates a surface mount stacking assembly 1250 comprising a first surface mount device 1252, a second surface mount device 1254, a third surface mount device 1258, and a fourth surface mount device 1260. In a first embodiment, as illustrated in FIG. 12E, the first, second, and third surface mount devices 1252, 1254, 1258 form the surface mount stacking assembly 1240 over and immediately adjacent to a bottom layer 1256, and the fourth surface mount device 1260 is stacked over and immediately adjacent to the third surface mount device 1258. In an embodiment, pads of the fourth surface mount device 1260 are in electrical communication with corresponding pads of the third surface mount device 1258.

In a second embodiment, not illustrated, the first, second, and third surface mount devices 1252, 1254, 1258 form the surface mount stacking assembly 1240 over and immediately adjacent to the bottom layer 1256, and the fourth surface mount device 1260 is stacked beside and immediately adjacent to the third surface mount device 1258 and also over and immediately adjacent to the first and second surface mount devices 1252, 1254. In an embodiment, pads of the fourth surface mount device 1260 are in electrical communication with corresponding pads of the third surface mount device 1258 and the corresponding pads of the first and second surface mount devices 1252, 1254.

In a third embodiment, not illustrated, the first, second, and third surface mount devices 1252, 1254, 1258 form the stacking configuration 1230 over and immediately adjacent to the bottom layer 1256, and the fourth surface mount device 1260 is stacked over and immediately adjacent to the third surface mount device 1258. In an embodiment, pads of the fourth surface mount device 1260 are in electrical communication with corresponding pads of the third surface mount device 1258.

In a fourth embodiment, not illustrated, the first, second, and third surface mount devices 1252, 1254, 1258 form the surface mount stacking assembly 1230 over and immediately adjacent to the bottom layer 1256, and the fourth surface mount device 1260 is stacked beside and immediately adjacent to the third surface mount device 1258 and also over and immediately adjacent to the first and second surface mount devices 1252, 1254. In an embodiment, pads of the fourth surface mount device 1260 are in electrical communication with corresponding pads of the third surface mount device 1258 and the corresponding pads of the first and second surface mount devices 1252, 1254.

In a fifth embodiment, not illustrated, the surface mount stacking assembly 1250 can be flipped over such that surface mount device 1260 is over the bottom layer 1256, surface mount device 1258 is over surface mount device 1260, and surface mount devices 1252 and 1254 are each over a different end of surface mount device 1258.

In an embodiment, the surface mount stacking assembly 1250 comprises a band-reject or notch filter topology that can be configured to form a notch or reject at specific frequencies. An exemplary band-reject filter circuit 1255 is illustrated in FIG. 12D2. In an embodiment, a surface mount stacking assembly that comprises a first surface mount stacking assembly 1250 beside a second surface mount stacking assembly 1250 such that both the first and second surface mount stacking assemblies 1250 share surface mount device 1254 comprises a band-reject filter with a notch at two specified frequencies.

In an embodiment, the stacking configuration 1250 has a smaller footprint than the footprint formed by mounting four surface mount devices on the bottom layer 1256 to form the band-reject or notch filter topology. Since any node or pad of any of the surface mount devices 1212, 1214, 1222, 1224, 1232, 1234, 1238, 1242, 1244, 1248, 1252, 1254, 1258, 1260 is configured for bonding, additional surface mount devices and/or various combinations of the stacking structures 1210, 1220, 1230, 1240, 1250, for example, can be combined to create structures with more complex topology.

Surface mount devices 1212, 1214, 1222, 1224, 1232, 1234, 1238, 1242, 1244, 1248, 1252, 1254, 1258, 1260 can be, for example, passive components, such as capacitors, resistor, and inductors, discrete semiconductors, such as transistors, diodes, and FETs, integrated circuits, and the like, and can have short pins or leads of various styles, flat contacts, a matrix of solder balls (BGAs), or terminations on the body of the component.

FIG. 9 comprises another embodiment of a radio frequency packaged module 900 that can be implemented in a wireless device. FIG. 9 illustrates a cross section of the packaged module 900 that includes an oscillator assembly 3, a first integrated circuit 2 vertically integrated with the oscillator assembly 3 and ground plane 21 between an antenna 18 and a radio frequency component 16 according to an embodiment. FIG. 9 is not necessarily drawn to scale.

The multi-layer substrate 17 supports the first integrated circuit 2, the oscillator assembly 3, and the antenna 18 on a first side and supports the radio frequency component 16 on a second side. The oscillator assembly 3 is interposed between the multi-layer substrate 17 and the first integrated circuit 2. The multi-layer substrate 17 includes the ground plane 21, which is positioned between the antenna 18 and the radio frequency component 16. The ground plane 21 can shield the radio frequency component 16 and other components of the packaged module 900 from electromagnetic interference from the antenna 18. Alternatively or additionally, the ground plane 21 can shield the antenna 18 from electromagnetic interference from the radio frequency component 16 and the other components of the packaged module 900. Accordingly, the antenna 18 can be integrated in the packaged module 900 and the ground plane 21 can reduce electromagnetic interference between components of the packaged module 900.

As illustrated in FIG. 9, the packaged module 900 further includes one or more discrete components 12, such as load capacitors and one or more supports 15. In an embodiment, the first integrated circuit 2 is a system on a chip (SoC) and includes at least a portion of a baseband subsystem and the radio frequency component 16 is a radio frequency front end module (FEM) or front end integrated circuit (FEIC). The oscillator assembly 3 can be used to provide a clock signal to one or more of the first integrated circuit 2 and the radio frequency component 16. The stacked SoC 2, oscillator assembly 3, and substrate 17 including the discrete components 12 within the overhang volume may be implemented as described above with respect to FIG. 5.

The packaged module 900 further includes an antenna in a package system. The antenna in a package system includes an insulating layer 22 disposed between the antenna layer 18 and the ground plane 21, other layers 23 (e.g., including signal routing and/or passive components), vias 20 extending from the ground plane 18 to the first side of the multi-layer substrate 17, and solder bumps 19. Molding material, not shown, can encapsulate the packaged module 900 and through mold vias can extend through the molding material. The antenna in a package system may be implemented as described above with respect to FIG. 7.

FIG. 10 comprises another embodiment of a radio frequency packaged module 1000 that can be implemented in a wireless device. FIG. 10 illustrates a cross section of the packaged module 1000 that includes an oscillator assembly 25 having conductive pillars 31 and an integrated circuit 2 vertically integrated with the oscillator assembly 25, and a front end system 26 according to an embodiment. FIG. 10 is not necessarily drawn to scale. A package substrate 4 supports the oscillator assembly 25, the integrated circuit 2, and the front end system 26. The oscillator assembly 25 is disposed between the integrated circuit 2 and the package substrate 4.

As illustrated in FIG. 10, the oscillator assembly 25 further includes one or more pillars 31, a lid 32, load capacitors 27, a crystal 28, oscillator circuitry 29, and one or more filters, such as surface acoustic wave (SAW) filter 32, disposed within a cavity formed within the oscillator assembly 25. In an embodiment, the integrated circuit 2 is a system on a chip (SoC) and includes at least a portion of a baseband subsystem. In an embodiment, the one or more pillars 31 that are formed within and along the side of the oscillator assembly 25 are conductive and conduct one or more signals from the oscillator assembly 25 to the integrated circuit 2. In an embodiment, the oscillator assembly 25 generates clock signals used in the front end system 26 and/or the integrated circuit 2.

FIG. 10A1 illustrates an exemplary oscillator assembly 908 comprising an enclosure, housing or case 932 and one or more pillars 934 along one or more sides of the housing 932. In an embodiment, the pillars or vias 934 comprise a conductive material, such as solder, metal, copper, gold, nickel gold-plated metal, and the like, and the housing 932 comprises a non-conductive material. In an embodiment, the housing 932 further comprises a lid 930. In an embodiment, the lid 930 comprises a non-conductive material, such as ceramic, glass and epoxy, woven glass and polyester, alumina, polyimide, and the like.

The pillars or vias 934 are formed from a top surface of the housing 932 to a bottom surface of the housing 932 and provide electrical and/or thermal conduction. In an embodiment, the pillars 934 are formed at least partially within the sides of the housing 932. In another embodiment, the housing 932 is formed with one or more tubes along one or more sides of the housing 932, such that filling the tubes with solder forms the pillars 934. In another embodiment, the pillars 934 are formed as cylindrical, rectangular, or the like, tubes or columns outside, partially with, or within the housing 932.

In an embodiment, the tops and the bottoms of the pillars 934 form pads 936 around the perimeter of the housing 932. In another embodiment, the pillars 934 are in electrical communication with the pads 936 formed along the top and bottom surfaces of the pillars 934. In an embodiment, the pads 936 are configured as surface mount pads. In another embodiment, the pads 936 are wirebondable. In another embodiment, the pads 936 are configured to be soldered to solder balls of ball-grid array packaged integrated circuit.

In an embodiment, the lid 930 comprises a ceramic substrate material or other non-conductive material and can be configured as a routing substrate, interposer, or circuit board. As illustrated in FIG. 9A1, the lid 930 further comprises routing 933 and pads 935, where the routing 933 is configured to carry a signal between the pads 935. In an embodiment, the routing and pads are formed on the lid 930 according to routing substrate, interposer, or circuit board fabrication techniques. In an embodiment, a first wire bond 931 is bonded to a first pillar 934 and a second wire bond 931 is bonded to a second pillar 934. Wire bonds 931 communicate a signal from one of the wire bond-connected pillars 934 through the pads 935 and trace 933 on the lid 930 to the other of the wire bond-connected pillar 934.

FIG. 10A2 illustrates the oscillator assembly 908 further comprising a conductive layer 937 wrapped around four sides of the oscillator assembly 908. The conductive layer 937 is in electrical communication with each of the pillars 934. In an embodiment, the wrapped conductive layer 937 comprises copper, plated copper, where the plating material can be solder, tin, gold over nickel, and the like, or any other conductive material. In another embodiment, the wrapped conductive layer can be plated onto the one, two, three, or four sides of the oscillator assembly 908, where the plating material can be solder, tin, gold over nickel, and the like.

In other embodiments, the wrapped conductive layer 937 wraps around one, two, three, or four of the sides of the oscillator assembly 908 and is in electrical communication with the pillars 934 of the one, two, three, or four of the sides, respectively. In an embodiment, the pillars 934 in electrical communication with the wrapped conductive layer 937 are connected to ground. The combination of the grounded pillars 934 and the wrapped conductive layer 937 forms a "super ground". The super ground 934, 937 reduces inductance coupling onto the ground and provides better signal isolation.

In another embodiment, the pillars 934 in electrical communication with the wrapped conductive layer 937 form a radio frequency (RF) shield to shield the devices within the cavity of the enclosure 932 from RF interference.

In another embodiment, the pillars 934 in electrical communication with the wrapped conductive layer 937 form a heat sink to dissipate heat. For example, the pillars 934 and wrapped conductive layer 937 can dissipate heat generated by a power amplifier placed above or below the crystal assembly 908 and in thermal contact with the heat sink formed by the pillars 934 and the wrapped conductive layer 937.

FIG. 10B1 illustrates a cross-sectional view of the exemplary oscillator assembly 908 comprising the lid 930, the housing 932, and one or more pillars 934. The oscillator assembly 908 further comprises a crystal 938 housed within the housing 932. In another embodiment, the oscillator assembly 908 further comprises one or more load capacitors 940, oscillator circuitry 942, and an FEIC 944 housed within the housing 932 of the oscillator assembly 908. In a further embodiment, one or more integrated circuit die are housed within the housing 932.

FIG. 10B2 illustrates a cross-sectional view of the exemplary oscillator assembly 908 comprising the lid 930, the housing 932, and one or more pillars 934. The oscillator assembly 908 further comprises the crystal 938 housed within the housing 932. In another embodiment, the oscillator assembly 908 further comprises the one or more load capacitors 940, the oscillator circuitry 942, and a surface acoustic wave (SAW) device 945 housed within the housing 932 of the oscillator assembly 908. Examples of SAW devices 945 include filters, delay lines, correlators and DC to DC converters. In a further embodiment, one or more integrated circuit die are housed within the housing 932.

The embodiment of FIG. 10B2 illustrates the SAW device 945, such as a SAW filter, and the crystal 938 in the same physical cavity formed within the oscillator assembly 908. In an embodiment, the oscillator assembly 908 is hermetically sealed. In another embodiment, the cavity is gas-filled, and the oscillator assembly is hermetically sealed. Placing the SAW device and the crystal in the same physical cavity advantageously saves space on the module.

FIG. 10C illustrates a bottom view of the exemplary oscillator assembly 908. In an embodiment, the oscillator assembly 908 further comprises one or more pads 952 in communication with one or more of the components 938, 940, 942, 944 housed within the housing 932.

Figure 11:
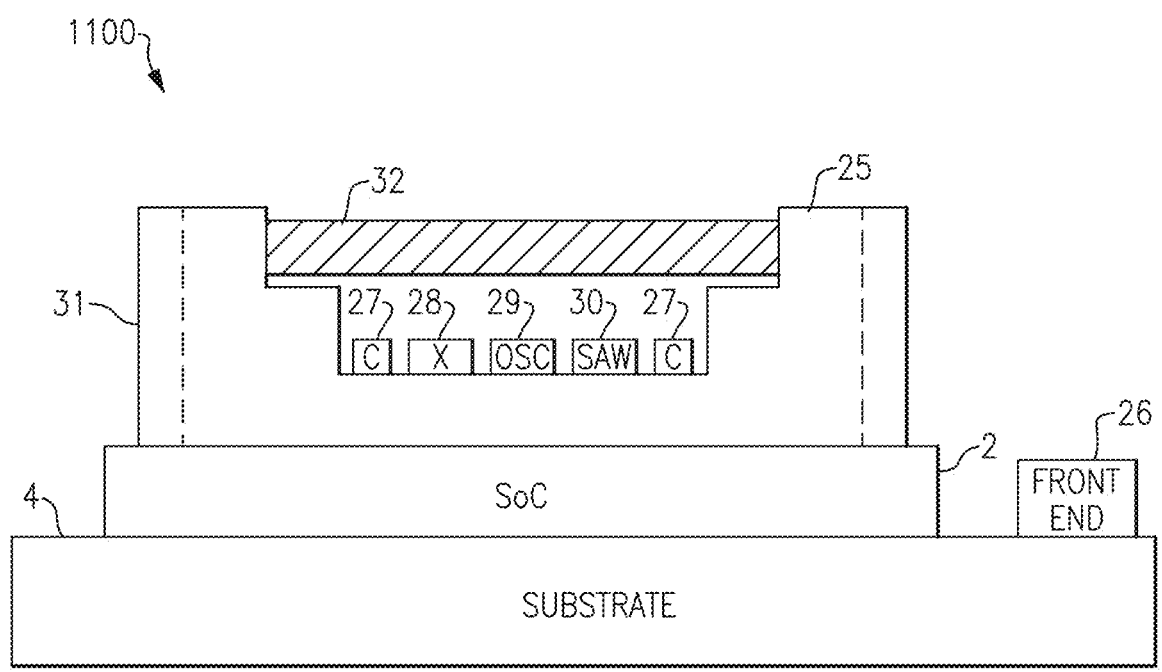
FIG. 11 is a cross section of a packaged module that includes an integrated circuit and an oscillator assembly having conductive pillars vertically integrated with the integrated circuit, according to an embodiment.

FIG. 11 comprises another embodiment of a radio frequency packaged module 1100 that can be implemented in a wireless device. FIG. 11 illustrates a cross section of the packaged module 1100 that includes an oscillator assembly 25 having conductive pillars 31 and an integrated circuit 2 vertically integrated with the oscillator assembly 25, a front end module or integrated circuit (FEM/FEIC) 26 according to an embodiment. FIG. 11 is not necessarily drawn to scale. A package substrate 4 supports the oscillator assembly 25, the integrated circuit 2, and the front end 26. The integrated circuit 2 is disposed between the oscillator assembly 25 and the package substrate 4.

As illustrated in FIG. 11, the oscillator assembly 25 further includes the one or more pillars 31, a lid 32, load capacitors 27, a crystal 28, oscillator circuitry 29, and one or more filters, such as surface acoustic wave (SAW) filter 32, disposed within a cavity formed within the oscillator assembly 25. In an embodiment, the integrated circuit 2 is a system on a chip (SoC) and includes at least a portion of a baseband subsystem. In an embodiment, the one or more pillars 31 are formed within and along the side of the oscillator assembly 25 and conduct one or more signals from the oscillator assembly 25 to the integrated circuit 2. In an embodiment, the oscillator assembly 25 generates clock signals used in the front end 26 and/or the integrated circuit 2. Additional details of the oscillator assembly 25 are illustrated in FIGS. 10A1, 10A2, 10B1, 10B2, and 10C.

FIG. 12 comprises another embodiment of a radio frequency packaged module 1200 that can be implemented in a wireless device. FIG. 12 illustrates a cross section of the packaged module 1200 that includes an oscillator assembly 25 having conductive pillars 31 and one or more stacked filter assemblies 24 according to an embodiment. A package substrate 4 supports the oscillator assembly 25 and the one or more stacked filter assemblies 24. FIG. 12 is not necessarily drawn to scale.

As illustrated in FIG. 12, the oscillator assembly 25 further includes one or more pillars 31, a lid 32, load capacitors 27, a crystal 28, oscillator circuitry 29, and one or more filters, such as surface acoustic wave (SAW) filter 32, disposed within a cavity formed within the oscillator assembly 25. In an embodiment, the one or more pillars 31 formed within and along the side of the oscillator assembly 25 are conductive and conduct one or more signals from the oscillator assembly 25 to the package substrate 4. In an embodiment, the oscillator assembly 25 generates clock signals used in the packaged module 1200. The stacked filter assembly 24 can filter a signal associated with crystal assembly 25. In an embodiment, the stacked filter assembly 24 comprises surface mount discrete components, such as resistor, capacitors, and inductors. In an embodiment, the stacked filter assembly 24 is described above and illustrated in FIGS. 8A1, 8A2, 8B1, 8B2, 8C1, 8C2, 8D1, and 8D2.

FIG. 13 comprises another embodiment of a radio frequency packaged module 1300 that can be implemented in a wireless device. FIG. 13 illustrates a cross section of the packaged module 1300 that includes an oscillator assembly 25 having conductive pillars 31 and a first integrated circuit 2 vertically integrated with the oscillator assembly 25 on a first side of a package substrate 4, and a radio frequency front end integrated circuit or radio frequency front end module (FEM/FEIC) 26 vertically integrated on a second side of the package substrate 4 according to an embodiment. FIG. 13 is not necessarily drawn to scale.

The oscillator assembly 25 is interposed between the first integrated circuit 2 and the package substrate 4. In an embodiment, the first integrated circuit 2 has a larger footprint than the oscillator assembly 25 and forms an overhang above the package substrate 4. A support 15 is positioned within the overhang and provides support for the first integrated circuit 2 above the package substrate 4.

As illustrated in FIG. 13, the oscillator assembly 25 further includes one or more pillars 31, a lid 32, load capacitors 27, a crystal 28, oscillator circuitry 29, and one or more filters, such as surface acoustic wave (SAW) filter 32, disposed within a cavity formed within the oscillator assembly 25. In an embodiment, the one or more pillars 31 formed within and along the sides of the oscillator assembly 25 are conductive and conduct one or more signals from the first integrated circuit 2 and/or circuitry formed on the lid 32 to the package substrate 4. In an embodiment, the stacked filter assembly 24 is described above and illustrated in FIGS. 8A1, 8A2, 8B1, 8B2, 8C1, 8C2, 8D1, and 8D2.

In an embodiment, the integrated circuit 2 is a system on a chip (SoC) and includes at least a portion of a baseband subsystem. In an embodiment, the oscillator assembly 25 generates clock signals used in the front end 26 and/or the first integrated circuit 2.

FIG. 14 comprises another embodiment of a radio frequency packaged module 1400 that can be implemented in a wireless device. FIG. 14 illustrates a cross section of the packaged module 1400 that includes an oscillator assembly 25 having conductive pillars 31, a first integrated circuit 2 vertically integrated with the oscillator assembly 25, and a radio frequency front end integrated circuit or radio frequency front end module (FEIC/FEM) 26 vertically integrated with the first integrated circuit 2 and the oscillator assembly 25 according to an embodiment. FIG. 14 is not necessarily drawn to scale.

The oscillator assembly 25 is interposed between the first integrated circuit 2 and the package substrate 4. The first integrated circuit 2 is interposed between the front end 26 and the oscillator assembly 25.

As illustrated in FIG. 14, the oscillator assembly 25 further includes one or more pillars 31, a lid 32, load capacitors 27, a crystal 28, oscillator circuitry 29, and one or more filters, such as surface acoustic wave (SAW) filter 30, disposed within a cavity formed within the oscillator assembly 25. In an embodiment, the one or more pillars 31 formed within and along the side of the oscillator assembly 25 are conductive and conduct one or more signals from the first integrated circuit 2 and/or circuitry formed on the lid 32 to the package substrate 4. In an embodiment, the radio frequency package module 1400 further includes the stacked filter assembly 24 that is described above and illustrated in FIGS. 8A1, 8A2, 8B1, 8B2, 8C1, 8C2, 8D1, and 8D2.

In an embodiment, the first integrated circuit 2 is a system on a chip (SoC) and includes at least a portion of a baseband subsystem. In an embodiment, the oscillator assembly 25 generates clock signals used in the radio frequency front end 26 and/or the first integrated circuit 2. In an embodiment, the footprint of the first integrated circuit 2 is larger than the footprint of the oscillator assembly 25 such that the first integrated circuit 2 overhangs the oscillator assembly 25. Additional integrated circuits or discrete components or the stacked filter assembly 24 can be placed beside the oscillator assembly 25 within the overhang formed by the first integrated circuit 2.

FIG. 15 comprises another embodiment of a radio frequency packaged module 1500 that can be implemented in a wireless device. FIG. 15 illustrates a cross section of the packaged module 1500 that includes a first integrated circuit 2, an oscillator assembly 3 vertically integrated with the first integrated circuit 2, a radio frequency front end integrated circuit or radio frequency front end module (FEIC/FEM) 26, and a stacked filter assembly 24 according to an embodiment. FIG. 15 is not necessarily drawn to scale. A package substrate 4 supports the first integrated circuit 2, the oscillator assembly 3, the radio frequency front end 26, and the stacked filter assembly 24. The first integrated circuit 2 is interposed between the oscillator assembly 3 and the package substrate 4.

As illustrated in FIG. 15, the packaged module 1500 further includes a routing substrate or interposer 7, one or more load capacitors 8, and one or more wire bonds 6. In an embodiment, the first integrated circuit 2 is a system on a chip (SoC) and includes at least a portion of a baseband subsystem. In an embodiment, the oscillator assembly 3 is use to provide clock signals to at least one of the first integrated circuit and the radio frequency front end 26. The stacked filter assembly 24 can filter a signal associated with the first integrated circuit 2 or the radio frequency front end 26. In an embodiment, the stacked filter assembly 24 comprises surface mount discrete components, such as resistor, capacitors, and inductors. In an embodiment, the stacked filter assembly 24 is described above and illustrated in FIGS. 8A1, 8A2, 8B1, 8B2, 8C1, 8C2, 8D1, and 8D2.

FIG. 16 comprises another embodiment of a radio frequency packaged module 1600 that can be implemented in a wireless device. FIG. 16 illustrates a cross section of the packaged module 1600 that includes an oscillator assembly 3, a first integrated circuit 2 vertically integrated with the oscillator assembly 3, a radio frequency circuit 26, and a stacked filter assembly 24 according to an embodiment. FIG. 16 is not necessarily drawn to scale. The packaged module 1600 includes a package substrate 4 that supports the first integrated circuit 2, the oscillator assembly 3, the radio frequency circuit 26, and the stacked filter assembly 24. The oscillator assembly 3 is interposed between the first integrated circuit 2 and the package substrate 4.

As illustrated in FIG. 16, the packaged module 1600 further includes one or more discrete components 12, such as load capacitors, and one or more wire bonds 6. In an embodiment, the first integrated circuit 2 is a system on a chip (SoC) and includes at least a portion of a baseband subsystem and the radio frequency circuit 26 is a radio frequency front end module (FEM) or front end integrated circuit (FEIC). The stacked filter assembly 24 can filter a signal associated with the first integrated circuit 2 or the radio frequency circuit 26. In an embodiment, the stacked filter assembly 24 comprises surface mount discrete components, such as resistor, capacitors, and inductors. In an embodiment, the stacked filter assembly 24 is described above and illustrated in FIGS. 8A1, 8A2, 8B1, 8B2, 8C1, 8C2, 8D1, and 8D2.

FIG. 17 comprises another embodiment of a radio frequency packaged module 1700 that can be implemented in a wireless device. FIG. 17 illustrates a cross section of the packaged module 1700 that includes an oscillator assembly 3, a first integrated circuit 2 vertically integrated with the oscillator assembly 3, a radio frequency circuit 26 vertically integrated with the oscillator assembly 3 and the first integrated circuit 2, and a stacked filter assembly 24. FIG. 17 is not necessarily drawn to scale.

A package substrate 4 supports the oscillator assembly 3, the first integrated circuit 2, and the stacked filter assembly 24 on a first side and the radio frequency circuit 26 on a second side. The oscillator assembly 3 is interposed between the first integrated circuit 2 and the package substrate 4.

As illustrated in FIG. 17, the packaged module 1700 further includes one or more discrete components 12, such as load capacitors, and one or more supports 15. In an embodiment, the first integrated circuit 2 is a system on a chip (SoC) and includes at least a portion of a baseband subsystem and the radio frequency circuit 26 is a radio frequency front end module (FEM) or front end integrated circuit (FEIC). The oscillator assembly 3 can be used to provide a clock signal for one or more of the first integrated circuit 2 and the radio frequency circuit 26. The stacked filter assembly 24 can filter a signal associated with the first integrated circuit 2 or the radio frequency circuit 26. In an embodiment, the stacked filter assembly 24 comprises surface mount discrete components, such as resistor, capacitors, and inductors. In an embodiment, the stacked filter assembly 24 is described above and illustrated in FIGS. 8A1, 8A2, 8B1, 8B2, 8C1, 8C2, 8D1, and 8D2.

In an embodiment, the footprint of the first integrated circuit 2 is larger than the footprint of the oscillator assembly 3 such that at least a portion of the perimeter of the first integrated circuit 2 overhangs the oscillator assembly 3. The support 15 provides support to the first integrated circuit 2 under the overhang and between the first integrated circuit 2 and the package substrate 4. The one or more discrete components 12 can be placed under the overhang of the first integrated circuit 2.

FIG. 18 comprises another embodiment of a radio frequency packaged module 1800 that can be implemented in a wireless device. FIG. 18 illustrates a cross section of the packaged module 1800 that includes an oscillator assembly 3, a first integrated circuit 2 vertically integrated with the oscillator assembly 3, a radio frequency circuit 26 vertically integrated with the first integrated circuit 2, and a stacked filter assembly 24 according to an embodiment. FIG. 18 is not necessarily drawn to scale.

The oscillator assembly 3 is interposed between the first integrated circuit 2 and a package substrate 4. The first integrated circuit 2 is interposed between the radio frequency circuit 26 and the oscillator assembly 3. A package substrate 4 supports the oscillator assembly 3, the first integrated circuit 2, the radio frequency circuit 26, and the stacked filter assembly 24.

As illustrated in FIG. 18, the packaged module 1800 further includes one or more one or more supports 15. In an embodiment, the one or more supports 15 can be inactive mechanical supports or discrete components that form a portion of the circuitry in the packaged module 1800. In an embodiment, the first integrated circuit 2 is a system on a chip (SoC) and includes at least a portion of a baseband subsystem and the radio frequency circuit 26 is a radio frequency front end module (FEM) or front end integrated circuit (FEIC). The oscillator assembly 3 can be used to provide a clock signal for one or more of the first integrated circuit 2 and the radio frequency circuit 26. The stacked filter assembly 24 can filter a signal associated with the first integrated circuit 2 or the radio frequency circuit 26. In an embodiment, the stacked filter assembly 24 comprises surface mount discrete components, such as resistor, capacitors, and inductors. In an embodiment, the stacked filter assembly 24 is described above and illustrated in FIGS. 8A1, 8A2, 8B1, 8B2, 8C1, 8C2, 8D1, and 8D2.

In an embodiment, the footprint of the first integrated circuit 2 is larger than the footprint of the oscillator assembly 3 such that at least a portion of the perimeter of the first integrated circuit 2 overhangs the oscillator assembly 3. The one or more supports 15 provide support to the first integrated circuit 2 under the overhang and between the first integrated circuit 2 and the package substrate 4.

FIG. 19 comprises another embodiment of a radio frequency packaged module 1900 for use in a wireless device. FIG. 19 illustrates a cross section of the packaged module 1900 that includes an oscillator assembly 3, a first integrated circuit 2 vertically integrated with the oscillator assembly 3, and a radio frequency circuit 26 vertically integrated with the oscillator assembly 3. A package substrate 4 supports the oscillator assembly 3 and the first integrated circuit 2 on a first side and the radio frequency circuit 26 on a second side. The oscillator assembly 3 is interposed between the first integrated circuit 2 and the package substrate 4. FIG. 19 is not necessarily drawn to scale.

As illustrated in FIG. 19, the packaged module 1900 further includes one or more discrete components 12, such as load capacitors, and one or more supports 15. In an embodiment, the first integrated circuit 2 is a system on a chip (SoC) and includes at least a portion of a baseband subsystem and the radio frequency circuit 26 is a radio frequency front end module (FEM) or front end integrated circuit (FEIC). The oscillator assembly 3 is used to provide a clock signal for one or more of the first integrated circuit 2 and the radio frequency circuit 26. In an embodiment, the footprint of the first integrated circuit 2 is larger than the footprint of the oscillator assembly 3 such that at least a portion of the perimeter of the first integrated circuit 2 overhangs the oscillator assembly 3. The support 15 provides support to the first integrated circuit 2 under the overhang and between the first integrated circuit 2 and the package substrate 4. The one or more discrete components 12 can be placed under the overhang of the first integrated circuit 2.

Figure 20:
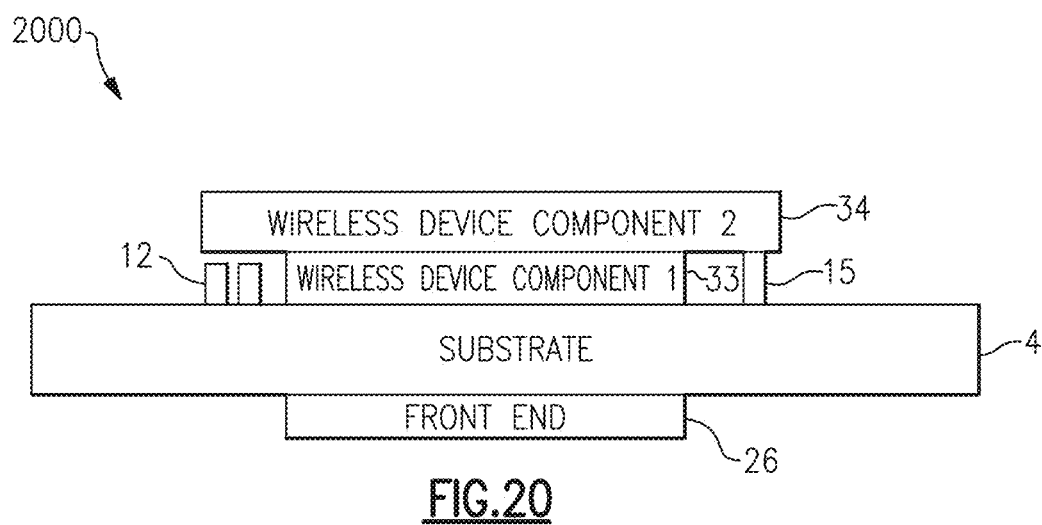
FIG. 20 is a cross section of a packaged module that includes a first wireless device component and a second wireless device component vertically integrated with the first wireless device component and extending beyond a periphery of the first wireless device component, according to an embodiment.

FIG. 20 comprises another embodiment of a radio frequency packaged module 2000 for use in a wireless device. FIG. 20 illustrates a cross section of the cross section of a packaged module 2000 that includes a first wireless device component 33, a second wireless device component 34, and a radio frequency circuit 26 according to an embodiment. FIG. 20 is not necessarily drawn to scale.

A package substrate 4 supports the first wireless device component 33 and the second wireless device component 34 on a first side and the radio frequency circuit 26 on a second side. The second wireless device component 34 is vertically integrated with the first wireless device component 33 and extends beyond a periphery of the first wireless device component 33. The first wireless device component 33 is interposed between the second wireless device component 34 and the package substrate 4. The radio frequency circuit 26 is vertically integrated with the first wireless device component 33 and the second wireless device component 34.

As illustrated in FIG. 20, the packaged module 2000 further includes one or more discrete components 12 and one or more supports 15. In an embodiment, the radio frequency circuit 26 is a radio frequency front end module (FEM) or front end integrated circuit (FEIC). In an embodiment, the footprint of the second wireless device component 34 is larger than the footprint of the first wireless device component 33 such that at least a portion of the perimeter of the second wireless device component 34 overhangs the first wireless device component 33. The one or more supports 15 provide support to the second wireless device component 34 under the overhang and between the second wireless device component 34 and the package substrate 4. The one or more discrete components 12 can be placed under the overhang of the second wireless device component 34.

Figure 21:
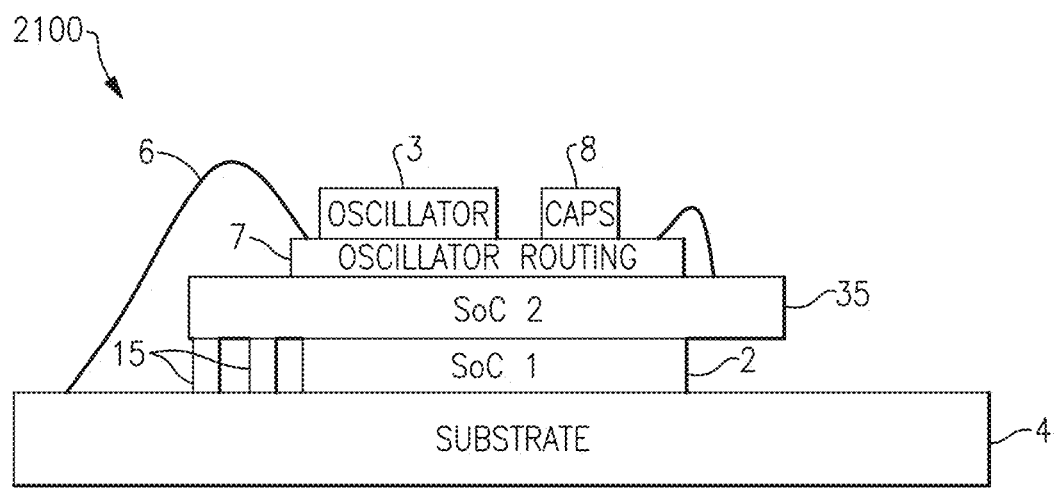
FIG. 21 is a cross section of a packaged module that includes a first integrated circuit, a second integrated circuit vertically integrated with the first integrated circuit and extending beyond a periphery of the first integrated circuit, and an oscillator assembly vertically integrated with the second integrated circuit, according to an embodiment.

FIG. 21 comprises another embodiment of a radio frequency packaged module 2100 for use in a wireless device. FIG. 21 illustrates a cross section of the packaged module 2100 that includes a first integrated circuit 2, a second integrated circuit 35 vertically integrated with the first integrated circuit 2 and extending beyond a periphery of the first integrated circuit 2, and an oscillator assembly 3 vertically integrated with the second integrated circuit 35 according to an embodiment. FIG. 21 is not necessarily drawn to scale.

A package substrate 4 supports the first integrated circuit 2, the second integrated circuit 35, and the oscillator assembly 3. The second integrated circuit 35 is interposed between the first integrated circuit 2 and the oscillator assembly 3. The first integrated circuit 2 is interposed between the second integrated circuit 35 and the package substrate 4.

As illustrated in FIG. 21, the packaged module 2100 further includes a routing substrate or interposer 7, one or more load capacitors 8, one or more wire bonds 6, and one or more supports 15. In an embodiment, the first integrated circuit 2 is a first system on a chip (SoC) and includes at least a portion of a baseband subsystem and the second integrated circuit 35 is second system on a chip (SoC). In an embodiment, the footprint of the second integrated circuit 35 is larger than the footprint of the first integrated circuit 2 such that at least a portion of the perimeter of the second integrated circuit 35 overhangs the first integrated circuit 2. The support 15 provides support to the second integrated circuit 35 under the overhang and between the second integrated circuit 35 and the package substrate 4.

Figure 22:
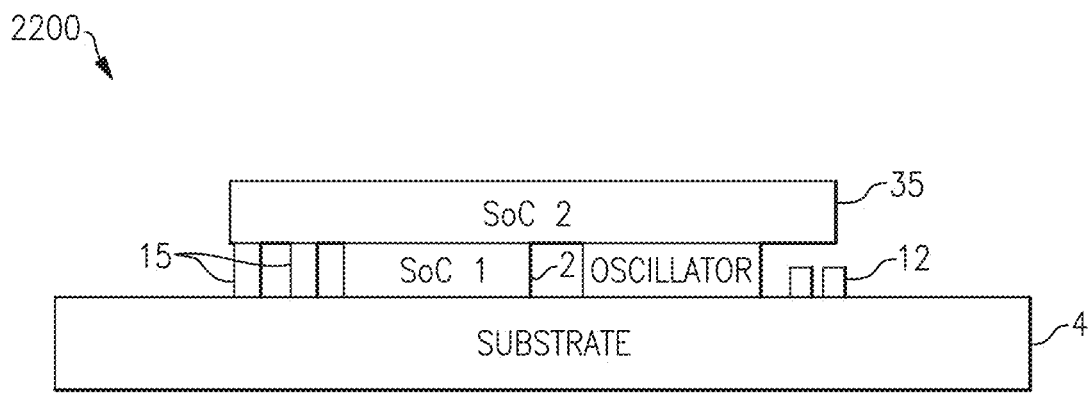
FIG. 22 is a cross section of a packaged module that includes a first integrated circuit, a second integrated circuit vertically integrated with the first integrated circuit and extending beyond a periphery of the first integrated circuit, and an oscillator assembly within the overhang formed by the second integrated circuit, according to an embodiment.

FIG. 22 comprises another embodiment of a radio frequency packaged module 2200 for use in a wireless device. FIG. 22 illustrates a cross section of the packaged module 2200 that includes a first integrated circuit 2, a second integrated circuit 35 vertically integrated with the first integrated circuit 2 and extending beyond a periphery of the first integrated circuit 2, and an oscillator assembly 3 within the overhang formed by the second integrated circuit 35 according to an embodiment. FIG. 22 is not necessarily drawn to scale.

A package substrate 4 supports the first integrated circuit 2, the second integrated circuit 35, and the oscillator assembly 3. The first integrated circuit 2 is interposed between the second integrated circuit 35 and the package substrate 4.

As illustrated in FIG. 22, the packaged module 2200 further includes one or more discrete components 12, such as load capacitors, and one or more supports 15. In an embodiment, the first integrated circuit 2 is a first system on a chip (SoC) and includes at least a portion of a baseband subsystem and the second integrated circuit 35 is second system on a chip (SoC). In an embodiment, the footprint of the second integrated circuit 35 is larger than the footprint of the first integrated circuit 2 such that at least a portion of the perimeter of the second integrated circuit 35 overhangs the first integrated circuit 2. The one or more supports 15 provide support to the second integrated circuit 35 under the overhang and between the second integrated circuit 35 and the package substrate 4. The oscillator assembly 3 is disposed between the second integrated circuit 35 and the substrate 4 and under the overhang formed by the second integrated circuit 35.

Figure 23:
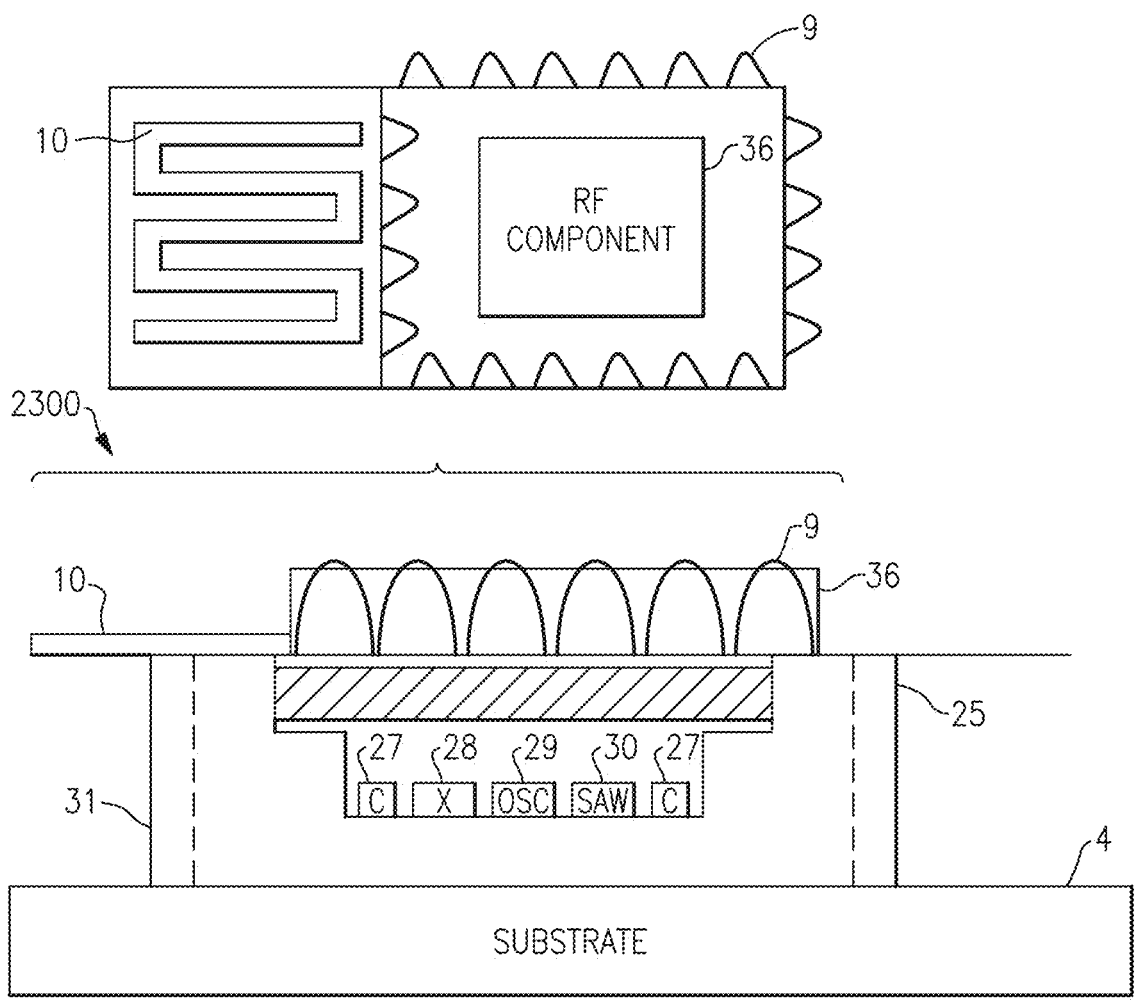
FIG. 23 is a cross section of a packaged module that an oscillator assembly having conductive pillars and a radio frequency integrated circuit within a radio frequency shielding structure and an antenna external to the radio frequency shielding structure that is vertically integrated with the oscillator assembly, according to an embodiment.

FIG. 23 comprises another embodiment of a radio frequency packaged module 2300 for use in a wireless device. FIG. 23 illustrates a cross section of the packaged module 2300 that includes an oscillator assembly 25 having conductive pillars 31 and an antenna in a package component. The antenna in a package component includes a radio frequency component 36 within a radio frequency shielding structure 9, and an antenna 10 external to the radio frequency shielding structure 9 that is vertically integrated with the oscillator assembly 25 according to an embodiment. FIG. 23 is not necessarily drawn to scale.

The packaged module 2300 includes a package substrate 4 that supports the oscillator assembly 25, the radio frequency component 36, and the antenna 10. The oscillator assembly 25 is interposed between the radio frequency component 36 and the package substrate 4.

As illustrated in FIG. 23, the oscillator assembly 25 further includes the one or more pillars 31, a lid 32, load capacitors 27, a crystal 28, oscillator circuitry 29, and one or more filters, such as surface acoustic wave (SAW) filter 32 disposed within a cavity formed within the oscillator assembly 25. Additional details of the oscillator assembly 25 are illustrated in FIGS. 10A1, 10A2, 10B1, 10B2, and 10C.

In an embodiment, the radio frequency component 36 is a radio frequency front end module (FEM) or front end integrated circuit (FEIC). The shielding structure 9 can include a shielding layer formed over the radio frequency component 36 such that the antenna 10 is unshielded opposite the common package substrate 4. In an embodiment, the oscillator assembly 25 generates clock signals used in the radio frequency component 36.

FIG. 23 also illustrates the radio frequency component 36, shielding structure 9, and antenna 10 without a top shielding layer in plan view. The radio frequency shielding structure 9 can shield the radio frequency component 36 from electromagnetic interference from the integrated antenna 10 and/or from other components outside of the radio frequency shielding structure 9. Alternatively or additionally, the radio frequency shielding structure 9 can shield the antenna 10 and/or other components from electromagnetic interference from the radio frequency component 36.

Accordingly, the antenna 10 can be integrated in the packaged module 2300 and the radio frequency shielding structure 9 can reduce electromagnetic interference between components of the packaged module 2300. In an embodiment, the pillars 31 formed within and along the side of the oscillator assembly are conductive and provide a ground path between the radio frequency shielding structure 9 and the package substrate 4. The radio frequency component 36, shielding structure 9, and antenna 10 may be implemented as described above with respect to FIGS. 3, 3A, and 3B.

Figure 24:
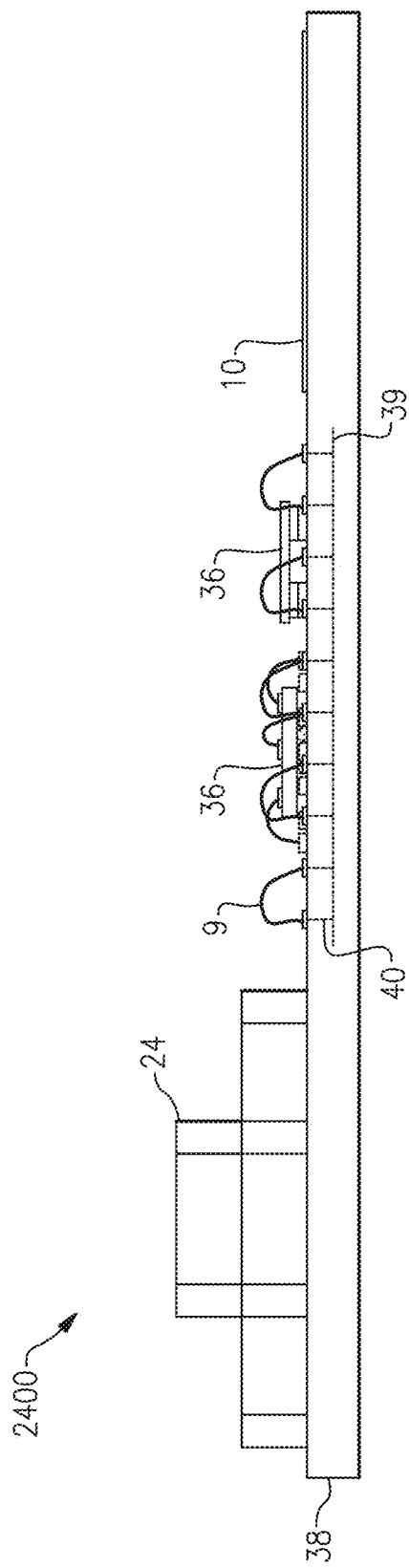
FIG. 24 is a cross section of a packaged module that includes a stacked filter assembly and a radio frequency integrated circuit within a radio frequency shielding structure and an antenna external to the radio frequency shielding structure, according to an embodiment.

FIG. 24 comprises another embodiment of a radio frequency packaged module 2400 for use in a wireless device. FIG. 24 illustrates a cross section of the packaged module 2400 that includes a stacked filter assembly 24 and an antenna in a package system. The antenna in a package system includes one or more radio frequency components 36 within a radio frequency shielding structure 9 and an antenna 10 external to the radio frequency shielding structure 9 according to an embodiment. FIG. 24 is not necessarily drawn to scale.

The radio frequency shielding structure 9 can shield the radio frequency components 36 from electromagnetic interference from the integrated antenna 10 and/or from other components outside of the radio frequency shielding structure 9. Alternatively or additionally, the radio frequency shielding structure 9 can shield the antenna 10 and/or other components from electromagnetic interference from the radio frequency components 36. The radio frequency component 36, shielding structure 9 and antenna 10 may be implemented as described above with respect to FIGS. 3, 3A, and 3B.

Accordingly, the antenna 10 can be integrated in the packaged module 2400 and the radio frequency shielding structure 9 can reduce electromagnetic interference between components of the packaged module 2400. In an embodiment, the one or more radio frequency components 36 form at least a portion of a radio frequency front end integrated circuit (FEIC) or a radio frequency front end module (FEM).

A multi-layer substrate 38 supports the stacked filter assembly 24 and the radio frequency components 36. The multi-layer substrate 38 includes the ground plane 39. Vias 40 can electrically connect the radio frequency shielding structure 9 to the ground plane 39. The stacked filter assembly 24 can filter a signal associated with the radio frequency components 36. In an embodiment, the stacked filter 24 assembly comprises surface mount discrete components, such as resistor, capacitors, and inductors. In an embodiment, the stacked filter assembly 24 is described above and illustrated in FIGS. 8A1, 8A2, 8B1, 8B2, 8C1, 8C2, 8D1, and 8D2.

Figure 25:
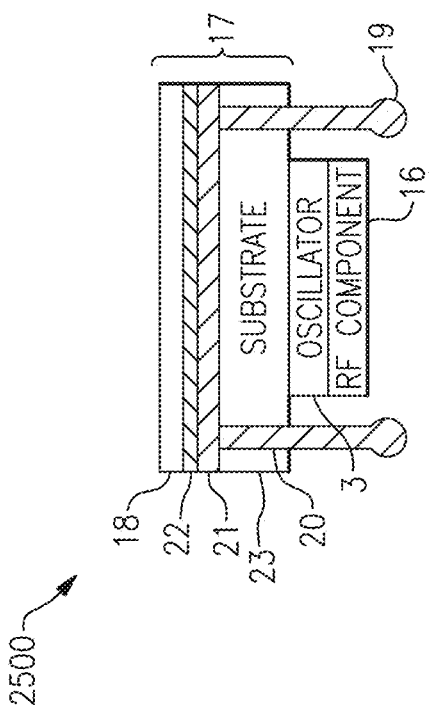
FIG. 25 is a cross section of a packaged module that includes an oscillator assembly comprising a crystal, for example, and a ground plane between an antenna and a front end system that is vertically integrated with the oscillator assembly, according to an embodiment.

FIG. 25 comprises another embodiment of a radio frequency packaged module 2500 for use in a wireless device. FIG. 25 illustrates a cross section of the packaged module 2500 that includes an oscillator assembly 3 and a ground plane 21 between an antenna 18 and a radio frequency component 16 that is vertically integrated with the oscillator assembly 3 according to an embodiment. FIG. 25 is not necessarily drawn to scale.

A multi-layer substrate 17 supports the radio frequency component 16 and the oscillator assembly 3 on a first side and includes the ground plane 21 and the antenna 18 on a second side. The oscillator assembly 3 is interposed between the radio frequency component 16 and the multi-layer substrate 17. The ground plane 21 is positioned between the antenna 18 and the radio frequency component 16. The ground plane 21 can shield the radio frequency component 16, the oscillator assembly 3, and other components of the packaged module 2500 from electromagnetic interference from the antenna 18. Alternatively or additionally, the ground plane 21 can shield the antenna 18 from electromagnetic interference from the radio frequency component 16 and the other components of the packaged module 2500. Accordingly, the antenna 18 can be integrated in the packaged module 2500 and the ground plane 21 can reduce electromagnetic interference between components of the packaged module 2500.

As illustrated in FIG. 25, the packaged module 2500 further includes an insulating layer 22 disposed between the antenna layer 18 and the ground plane 21, other layers 23 (e.g., including signal routing and/or passive components), vias 20 extending from the ground plane 21 to the first side of the multi-layer substrate 17, and solder bumps 19. Molding material, not shown, can encapsulate the packaged module 2500 and through mold vias can extend through the molding material. The antenna 18 may comprise a portion of an antenna in a package. Embodiments of the antenna in a package are described with respect to FIG. 7 above.

In an embodiment, the radio frequency component 16 is a radio frequency front end module (FEM) or front end integrated circuit (FEIC) and the oscillator assembly 3 is used to provide a clock signal for the radio frequency component 16.

Figure 26:
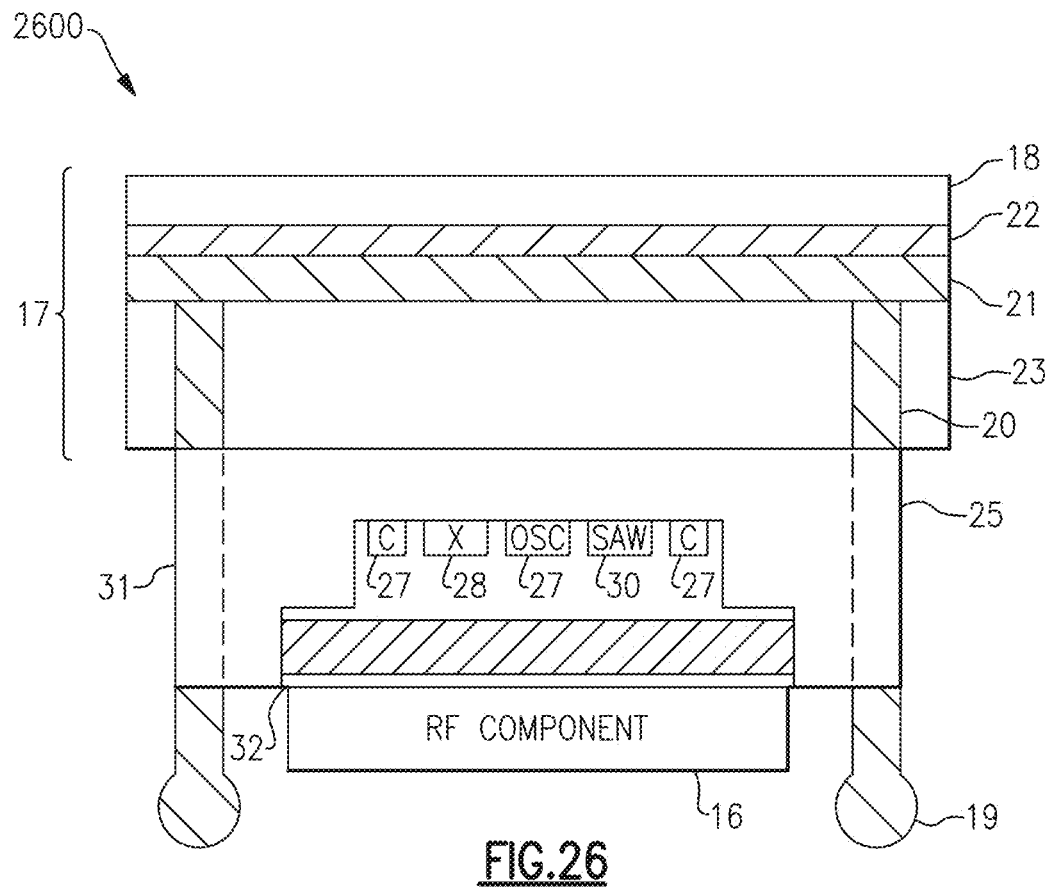
FIG. 26 is a cross section of a packaged module that includes an oscillator assembly having conductive pillars and a ground plane between an antenna and a front end system that is vertically integrated with the oscillator assembly, according to an embodiment.

FIG. 26 comprises another embodiment of a radio frequency packaged module 2600 for use in a wireless device. FIG. 26 illustrates a cross section of the packaged module 2600 that includes an oscillator assembly 25 having conductive pillars 31 and a ground plane 21 between an antenna 18 and a radio frequency component 16 that is vertically integrated with the oscillator assembly 25 according to an embodiment. FIG. 26 is not necessarily drawn to scale.

A multi-layer substrate 17 supports the radio frequency component 16 and the oscillator assembly 25 on a first side and includes the ground plane 21 and the antenna 18 on a second side. The oscillator assembly 25 is interposed between the radio frequency component 16 and the multi-layer substrate 17. The ground plane 21 is positioned between the antenna 18 and the radio frequency component 16. The ground plane 21 can shield the radio frequency component 16 and other components of the packaged module 2600 from electromagnetic interference from the antenna 18. Alternatively or additionally, the ground plane 21 can shield the antenna 18 from electromagnetic interference from the radio frequency component 16 and the other components of the packaged module 2600. Accordingly, the antenna 18 can be integrated in the packaged module 2600 and the ground plane 21 can reduce electromagnetic interference between components of the packaged module 2600. The antenna 18 may comprise a portion of an antenna in a package. Embodiments of the antenna in a package are described with respect to FIG. 7 above.

As illustrated in FIG. 26, the packaged module 2600 further includes an insulating layer 22 disposed between the antenna layer 18 and the ground plane 21, other layers 23 (e.g., including signal routing and/or passive components), vias 20 extending from the ground plane 21 to the first side of the multi-layer substrate 17, and solder bumps 19. Molding material, not shown, can encapsulate the packaged module 2600 and through mold vias can extend through the molding material. In an embodiment, the radio frequency component 16 is a radio frequency front end module (FEM) or front end integrated circuit (FEIC).

The oscillator assembly 25 further includes the one or more pillars 31, a lid 32, load capacitors 27, a crystal 28, oscillator circuitry 29, and one or more filters, such as surface acoustic wave (SAW) filter 32, disposed within a cavity formed within the oscillator assembly 25. Additional details of the oscillator assembly 25 are illustrated in FIGS. 10A1, 10A2, 10B1, 10B2, and 10C.

In an embodiment, the oscillator assembly 25 provides a clock signal for use with the radio frequency component 16. In an embodiment, the one or more conductive pillars 31 are in electrical communication with the vias 20 and the solder balls 19 to provide a ground path from the ground plane 21 to the solder balls 19.

Figure 27:
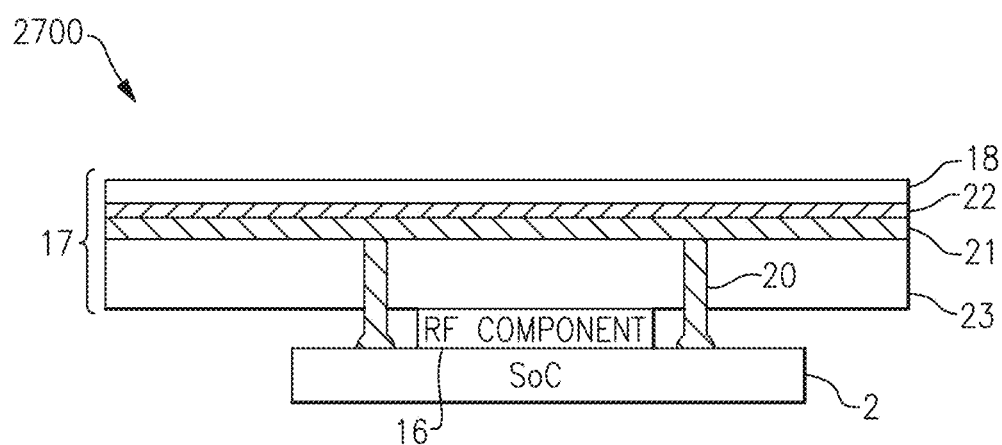
FIG. 27 is a cross section of a packaged module that includes a ground plane between an antenna and a front end system and a first integrated circuit that is vertically integrated with the radio frequency front end system, according to an embodiment.

FIG. 27 comprises another embodiment of a radio frequency packaged module 2700 for use in a wireless device. FIG. 27 illustrates a cross section of the cross section of a packaged module 2700 that includes a ground plane 21 between an antenna 18 and a radio frequency component 16, and a first integrated circuit 2 that is vertically integrated with the radio frequency component 16 according to an embodiment. FIG. 27 is not necessarily drawn to scale.

A multi-layer substrate 17 supports the radio frequency component 16 and the first integrated circuit 2 on a first side and includes the ground plane 21 and the antenna 18 on a second side. The radio frequency component 16 is interposed between the first integrated circuit 2 and the multi-layer substrate 17. The ground plane 21 is positioned between the antenna 18 and the radio frequency component 16. The antenna 18 may form a part of an antenna in a package system. Embodiments of an antenna in a package system are described above with respect to FIG. 7.

The ground plane 21 can shield the radio frequency component 16, the first integrated circuit 2, and other components of the packaged module 2700 from electromagnetic interference from the antenna 18. Alternatively or additionally, the ground plane 21 can shield the antenna 18 from electromagnetic interference from the radio frequency component 16, the first integrated circuit 2, and the other components of the packaged module 2700. Accordingly, the antenna 18 can be integrated in the packaged module 2700 and the ground plane 21 can reduce electromagnetic interference between components of the packaged module 2700.

As illustrated in FIG. 27, the packaged module 2700 further includes an insulating layer 22 disposed between the antenna layer 18 and the ground plane 21, other layers 23 (e.g., including signal routing and/or passive components), vias 20 extending from the ground plane 21 to the first side of the multi-layer substrate 17, and solder bumps 19. Molding material, not shown, can encapsulate the packaged module 2600 and through mold vias can extend through the molding material. In an embodiment, the radio frequency component 16 is a radio frequency front end module (FEM) or front end integrated circuit (FEIC) and the first integrated circuit is a system on a chip (SoC) and includes at least a portion of a baseband subsystem. The solder balls 19 are shown soldered to corresponding pads on the first integrated circuit 2. In an embodiment, the footprint of the first integrated circuit 2 is greater than the footprint of the radio frequency component 16 such that a periphery of the first integrated circuit 2 extends over the radio frequency component 16 to provide an overhang. Additional componentry can be placed between the first integrated circuit 2 and the multi-layer substrate 17 within the overhang and supported by the multi-layer substrate 17.

Wireless Communication Devices

Figure 28A:
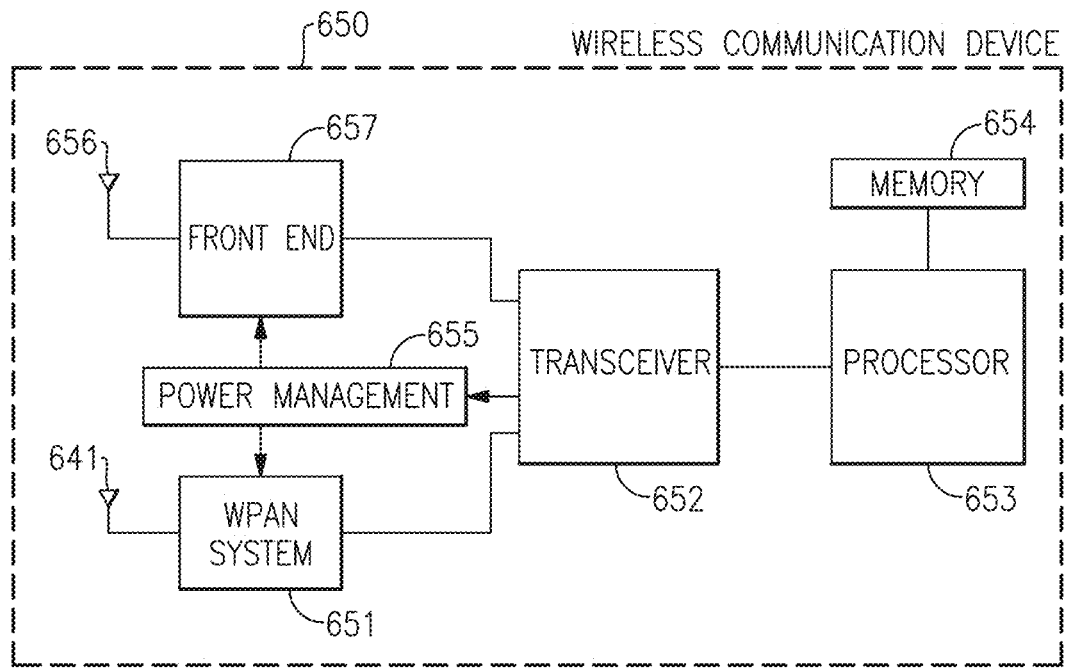
FIG. 28A is a schematic diagram of one example of a wireless communication device, according to an embodiment.

FIG. 28A is a schematic diagram of one example of a wireless communication device 650. The wireless communication device 650 includes a first antenna 641, a wireless personal area network (WPAN) system 651, a transceiver 652, a processor 653, a memory 654, a power management block 655, a second antenna 656, and a front end system 657.

Any of the suitable combination of features disclosed herein can be implemented in the wireless communication device 650. For example, the WPAN system 651 and/or the front end system 657 can be implemented in a radio frequency module using any of the features described above and/or in the sections below.

The WPAN system 651 is a front end system configured for processing radio frequency signals associated with personal area networks (PANs). The WPAN system 651 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process Wi-Fi signals.

Figure 28B:
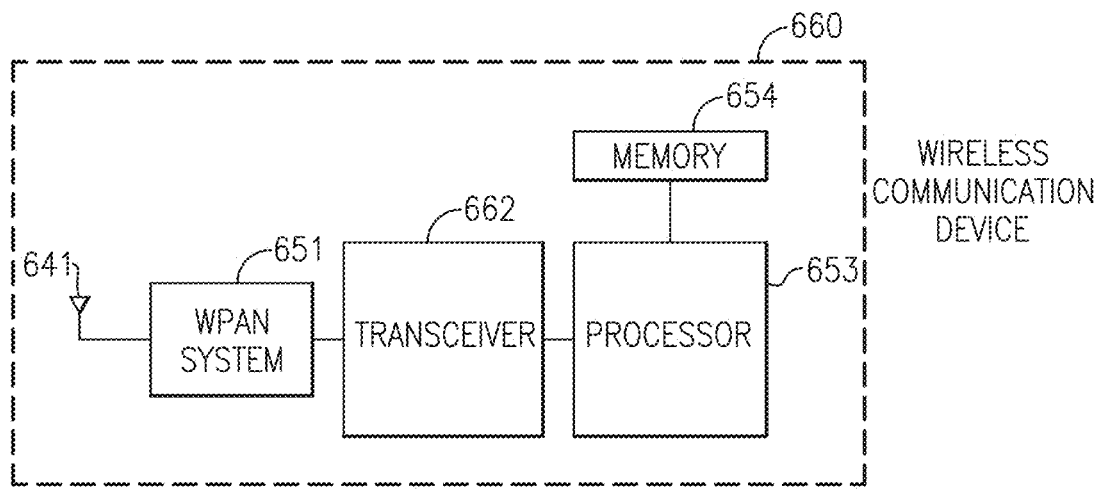
FIG. 28B is a schematic diagram of another example of a wireless communication device including a radio frequency module, according to an embodiment.

FIG. 28B is a schematic diagram of another example of a wireless communication device 660. The illustrated wireless communication device 660 of FIG. 39B is a device configured to communicate over a PAN. This wireless communication device 660 can be relatively less complex than the wireless communication device 650 of FIG. 28A. As illustrated, the wireless communication device 660 includes an antenna 641, a WPAN system 651, a transceiver 662, a processor 653, and a memory 654. The WPAN system 660 can include any suitable combination of features disclosed herein. For example, the WPAN system 651 can be implemented in a radio frequency module using any of the features described above and/or in the sections below.

FIG. 29A is a schematic diagram of another example of a wireless communication device 810. The wireless communication device 810 includes a baseband system 801, a transceiver 802, a front-end system 803, one or more antennas 804, a power management system 805, a memory 806, a user interface 807, and a battery 808.

The wireless communication device 810 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMAX), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 29A as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes one or more power amplifiers (PAs) 811, one or more low noise amplifiers (LNAs) 812, one or more filters 813, one or more switches 814, and one or more duplexers 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Any of the suitable combination of features disclosed herein can be implemented in the wireless communication device 810. For example, the front end system 803 can be implemented in a radio frequency module using any of the features described above and/or in the sections below.

In certain implementations, the wireless communication device 810 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 810 can operate with beamforming in certain implementations. For example, the front-end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 39C, the baseband system 801 is coupled to the memory 806 of facilitate operation of the wireless communication device 810.

The memory 806 can be used for a wide variety of purposes, such as storing data and/or instructions to facilitate the operation of the wireless communication device 810 and/or to provide storage of user information.

The power management system 805 provides a number of power management functions of the wireless communication device 810. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 29A, the power management system 805 receives a battery voltage from the battery 808. The battery 808 can be any suitable battery for use in the wireless communication device 810, including, for example, a lithium-ion battery.

FIG. 29B illustrates an example of a system board assembly for use in wireless devices, such as, but not limited to, wireless device 650, 660, 810 and 4000. Any suitable principles and advantages associated with these system board assemblies can be implemented with any of the RF modules discussed herein. FIG. 29B illustrates a system board assembly 2240 with RF module 2210 and other component(s) 2242 disposed on a system board 2244 according to an embodiment. The system board 2244 can be any suitable application board, such as a phone board for a mobile phone. The RF module 2210 can be, but not limited to the RF modules 100, 200, 300, 400, 500, 600, 700, 800, 900, 1000, 1100, 1200, 1300, 1400, 1500, 1600, 1700, 1800, 1900, 2000, 2100, 2200, 2300, 2400, 2500, 2600, and 2700. The other component(s) 2242 can include any other circuitry on the system board 2244, such as other RF circuitry, a baseband processor, memory, load capacitors associated with a crystal, pre-filters, post filters modulators, demodulators, down converters, the like, or any suitable combination thereof. The system board assembly 2240 further includes connectivity to provide signal interconnections, packaging, such as for example, an overmold, and the like.

FIG. 30 is an example block diagram illustrating a wireless device 4000 including a SiP 4100, where the SiP 4100 includes a SoC 4102, an FEIC 4104, and a crystal 4108. In an embodiment, the wireless device 4000 includes a portable transceiver 4000. In an embodiment, SoC 4102 includes a baseband subsystem 4010, receiver 4070, and transmitter 4050. The crystal 4108 supplies clock information for the SoC 4102. In an embodiment, SiP 4100 includes any suitable features of one or more of the SiPs 200, 300, 400, 500, 600, 700, 800, 900, 1000, 1100, 1200, 1300, 1400, 1500, 1600, 1700, 1800, 1900, 2000, 2100, 2200, 2300, 2400, 2500, 2600 or 2700.

The illustrated wireless device 4000 includes a speaker 4002, a display 4004, a keyboard 4006, and a microphone 4008, all connected to the baseband subsystem 4010. A power source 4042, which may be a direct current (DC) battery or other power source, is also connected to the baseband subsystem 4010 to provide power to the wireless device 4000. In a particular embodiment, wireless device 4000 can be, for example but not limited to, a portable telecommunication device such as a mobile cellular telephone. The speaker 4002 and the display 4004 receive signals from baseband subsystem 4010. Similarly, the keyboard 4006 and the microphone 4008 supply signals to the baseband subsystem 4010. The keyboard 4006 can be implemented by a touch screen displayed by the display 4004 in certain implementations.

The baseband subsystem 4010 includes a microprocessor (μP) 4020, memory 4022, analog circuitry 4024, and a digital signal processor (DSP) 4026 in communication by way of bus 4028. Bus 4028, although shown as a single bus, may be implemented using multiple busses connected as desired among the subsystems within the baseband subsystem 4010. The baseband subsystem 4010 may also include one or more of an application specific integrated circuit (ASIC) 4032 or a field programmable gate array (FPGA) 4030.

The microprocessor 4020 and memory 4022 provide the signal timing, processing, and storage functions for wireless device 4000. The analog circuitry 4024 provides the analog processing functions for the signals within baseband subsystem 4010. In FIG. 107, the baseband subsystem 4010 provides control signals to a transmitter 4050, a receiver 4070, and a power amplifier circuit 4080.

A wireless device can include more or fewer components than illustrated in FIG. 30. The control signals provided by the baseband subsystem 4010 control the various components within the wireless device 4000. The function of the transmitter 4050 and the receiver 4070 may be integrated into a transceiver.

The illustrated baseband subsystem 4010 also includes an analog-to-digital converter (ADC) 4034 and digital-to-analog converters (DACs) 4036 and 4038. In this example, the DAC 4036 generates in-phase (I) and quadrature-phase (Q) signals provided to signal lines 4040 connected to a modulator 4052. The ADC 4034, the DAC 4036, and the DAC 4038 also communicate with the microprocessor 4020, the memory 4022, the analog circuitry 4024, and the DSP 4026 by way of bus 4028. The DAC 4036 converts the digital communication information within baseband subsystem 4010 into an analog signal for transmission to the modulator 4052 by way of connection 4040. Connection 4040, while shown as two directed arrows, carries the information that is to be transmitted by the transmitter 4050 after conversion from the digital domain to the analog domain.

The transmitter 4050 includes the modulator 4052, which modulates the analog information on connection 4040 and provides a modulated signal to upconverter 4054. The upconverter 4054 transforms the modulated signal to an appropriate transmit frequency and provides the upconverted signal to the power amplifier circuit 4080. The power amplifier circuit 4080 amplifies the signal to an appropriate power level for the system in which the wireless device 4000 is designed to operate.

The data on connection 4040 is generally formatted by the baseband subsystem 4010 into in-phase (I) and quadrature (Q) components. The I and Q components may take different forms and be formatted differently depending upon the communication standard being employed.

The front-end module 4104 includes the power amplifier (PA) circuit 4080 and a switch/low noise amplifier (LNA) circuit 4072 including a low noise amplifier. In an embodiment, the switch/low noise amplifier circuit 4072 further includes an antenna system interface that may include, for example, a diplexer (or a duplexer) having a filter pair that allows simultaneous passage of both transmit signals and receive signals.

The power amplifier circuit 4080 supplies the amplified transmit signal to the switch/low noise amplifier circuit 4072. The amplified transmit signal is supplied from the front-end module 4004 to the antenna 4060 when the switch is in the transmit mode.

A signal received by antenna 4060 will be provided from the switch/low noise amplifier circuit 4072 of the front-end module 4004 to the receiver 4070 when the switch is in the receive mode. The low noise amplifier amplifies the received signal.

If implemented using a direct conversion receiver (DCR), the downconverter 4074 converts the amplified received signal from an RF level to a baseband level (e.g., to a direct current (DC) level), or a near-baseband level (e.g., approximately 100 kHz). Alternatively, the amplified received RF signal may be downconverted to an intermediate frequency (IF) signal in certain applications. The downconverted signal is provided to the filter 4076. The filter 4076 includes at least one filter stage to filter the received downconverted signal.

The filtered signal is sent from the filter 4076 to the demodulator 4078. The demodulator 4078 recovers the transmitted analog information and supplies a signal representing this information by way of connection 4086 to the ADC 4034. The ADC 4034 converts the analog information to a digital signal at baseband frequency and the signal propagates by way of bus 4028 to the DSP 4026 for further processing.

Many other variations of radio frequency modules than those described herein will be apparent from this disclosure. Different combinations of the components illustrated in SiPs 200, 300, 400, 500, 600, 700, 800, 900, 1000, 1100, 1200, 1300, 1400, 1500, 1600, 1700, 1800, 1900, 2000, 2100, 2200, 2300, 2400, 2500, 2600 or 2700 are possible to form a variety of SiPs that can be used in wireless devices to provide smaller footprints, reduced parasitic capacitance, decreased signal cross-coupling, the like, or any combination thereof.

Internet of Things Applications

One example application of the radio frequency modules herein is to enable various objects with wireless connectivity, such as for Internet of things (IoT). IoT refers to a network of objects or things, such as devices, vehicles, and/or other items that are embedded with electronics that enable the objects to collect and exchange data (for instance, machine-to-machine communications) and/or to be remotely sensed and/or controlled. The front end systems, embodied in radio frequency modules herein, can be used to enable wireless connectivity of various objects, thereby allowing such objects to communicate in an IoT network. The radio frequency modules discussed herein can be implemented in IoT applications to enable wireless connectivity to expand the way consumers manage information and their environment. Such radio frequency modules can enable the new and emerging IoT applications, which can bring people and things closer to vital information wherever it is desired. Although IoT is one example application of radio frequency modules herein, the teachings herein are applicable to a wide range of technologies and applications. Some example IoT applications will now be discussed.

IoT devices can be implemented in automotive systems. From telematics to infotainment systems, lighting, remote keyless entry, collision avoidance platforms, toll transponders, video displays, vehicle tracking tools, and the like, front end systems in accordance with any suitable principles and advantages discussed herein can help enable convenience and safety features for the connected vehicle.

IoT devices can be implemented in connected home environments. Front end systems in accordance with any suitable principles and advantages discussed herein can allow homeowners greater control over their home environment. IoT devices can be implemented in a host of devices including smart thermostats, security systems, sensors, light switches, smoke and carbon monoxide alarms, routers, high definition televisions, gaming consoles and much more.

IoT devices can be implemented in industrial contexts. From smart city applications to factory automation, building controls, commercial aircraft, vehicle tracking, smart metering, LED lighting, security cameras, and smart agriculture functions, front ends systems in accordance with any suitable principles and advantages discussed herein can enable these applications and meet specifications.

IoT devices can be implemented in machine-to-machine contexts. IoT devices can enable machine-to-machine communications that can transform the way organizations do business. From manufacturing automation to telemetry, remote control devices, and asset management, radio frequency modules discussed herein can provide cellular, short-range, and global positioning solutions that support a wide range of machine-to-machine applications.

IoT devices can be implemented in medical applications. radio frequency modules in accordance with any suitable principles and advantages discussed herein can enable medical devices and the communication of information that is improving the care of millions of people worldwide. Radio frequency modules in accordance with any suitable principles and advantages discussed herein can be integrated into product designs that enable the miniaturization of medical devices and enhance data transmission.

IoT devices can be implemented in mobile devices. The communication landscape has changed in recent years as consumers increasingly seek to be connected everywhere and all the time. Radio frequency modules in accordance with any suitable principles and advantages discussed herein can be compact, energy and cost efficient, meeting size and performance constraints, while enabling a great consumer experience. Wireless mobile devices, such as smartphones, tablets and WLAN systems, can include a radio frequency module in accordance with any suitable principles and advantages discussed herein.

IoT devices can be implemented in smart energy applications. Utility companies are modernizing their systems using computer-based remote control and automation that involves two-way communication. Some benefits to utilities and consumers include optimized energy efficiency, leveling and load balancing on the smart grid. Radio frequency modules in accordance with any suitable principles and advantages discussed herein can be implemented in smart meters, smart thermostats, in-home displays, ZigBee/ 802.15.4, Bluetooth, and Bluetooth low energy applications.

IoT devices can be implemented in wearable devices. Wearable devices, such as smartwatches, smart eyewear, fitness trackers and health monitors, can include radio frequency modules in accordance with any suitable principles and advantages discussed herein to enable relatively small form factor solutions that consume relatively low power and enable always on connectivity. This can allow applications to run in the background for lengthy periods of time without a battery recharge, for example.

Any suitable principles and advantages discussed herein can implemented in an IoT network, IoT object, a vehicle, industrial equipment, a corresponding front end system, a corresponding radio frequency module, a corresponding circuit board, the like, or any suitable combination thereof. Some examples will now be discussed.

Figure 31:
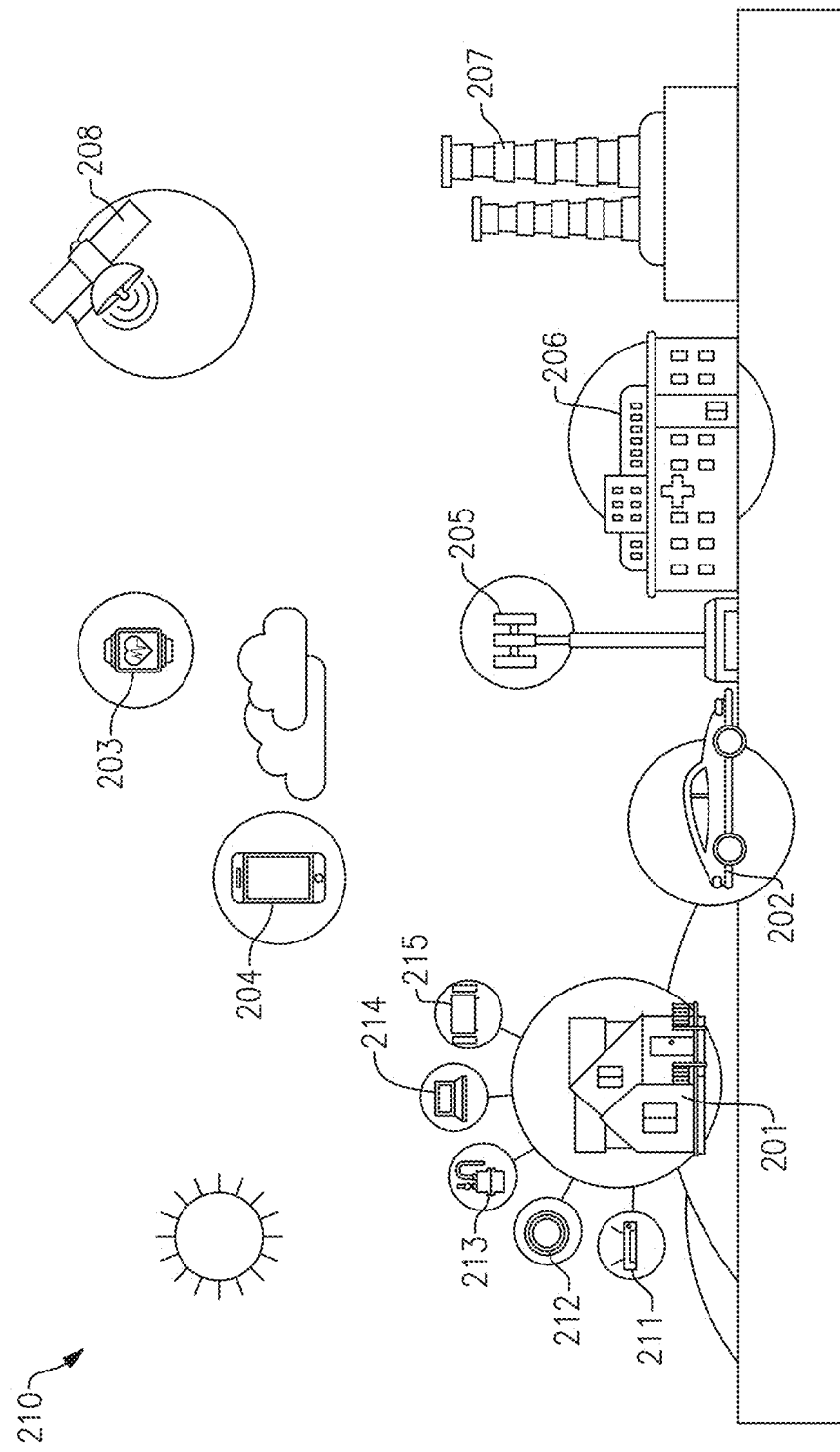
FIG. 31 is a schematic diagram of one example of an Internet of things (IoT) network, according to an embodiment.

FIG. 31 is a schematic diagram of one example of an IoT network 210. The IoT network 210 includes a smart home 201, a smart vehicle 202, a wearable 203, a mobile device 204, a base station 205, a smart hospital 206, a smart factory 207, and a smart satellite 208. One or more of the IoT-enabled objects of FIG. 31 can include a radio frequency module including a front end system, such as a front end module and/or front-end integrated circuit, implemented in accordance with the teachings herein.

The smart home 201 is depicted as including a wide variety of IoT-enabled objects, including an IoT-enabled router 211, an IoT-enabled thermostat 212, an IoT-enabled meter 213, IoT-enabled laptop 214, and an IoT-enabled television 215. Although various examples of IoT-enable objects for a smart home are shown, a smart home can include a wide variety of IoT-enabled objects. Examples of such IoT-enabled objects include, but are not limited to, an IoT-enabled computer, an IoT-enabled laptop, an IoT-enabled tablet, an IoT-enabled computer monitor, an IoT-enabled television, an IoT-enabled media system, an IoT-enabled gaming system, an IoT-enabled camcorder, an IoT-enabled camera, an IoT-enabled modem, an IoT-enabled router, an IoT-enabled kitchen appliance, an IoT-enabled telephone, an IoT-enabled air conditioner, an IoT-enabled washer, an IoT-enabled dryer, an IoT-enabled copier, an IoT-enabled facsimile machine, an IoT-enabled scanner, an IoT-enabled printer, an IoT-enabled scale, an IoT-enabled home assistant (for instance, a voice-controlled assistant device), an IoT-enabled security system, an IoT-enabled thermostat, an IoT-enabled smoke detector, an IoT-enabled garage door, an IoT-enabled lock, an IoT-enabled sprinkler, an IoT-enabled water heater, and/or an IoT-enabled light.

As shown in FIG. 31, the smart vehicle 202 also operates in the IoT network 200. The smart vehicle 202 can include a wide variety of IoT-enabled objects, including, but not limited to, an IoT-enabled infotainment system, an IoT-enabled lighting system, an IoT-enabled temperature control system, an IoT-enabled lock, an IoT-enabled ignition, an IoT-enabled collision avoidance system, an IoT-enabled toll transponder, and/or an IoT-enabled vehicle tracking system. In certain implementations, the smart vehicle 202 can communicate with other smart vehicles to thereby provide vehicle-to-vehicle (V2V) communications. Furthermore, in certain implementations the smart vehicle 202 can operate using vehicle-to-everything (V2X) communications, thereby communicating with traffic lights, toll gates, and/or other IoT-enabled objects.

The wearable 203 of FIG. 31 is also IoT-enabled. Examples of IoT-enabled wearables include, but are not limited to, an IoT-enabled watch, an IoT-enabled eyewear, an IoT-enabled fitness tracker, and/or an IoT-enabled biometric device.

The IoT network 210 also includes the mobile device 204 and base station 205. Thus, in certain implementations user equipment (UE) and/or base stations of a cellular network can operate in an IoT network and be IoT-enabled. Furthermore, a wide variety of IoT-enabled objects can communication using existing network infrastructure, such as cellular infrastructure.

With continuing reference to FIG. 31, IoT is not only applicable to consumer devices and objects, but also to other applications, such as medical, commercial, industrial, aerospace, and/or defense applications. For example, the smart hospital 206 can include a wide variety of IoT-enabled medical equipment and/or the smart factory 207 can include a wide variety of IoT-enabled industrial equipment. Furthermore, airplanes, satellites, and/or aerospace equipment can also be connected to an IoT network. Other examples of IoT applications include, but are not limited to, asset tracking, fleet management, digital signage, smart vending, environmental monitoring, city infrastructure (for instance, smart street lighting), toll collection, and/or point-of-sale.

Although various examples of IoT-enabled objects are illustrated in FIG. 31, an IoT network can include a wide variety of types of objects. Furthermore, any number of such objects can be present in an IoT network. For instance, an IoT network can include millions or billions of IoT-enable objects or things.

IoT-enabled objects can communicate using a wide variety of communication technologies, including, but not limited to, Bluetooth, ZigBee, Z-Wave, 6LowPAN, Thread, Wi-Fi, NFC, Sigfox, Neul, and/or LoRaWAN technologies. Furthermore, certain IoT-enabled objects can communicate using cellular infrastructure, for instance, using 2G, 3G, 4G (including LTE, LTE-Advanced, and/or LTE-Advanced Pro), and/or 5G technologies.

Figure 32A:
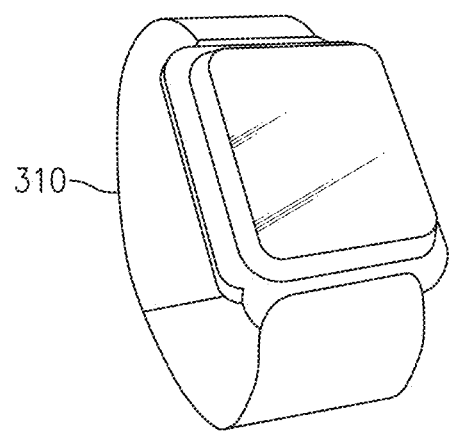
FIG. 32A is a schematic diagram of one example of an IoT-enabled watch, according to an embodiment.

FIG. 32A is a schematic diagram of one example of an IoT-enabled watch 310. The IoT-enabled watch 310 illustrates one example of a smart wearable that can include a radio frequency module implemented in accordance with one or more features disclosed herein.

Figure 32B:
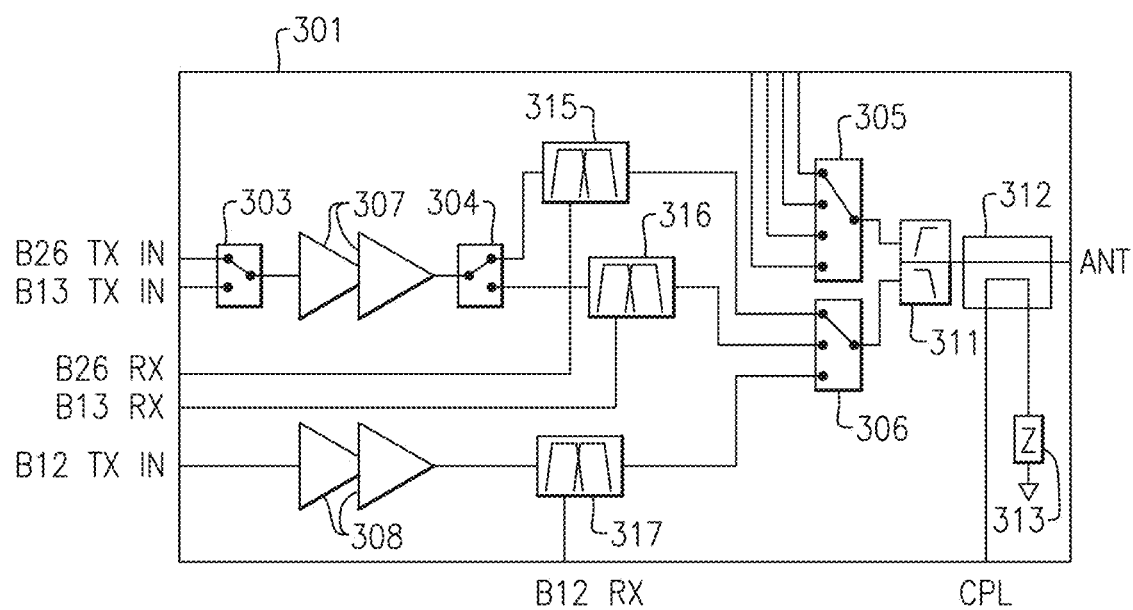
FIG. 32B is a schematic diagram of one example of a front end system for an IoT-enabled object, according to an embodiment.

FIG. 32B is a schematic diagram of one example of a front end system 301 for an IoT-enabled object, such as the IoT-enabled watch 310 of FIG. 32A. The front end system 301 includes a first transceiver-side switch 303, a second transceiver-side switch 304, a first antenna-side switch 305, a second antenna-side switch 306, a first power amplifier 307, a second power amplifier 308, a duplexer 311, a directional coupler 312, a termination impedance 313, a first band selection filter 315, a second band selection filter 316, and a third band selection filter 317.

In the illustrated embodiment, the first transceiver-side switch 303 selects between a Band 26 transmit input pin (B26 TX IN) and a Band 13 transmit input pin (B13 TX IN). The second transceiver-side switch 303 controls connection of the output of the first power amplifier 307 to the first band selection filter 315 or the first band selection filter 316. Thus, the first power amplifier 307 selectively amplifies Band 26 or Band 13, in this example. Additionally, the second power amplifier 308 amplifies a Band 12 transmit input pin (B12 TX IN). After suitable filtering by the band selection filters 315-317, the second antenna-side switch 306 selects a desired transmit signal for providing to an antenna pin (ANT) via the duplexer 311 and the directional coupler 312. As shown in FIG. 32B, the directional coupler 312 is terminated by the termination impedance 313. Additionally, the first antenna-side switch 305 provides a signal received on the antenna pin (ANT) to a desired receive output pin (four in this example) of the front end system 301. The illustrated front end system 301 also includes various additional pins to provide additional functionality, such as enhanced monitoring of transmit power. For instance, front end system 301 includes a directional coupler output pin (CPL), and feedback pins (B12 RX, B13 RX, and B26 RX) for providing feedback signals associated with transmit signals (for Band 12, Band 13, and Band 26, respectively) generated by the power amplifiers.

The front end system 301 can be implemented in a radio frequency module that can incorporate one or more features described in the sections herein.

Figure 33A:
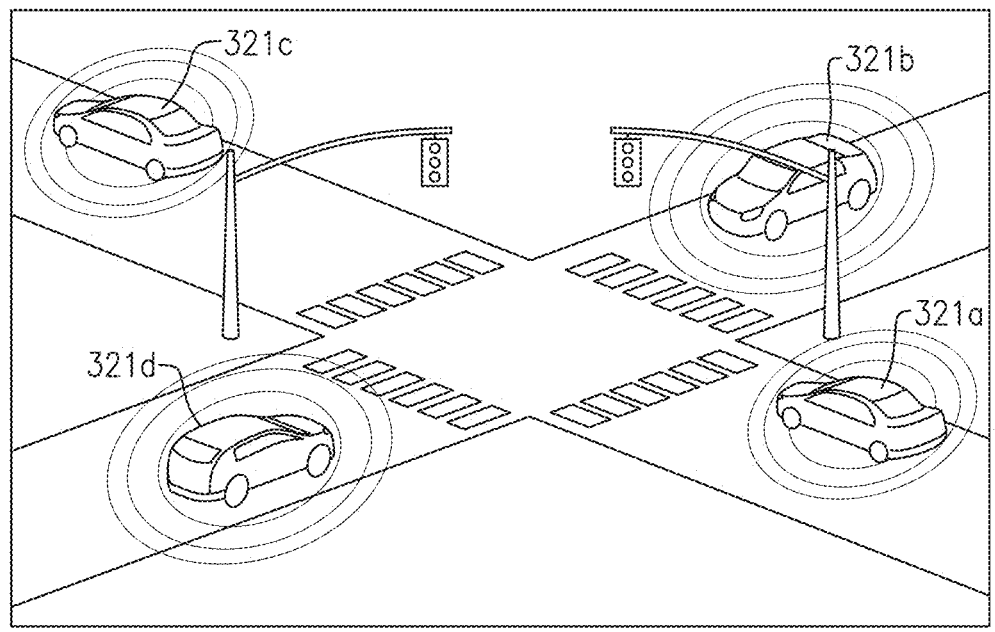
FIG. 33A is a schematic diagram of one example of IoT-enabled vehicles, according to an embodiment.

FIG. 33A is a schematic diagram of one example of IoT-enabled vehicles 321a-321d. Each of the IoT-enabled vehicles 321a-321d includes a radio frequency module for enabling wireless vehicle-to-vehicle communications. The IoT-enabled vehicles 321a-321d can include a radio frequency module implemented in accordance with one or more features disclosed herein.

Figure 33B:
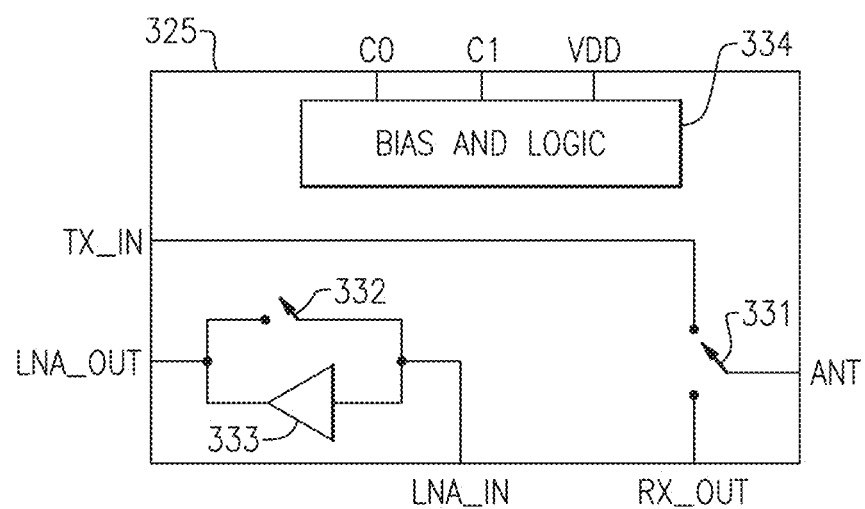
FIG. 33B is a schematic diagram of another example of a front end system for an IoT-enabled object, according to an embodiment.

FIG. 33B is a schematic diagram of another example of a front end system 325 for an IoT-enabled object. The front end system 325 includes an antenna-side switch 331, a bypass switch 332, an LNA 333, and a bias and logic circuit 334.

The front end system 325 includes control pins (C0 and C1) for controlling the front end system 325 and a supply voltage pin (VDD) for powering the front end system 325. The antenna-side switch 331 selectively connects an antenna pin (ANT) to a transmit signal pin (TX_IN) or a receive signal pin (RX_OUT). The LNA 333 includes an input connected to an LNA input pin (LNA_IN) and an output connected to the LNA output pin (LNA_OUT). The LNA 333 is selectively bypassed by the bypass switch 332. Using external conductors and components, the LNA input pin (LNA_IN) can be connected to the receive signal pin (RX_OUT) either directly or indirectly (for instance, via a filter or other components). Furthermore, an external power amplifier can provide a transmit signal to the transmit signal pin (TX_IN).

The front end system 325 can be implemented in a radio frequency module that can incorporate one or more features described in the sections herein.

Figure 34A:
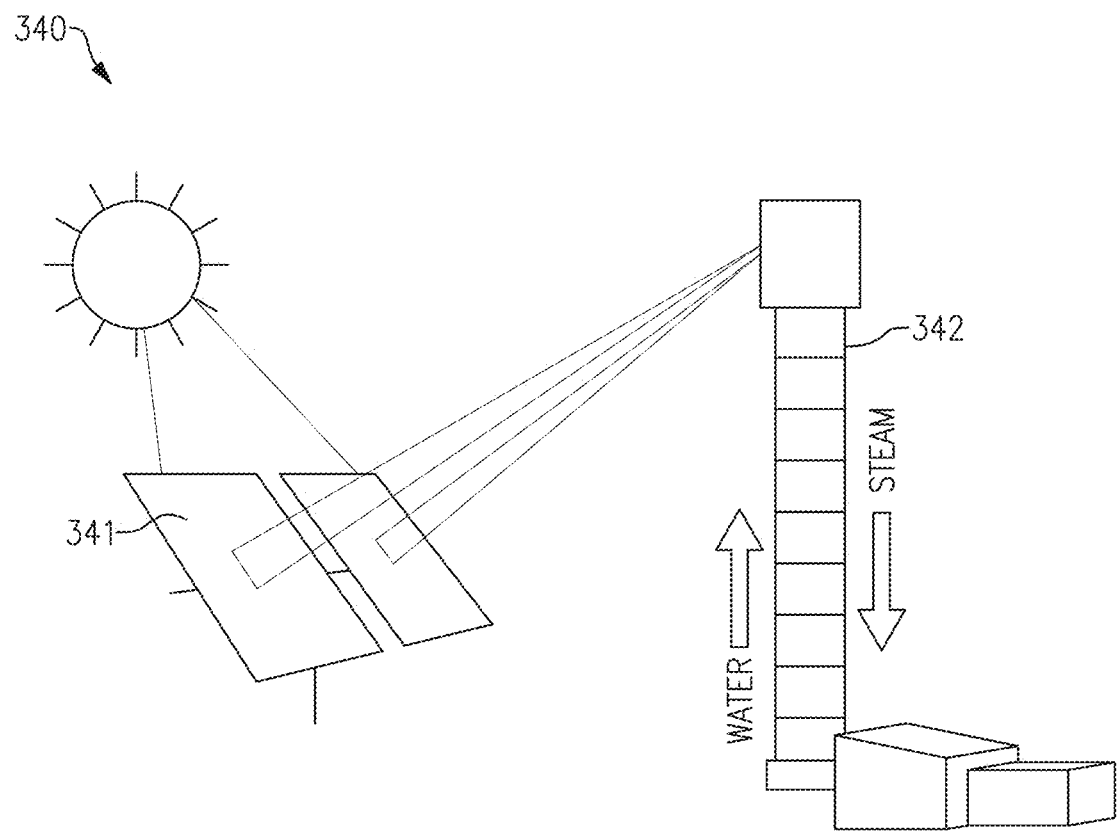
FIG. 34A is a schematic diagram of one example of IoT-enabled industrial equipment, according to an embodiment.

FIG. 34A is a schematic diagram of one example of IoT-enabled industrial equipment 340. In the illustrated embodiment, the IoT-enabled industrial equipment 340 includes heliostats 341 for reflecting light to a solar receiver and turbine 342. The IoT-enabled industrial equipment 340 can include one or more radio frequency modules for a variety of purposes, such as providing angular positional control of the heliostats 341 to control concentration of solar energy directed toward the solar receiver and turbine 342. The IoT-enabled industrial equipment 340 can include a radio frequency module implemented in accordance with one or more features disclosed herein.

Figure 34B:
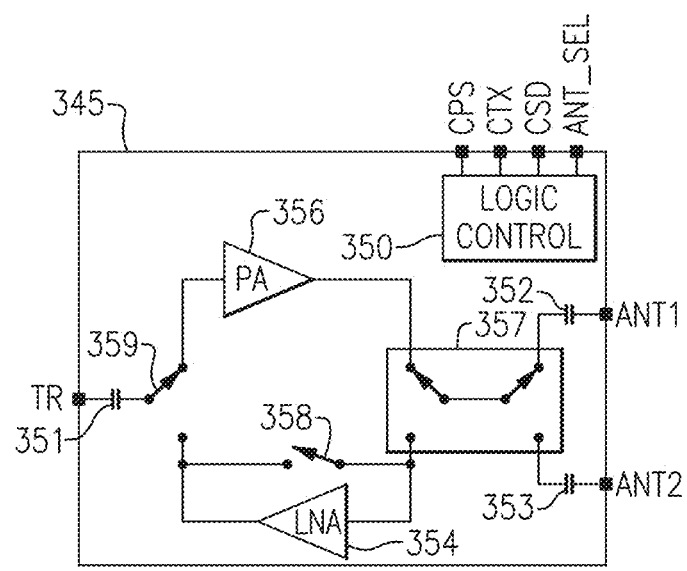
FIG. 34B is a schematic diagram of another example of a front end system for an IoT-enabled object, according to an embodiment.

FIG. 34B is a schematic diagram of another example of a front end system 345 for an IoT-enabled object, such as the IoT-enabled industrial equipment 340 of FIG. 34A.

The front end system 345 includes a logic control circuit 350, a transceiver DC blocking capacitor 351, a first antenna DC blocking capacitor 352, a second antenna DC blocking capacitor 353, an LNA 354, a power amplifier 356, an antenna-side switch 357, a bypass switch 358, and a transceiver-side switch 359.

The front end system 345 includes control pins (CPS, CTX, CSD, ANT SEL) for controlling the front end system 345. The antenna-side switch 357 selectively connects either a first antenna pin (ANT1) or a second antenna pin (ANT2) to either an output of the power amplifier 356 or the bypass switch 358/input to the LNA 354. Additionally, the bypass switch 358 selectively bypasses the LNA 354. Furthermore, the transceiver-side switch 359 selectively connected the transceiver pin (TR) to either an input of the power amplifier 356 or the bypass switch 358/output to the LNA 354. The DC blocking capacitors 351-353 serve to provide DC blocking to provide enhanced flexibility in controlling internal DC biasing of the front end system 345.

The front end system 345 can be implemented in a radio frequency module that can incorporate one or more features described in the sections herein.

Figure 35A:
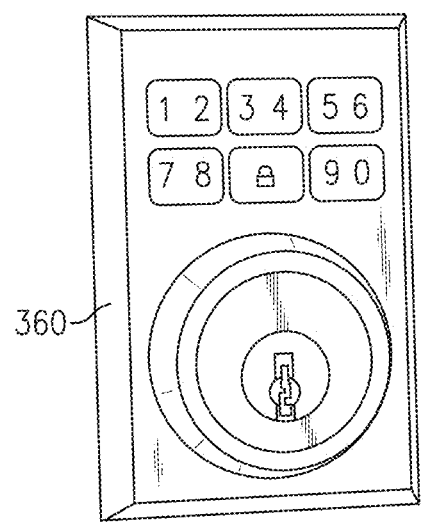
FIG. 35A is a schematic diagram of one example of an IoT-enabled lock, according to an embodiment.

FIG. 35A is a schematic diagram of one example of an IoT-enabled lock 360. The IoT-enabled lock 360 illustrates one example of an IoT-enabled object that can include a radio frequency module implemented in accordance with one or more features disclosed herein.

Figure 35B:
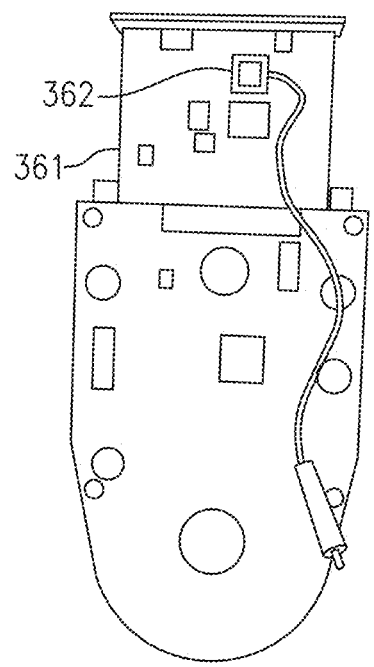
FIG. 35B is a schematic diagram of one example of a circuit board for the IoT-enabled lock of FIG. 35A, according to an embodiment.

FIG. 35B is a schematic diagram of one example of a circuit board 361 for the IoT-enabled lock 360 of FIG. 35A. The circuit board 361 includes a front end system 362, which can be implemented in a radio frequency module that can incorporate one or more features described in the sections herein.

Figure 36A:
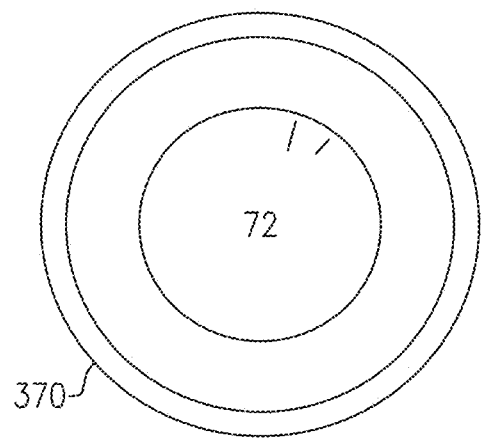
FIG. 36A is a schematic diagram of one example of an IoT-enabled thermostat, according to an embodiment.

FIG. 36A is a schematic diagram of one example of IoT-enabled thermostat 370. The IoT-enabled thermostat 370 illustrates another example of an IoT-enabled object that can include a radio frequency module implemented in accordance with one or more features disclosed herein.

Figure 36B:
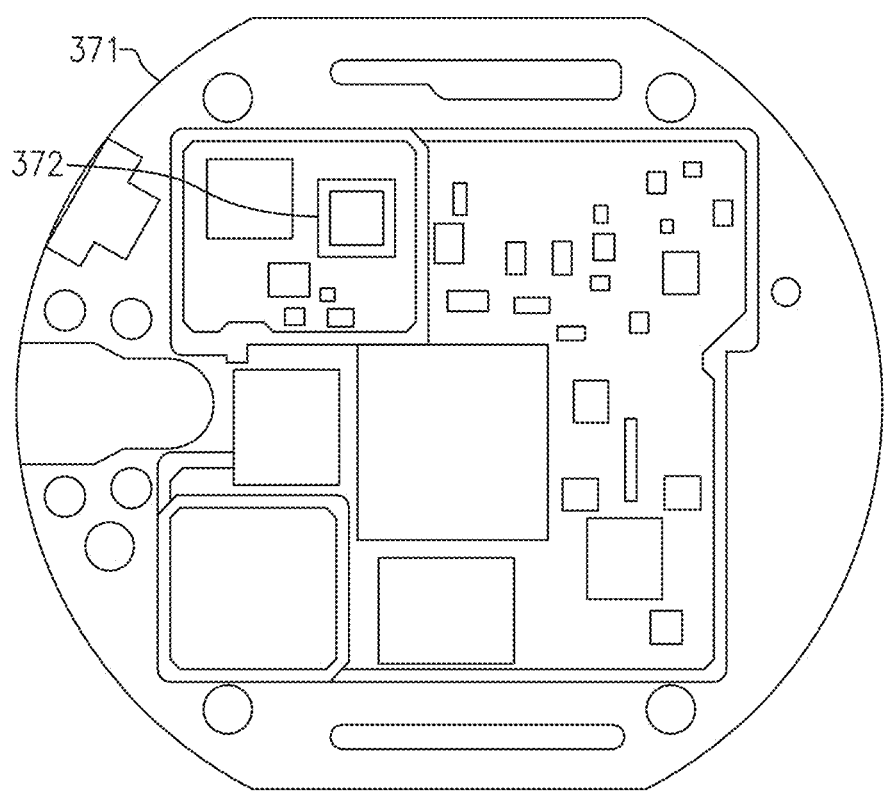
FIG. 36B is a schematic diagram of one example of a circuit board for the IoT-enabled thermostat of FIG. 36A, according to an embodiment.

FIG. 36B is a schematic diagram of one example of a circuit board 371 for the IoT-enabled thermostat 370 of FIG. 36A. The circuit board 371 includes a front end system 372, which can be implemented in a radio frequency module that can incorporate one or more features described in the sections herein.

Figure 37A:
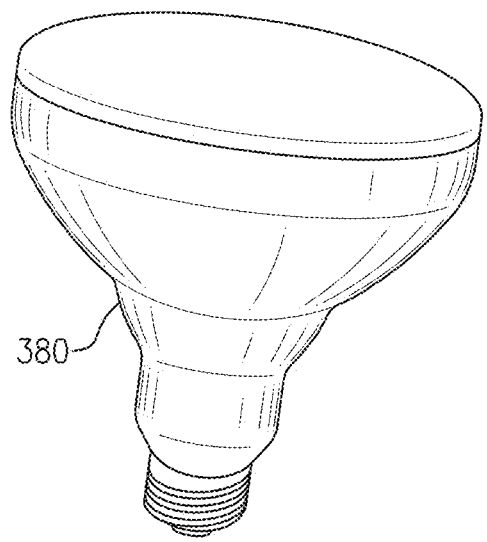
FIG. 37A is a schematic diagram of one example of IoT-enabled light, according to an embodiment.

FIG. 37A is a schematic diagram of one example of IoT-enabled light 380. The IoT-enabled light 380 illustrates another example of an IoT-enabled object that can include a radio frequency module implemented in accordance with one or more features disclosed herein.

Figure 37B:
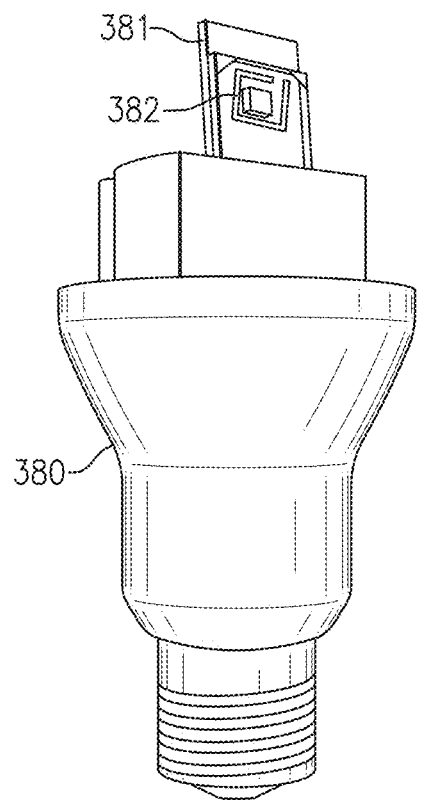
FIG. 37B is a schematic diagram of one example of a circuit board for the IoT-enabled light of FIG. 37A, according to an embodiment.

FIG. 37B is a schematic diagram of one example of a circuit board 381 for the IoT-enabled light 380 of FIG. 37A. FIG. 37B also depicts a base portion of the IoT-enabled light 380 for housing the circuit board 381. The circuit board 381 includes a front end system 382, which can be implemented in a radio frequency module that can incorporate one or more features described in the sections herein.

Additional Applications

Any of the embodiments described herein can be implemented in association with wireless communications devices, such as any suitable Internet of Things (IoT) device. The principles and advantages of the embodiments can be implemented in any suitable systems, packaged module, integrated circuit, or the like that could benefit from any feature of one or more embodiments described herein. The teachings herein are applicable to a variety of systems. Examples of such systems include, but are not limited to, mobile phones, tablets, base stations, network access points, customer-premises equipment (CPE), IoT-enabled objects, laptops, and wearable electronics. Thus, the embodiments herein can be included in various electronic devices, including, but not limited to, consumer electronic products. Although this disclosure includes some example embodiments, the teachings described herein can be applied to a variety of structures. Any of the principles and advantages discussed herein can be implemented in association with radio frequency circuits configured to process signals in a range from about 30 kHz to 300 GHz, such as in a range from about 450 MHz to 6 GHz, but not limited to implementation in association with radio frequency circuits.

Aspects of this disclosure can be implemented in various electronic devices. Examples of the electronic devices can include, but are not limited to, consumer electronic products, parts of the consumer electronic products such as integrated circuits and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Terminology

Unless the context requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged radio frequency module comprising:
a radio frequency shielding structure extending above a package substrate;
a first die supported by the package substrate and in an interior of the radio frequency shielding structure, the first die including a radio frequency component;
an antenna supported by the package substrate external to the radio frequency shielding structure;
an oscillator supported by the package substrate, the oscillator disposed between the first die and the package substrate; and
an oscillator assembly including a cavity, the oscillator residing within the cavity.

2. The packaged radio frequency module of claim 1 further comprising an overmold enclosing the first die, the oscillator, and the antenna.

3. The packaged radio frequency module of claim 1 wherein the radio frequency shielding structure includes a plurality of wire bonds.

4. The packaged radio frequency module of claim 1 wherein the first die includes at least a portion of a radio frequency front end.

5. A wireless communication device including the packaged radio frequency module of claim 1.

6. A packaged radio frequency module comprising:
a radio frequency shielding structure extending above a package substrate;
a first integrated circuit die supported by the package substrate and in an interior of the radio frequency shielding structure;
an antenna supported by the package substrate external to the radio frequency shielding structure; and
a second integrated circuit die supported by the package substrate, the package substrate disposed between the first integrated circuit die and the second integrated circuit die, the first integrated circuit die implementing at least a portion of a radio frequency front end including a radio frequency power amplifier and the second integrated circuit die implementing at least a portion of a radio frequency baseband subsystem.

7. The packaged radio frequency module of claim 6 wherein the antenna is on a same side of the package substrate as the radio frequency shielding structure and the first integrated circuit die.

8. The packaged radio frequency module of claim 7 further comprising an oscillator disposed between the package substrate and the second integrated circuit die.

9. The packaged radio frequency module of claim 6 wherein the radio frequency shielding structure includes a plurality of wire bonds.

10. The packaged radio frequency module of claim 6 further comprising an overmold enclosing the first integrated circuit die and the antenna.

11. A wireless communication device including the packaged radio frequency module of claim 6.

12. A packaged radio frequency module for use in a wireless communication device, the packaged radio frequency module comprising:
a radio frequency shielding structure extending above a package substrate;
a first wireless device component supported by the package substrate and in an interior of the radio frequency shielding structure;
an antenna supported by the package substrate external to the radio frequency shielding structure; and
a second wireless device component supported by and spaced from the package substrate, at least a portion of the first wireless device component between an overhanging portion of the second wireless device component and the package substrate.

13. The packaged radio frequency module of claim 12 further comprising an overmold enclosing the first wireless device component, the antenna, and the second wireless device component.

14. The packaged radio frequency module of claim 12 wherein the radio frequency shielding structure includes a plurality of wire bonds.

15. A wireless communication device including the packaged radio frequency module of claim 12.

16. A packaged radio frequency module comprising:
a radio frequency shielding structure extending above a package substrate;
a first die supported by the package substrate and in an interior of the radio frequency shielding structure, the first die including a radio frequency component;
an antenna supported by the package substrate external to the radio frequency shielding structure; and
an oscillator supported by the package substrate, the first die disposed between the oscillator and the package substrate.

17. The packaged radio frequency module of claim 16, wherein the radio frequency shielding structure includes a plurality of wire bonds.

18. The packaged radio frequency module of claim 16 further comprising an overmold enclosing the first die, the oscillator, and the antenna.

19. A wireless communication device including the packaged radio frequency module of claim 16.

* * * * *